(12) United States Patent
Matsukura

(10) Patent No.: US 9,917,115 B2
(45) Date of Patent: *Mar. 13, 2018

(54) SEMICONDUCTOR DEVICE HAVING AN EFFECTIVE USE OF THE CONDUCTIVE LAYER FORMED IN THE SAME PROCESS AS ONE ELECTRODE

(71) Applicant: Semiconductor Energy Laboratory Co., Ltd., Atsugi-shi, Kanagawa-ken (JP)

(72) Inventor: Hideki Matsukura, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,509

(22) Filed: Sep. 1, 2016

(65) Prior Publication Data

US 2016/0372496 A1     Dec. 22, 2016

Related U.S. Application Data

(60) Continuation of application No. 14/656,301, filed on Mar. 12, 2015, now Pat. No. 9,461,178, which is a
(Continued)

(30) Foreign Application Priority Data

Aug. 2, 2012   (JP) ................................ 2012-171818

(51) Int. Cl.
*H01L 29/786*     (2006.01)
*H01L 27/12*     (2006.01)
(Continued)

(52) U.S. Cl.
CPC ........ *H01L 27/1251* (2013.01); *H01L 23/564* (2013.01); *H01L 27/124* (2013.01);
(Continued)

(58) Field of Classification Search
CPC ........... H01L 29/0847; H01L 29/41733; H01L 29/42384; H01L 29/4908; H01L 29/7831;
(Continued)

(56) References Cited

U.S. PATENT DOCUMENTS 5,644,147 A     7/1997   Yamazaki et al.
5,731,856 A     3/1998   Kim et al.
(Continued)

FOREIGN PATENT DOCUMENTS

EP     1737044 A     12/2006
EP     2226847 A     9/2010
(Continued)

OTHER PUBLICATIONS

Coates.D et al., "Optical Studies of the Amorphous Liquid-Cholesteric Liquid Crystal Transition:the"Blue Phase"", Physics Letters, Sep. 10, 1973, vol. 45A, No. 2, pp. 115-116.
(Continued)

*Primary Examiner* — Hoai V Pham
(74) *Attorney, Agent, or Firm* — Robinson Intellectual Property Law Office; Eric J. Robinson

(57) ABSTRACT

A semiconductor device includes a first conductive layer, a first insulating layer over the first conductive layer, first and second oxide semiconductor layers over the first insulating layer, a second conductive layer over the first oxide semiconductor layer, a third conductive layer over the second oxide semiconductor layer, a fourth conductive layer over the first oxide semiconductor layer and the second oxide semiconductor layer, a second insulating layer over the second conductive layer, the third conductive layer, and the fourth conductive layer, a fifth conductive layer electrically connected to the first conductive layer over the second insulating layer, and a sixth conductive layer over the second insulating layer. Each of the first and fifth conductive layers
(Continued)

includes an area overlapping with the first oxide semiconductor layer. The sixth conductive layer includes an area overlapping with the second oxide semiconductor layer.

24 Claims, 46 Drawing Sheets

Related U.S. Application Data division of application No. 13/953,381, filed on Jul. 29, 2013, now Pat. No. 8,981,376.

(51) Int. Cl.
*H01L 23/00* (2006.01)
*G02F 1/1368* (2006.01)
*H01L 27/32* (2006.01)

(52) U.S. Cl.
CPC ...... *H01L 27/1225* (2013.01); *H01L 27/1244* (2013.01); *H01L 29/7869* (2013.01); *H01L 29/78648* (2013.01); *H01L 29/78651* (2013.01); *H01L 29/78693* (2013.01); *H01L 29/78696* (2013.01); *G02F 1/1368* (2013.01); *H01L 27/3262* (2013.01); *H01L 2924/0002* (2013.01)

(58) Field of Classification Search
CPC ............... H01L 29/786; H01L 27/1214; H01L 27/3274; H01L 2924/13069
See application file for complete search history.

(56) References Cited

U.S. PATENT DOCUMENTS

| | | |
|---|---|---|
| 5,744,864 A | 4/1998 | Cillessen et al. |
| 6,016,174 A | 1/2000 | Endo et al. |
| 6,124,604 A | 9/2000 | Koyama et al. |
| 6,294,274 B1 | 9/2001 | Kawazoe et al. |
| 6,563,174 B2 | 5/2003 | Kawasaki et al. |
| 6,639,246 B2 | 10/2003 | Honda |
| 6,727,522 B1 | 4/2004 | Kawasaki et al. |
| 6,740,938 B2 | 5/2004 | Tsunoda et al. |
| 6,825,488 B2 | 11/2004 | Yamazaki et al. |
| 6,906,344 B2 | 6/2005 | Yamazaki et al. |
| 6,952,023 B2 | 10/2005 | Yamazaki et al. |
| 6,975,142 B2 | 12/2005 | Azami et al. |
| 7,049,190 B2 | 5/2006 | Takeda et al. |
| 7,061,014 B2 | 6/2006 | Hosono et al. |
| 7,061,565 B2 | 6/2006 | Kwon et al. |
| 7,064,346 B2 | 6/2006 | Kawasaki et al. |
| 7,105,868 B2 | 9/2006 | Nause et al. |
| 7,129,102 B2 | 10/2006 | Yamazaki |
| 7,189,997 B2 | 3/2007 | Tsunoda et al. |
| 7,211,825 B2 | 5/2007 | Shih et al. |
| 7,230,601 B2 | 6/2007 | Yamazaki et al. |
| 7,282,782 B2 | 10/2007 | Hoffman et al. |
| 7,297,977 B2 | 11/2007 | Hoffman et al. |
| 7,307,317 B2 | 12/2007 | Koyama |
| 7,317,205 B2 | 1/2008 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,487,373 B2 | 2/2009 | Koyama |
| 7,501,293 B2 | 3/2009 | Ito et al. |
| 7,652,740 B2 | 1/2010 | Hwang et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,851,279 B2 | 12/2010 | Takano et al. |
| 8,003,449 B2 | 8/2011 | Akimoto et al. |
| 8,008,735 B2 | 8/2011 | Yamaguchi et al. |
| 8,012,812 B2 | 9/2011 | Okazaki |
| 8,017,456 B2 | 9/2011 | Yamazaki et al. |
| 8,067,775 B2 | 11/2011 | Miyairi et al. |
| 8,106,400 B2 | 1/2012 | Miyairi et al. |
| 8,115,206 B2 | 2/2012 | Sakakura et al. |
| 8,164,933 B2 | 4/2012 | Fujita et al. |
| 8,168,975 B2 | 5/2012 | Koyama et al. |
| 8,188,477 B2 | 5/2012 | Miyairi et al. |
| 8,284,142 B2 | 10/2012 | Yamazaki et al. |
| 8,294,147 B2 | 10/2012 | Yamazaki et al. |
| 8,304,300 B2 | 11/2012 | Sakata et al. |
| 8,358,530 B2 | 1/2013 | Kamata |
| 8,383,434 B2 | 2/2013 | Isa |
| 8,395,156 B2 | 3/2013 | Miyairi et al. |
| 8,410,486 B2 | 4/2013 | Tezuka et al. |
| 8,421,081 B2 | 4/2013 | Kato et al. |
| 8,450,144 B2 | 5/2013 | Sakata et al. |
| 8,735,884 B2 | 5/2014 | Sakata et al. |
| 8,988,625 B2 | 3/2015 | Yamazaki et al. |
| 9,029,851 B2 | 5/2015 | Miyairi et al. |
| 9,130,046 B2 | 9/2015 | Sakata et al. |
| 9,318,512 B2 | 4/2016 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |

(56) References Cited

U.S. PATENT DOCUMENTS

| | | |
|---|---|---|
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0032679 A1 | 2/2010 | Kawae et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0117079 A1 | 5/2010 | Miyairi et al. |
| 2011/0003418 A1 | 1/2011 | Sakata et al. |
| 2011/0032444 A1* | 2/2011 | Yamazaki ........... H01L 27/1225 349/42 |
| 2011/0062432 A1 | 3/2011 | Yamazaki et al. |
| 2011/0084263 A1 | 4/2011 | Yamazaki et al. |
| 2011/0109351 A1 | 5/2011 | Yamazaki et al. |
| 2011/0133177 A1 | 6/2011 | Suzawa et al. |
| 2011/0140205 A1 | 6/2011 | Sakata et al. |
| 2011/0147754 A1 | 6/2011 | Isa et al. |
| 2011/0156025 A1 | 6/2011 | Shionoiri et al. |
| 2011/0199351 A1 | 8/2011 | Kurokawa |
| 2011/0204365 A1 | 8/2011 | Saito |
| 2011/0210355 A1 | 9/2011 | Yamazaki et al. |
| 2011/0248261 A1 | 10/2011 | Yamazaki |
| 2011/0318888 A1 | 12/2011 | Komatsu et al. |
| 2012/0049283 A1 | 3/2012 | Miyairi et al. |
| 2012/0052637 A1 | 3/2012 | Komatsu et al. |
| 2012/0061662 A1 | 3/2012 | Yamazaki et al. |
| 2012/0104385 A1 | 5/2012 | Godo et al. |
| 2012/0112191 A1 | 5/2012 | Kato et al. |
| 2012/0262995 A1 | 10/2012 | Sakata |
| 2012/0280238 A1 | 11/2012 | Kimura |
| 2012/0292615 A1 | 11/2012 | Saito |
| 2012/0299074 A1 | 11/2012 | Hirose et al. |
| 2012/0314482 A1 | 12/2012 | Takemura |
| 2013/0049806 A1 | 2/2013 | Koyama |
| 2013/0062607 A1 | 3/2013 | Yamazaki et al. |
| 2013/0069068 A1 | 3/2013 | Miyake |
| 2013/0077735 A1 | 3/2013 | Hirose |
| 2013/0140569 A1 | 6/2013 | Yoneda et al. |
| 2013/0161713 A1 | 6/2013 | Yamazaki et al. |
| 2013/0240873 A1 | 9/2013 | Yamazaki et al. |
| 2013/0270562 A1 | 10/2013 | Yamazaki |
| 2015/0325600 A1 | 11/2015 | Sakata et al. |
| 2016/0197166 A1 | 7/2016 | Miyairi et al. |
| 2016/0225797 A1 | 8/2016 | Sakata et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-092448 A | 4/1995 |
| JP | 08-264794 A | 10/1996 |
| JP | 10-268353 A | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-328643 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-228805 A | 8/2005 |
| JP | 2010-123938 A | 6/2010 |
| JP | 2011-009734 A | 1/2011 |
| JP | 2011-029635 A | 2/2011 |
| JP | 2011-086927 A | 4/2011 |
| JP | 2011-142311 A | 7/2011 |
| WO | WO-2004/114391 | 12/2004 |
| WO | WO-2010/047217 | 4/2010 |
| WO | WO-2011/033911 | 3/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YvFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGAO3(ZnO)3, and GA2O3(ZnO)m (m=7, 8, 9, and 16) in the In2O3—ZnGa2O4—ZnO System", Journal of Solid State Chemistry, Apr. 1, 1994, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emissio AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer ", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. {Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper; 4 Inch QVGA AMOLED Driven by the Threshold Voltage Controlled Amorphous GIZO (Ga2O3—In2O3-ZnO) TFT", SID Digest '08 : SID International Symposium Digest of Technical Papers, May 20, 2008, vol. 39, pp. 629-632.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Parkj et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

SEMICONDUCTOR DEVICE HAVING AN EFFECTIVE USE OF THE CONDUCTIVE LAYER FORMED IN THE SAME PROCESS AS ONE ELECTRODE

BACKGROUND OF THE INVENTION

1. Field of the Invention

The technical field relates to a semiconductor device.

2. Description of the Related Art

Patent Document 1 discloses a semiconductor device including a transistor.

Paragraph 0012 in Patent Document 1 discloses the following: "it is said that a substance containing a hydrogen element is an element which prevents an oxide semiconductor layer from being highly purified so that the oxide semiconductor layer is not close to an i-type oxide semiconductor layer because a hydrogen element has two factors of inducing carriers".

Paragraph 0013 in Patent Document 1 discloses the following: "as a substance containing a hydrogen element, for example, hydrogen, moisture, hydroxide, hydride, and the like can be given".

Patent Document 1 also discloses that, when a substance containing a hydrogen element is contained in an oxide semiconductor layer of a transistor, the threshold voltage of the transistor shifts in a negative direction.

REFERENCE

Patent Document

[Patent Document 1] Japanese Published Patent Application No. 2011-142311

SUMMARY OF THE INVENTION

A first object of one embodiment of the present invention is to make an effective use of a conductive layer formed in the same process as one electrode of an element.

A second object of one embodiment of the present invention is to prevent entry of a substance including a hydrogen element into an oxide semiconductor layer.

A third object of one embodiment of the present invention is to increase the on-current of a transistor in a circuit.

A fourth object of one embodiment of the present invention is to provide a semiconductor device with a novel structure.

The invention disclosed below only needs to achieve at least one of the first to fourth objects.

Examples of the invention allowing at least one of the first to fourth objects to be achieved will be described below.

For example, a semiconductor device includes a first conductive layer over an insulating surface, a first insulating layer over the first conductive layer, a first oxide semiconductor layer over the first insulating layer, a second oxide semiconductor layer over the first insulating layer, a second conductive layer over the first oxide semiconductor layer, a third conductive layer over the second oxide semiconductor layer, a fourth conductive layer over the first oxide semiconductor layer and the second oxide semiconductor layer, a second insulating layer over the second conductive layer, the third conductive layer, and the fourth conductive layer, a fifth conductive layer over the second insulating layer, and a sixth conductive layer over the second insulating layer. The first conductive layer includes an area overlapping with the first oxide semiconductor layer. The fifth conductive layer includes an area overlapping with the first oxide semiconductor layer. The sixth conductive layer includes an area overlapping with the second oxide semiconductor layer. The fifth conductive layer is electrically connected to the first conductive layer.

For example, a semiconductor device includes a first conductive layer over an insulating surface, a first insulating layer over the first conductive layer, an oxide semiconductor layer over the first insulating layer, a second conductive layer over the oxide semiconductor layer, a third conductive layer over the oxide semiconductor layer, a fourth conductive layer over the oxide semiconductor layer, a second insulating layer over the second conductive layer, the third conductive layer, and the fourth conductive layer, a fifth conductive layer over the second insulating layer, and a sixth conductive layer over the second insulating layer. The fourth conductive layer is between the second conductive layer and the third conductive layer. The oxide semiconductor layer includes a first area overlapping with the second conductive layer. The oxide semiconductor layer includes a second area overlapping with the third conductive layer. The oxide semiconductor layer includes a third area overlapping with the fourth conductive layer. The oxide semiconductor layer includes a fourth area between the first area and the third area. The oxide semiconductor layer includes a fifth area between the second area and the third area. The first conductive layer includes an area overlapping with the fourth area. The fifth conductive layer includes an area overlapping with the fourth area. The sixth conductive layer includes an area overlapping with the fifth area. The fifth conductive layer is electrically connected to the first conductive layer.

The sixth conductive layer is in a floating state, for example.

It is possible to make an effective use of the conductive layer formed in the same process as one electrode of an element.

It is possible to prevent entry of a substance including a hydrogen element into an oxide semiconductor layer.

It is possible to increase the on-current of a transistor in a circuit.

It is possible to provide a semiconductor device with a novel structure.

DETAILED DESCRIPTION OF THE INVENTION

Figure 1A:
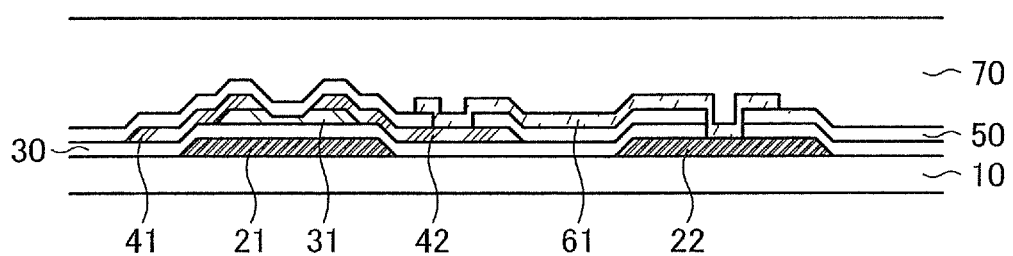
FIGS. 1A and 1B each illustrate an example of a semiconductor device.

Embodiments of the invention will be described in detail with reference to the drawings.

Note that it is easily understood by those skilled in the art that modes and details of the invention can be modified in various ways without departing from the spirit and scope of the invention.

Accordingly, the invention should not be construed as being limited to the description of the embodiments below.

In the structures to be described below, the same portions or portions having similar functions are denoted by the same reference numerals or the same hatching patterns in different drawings, and explanation thereof will not be repeated.

Part or the whole of the following embodiments can be combined as appropriate.

(Embodiment 1)

Description will be made on an example of a semiconductor device having a structure which enables an effective use of a conductive layer formed in the same process as one electrode of an element.

Figure 1B:
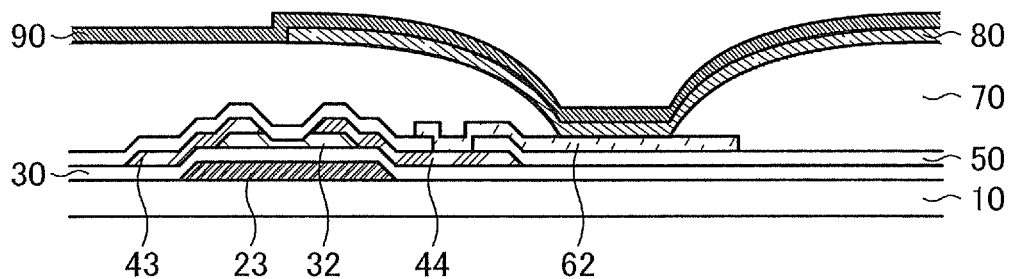

A substrate 10 includes an insulating surface (FIGS. 1A and 1B).

A conductive layer 21 is over the insulating surface (FIG. 1A).

A conductive layer 22 is over the insulating surface (FIG. 1A).

A conductive layer 23 is over the insulating surface (FIG. 1B).

At least part of the conductive layer 21 serves as, for example, a gate electrode of a transistor.

At least part of the conductive layer 22 serve as, for example, a wiring or an electrode.

At least part of the conductive layer 22 may also serve as a gate electrode of a transistor.

At least part of the conductive layer 23 serves as, for example, a gate electrode of a transistor.

The conductive layers 21, 22, and 23 can be formed in the same process.

Therefore, the conductive layers 21, 22, and 23 can be made of the same material.

An insulating layer 30 is over the conductive layers 21, 22, and 23 (FIGS. 1A and 1B).

At least part of the insulating layer 30 serves as, for example, a gate insulating film of the transistors.

A semiconductor layer 31 is over the insulating layer 30 (FIG. 1A).

A semiconductor layer 32 is over the insulating layer 30 (FIG. 1B).

The semiconductor layer 31 includes an area overlapping with the conductive layer 21.

The semiconductor layer 32 includes an area overlapping with the conductive layer 23.

At least part of the semiconductor layer 31 serves as, for example, a channel formation region of the transistor.

At least part of the semiconductor layer 32 serves as, for example, a channel formation region of the transistor.

A channel is formed in the channel formation region.

A conductive layer 41 is over the semiconductor layer 31 (FIG. 1A).

A conductive layer 42 is over the semiconductor layer 31 (FIG. 1A).

A conductive layer 43 is over the semiconductor layer 32 (FIG. 1B).

A conductive layer 44 is over the semiconductor layer 32 (FIG. 1B).

At least part of the conductive layer 41 serves as, for example, one of a source electrode and a drain electrode of the transistor.

At least part of the conductive layer 42 serves as, for example, the other of the source electrode and the drain electrode of the transistor.

At least part of the conductive layer 43 serves as, for example, one of a source electrode and a drain electrode of the transistor.

At least part of the conductive layer 44 serves as, for example, the other of the source electrode and the drain electrode of the transistor.

The conductive layers 41, 42, 43, and 44 can be formed in the same process.

Therefore, the conductive layers 41, 42, 43, and 44 can be made of the same material.

An insulating layer 50 is over the conductive layers 41, 42, 43, and 44 (FIGS. 1A and 1B).

At least part of the insulating layer 50 serves as, for example, an interlayer insulating film.

In the case where the insulating layer 50 includes an inorganic substance, at least part of the insulating layer 50 serves as, for example, a protective film.

A conductive layer 61 is over the insulating layer 50 (FIG. 1A).

A conductive layer 62 is over the insulating layer 50 (FIG. 1B).

The conductive layer 61 is electrically connected to the conductive layer 22.

The conductive layer 61 is electrically connected to the conductive layer 42.

The conductive layer 62 is electrically connected to the conductive layer 44.

At least part of the conductive layer 61 serves as, for example, a wiring or an electrode.

At least part of the conductive layer 62 serves as, for example, one electrode of an element.

The one electrode of the element can be referred to as a bottom electrode.

The other electrode of the element can be referred to as a top electrode.

In the case where the element is a display device, the one electrode of the element can be referred to as a pixel electrode.

In the case where the element is a display device, the other electrode of the element can be referred to as a counter electrode.

The conductive layers 61 and 62 can be formed in the same process.

Therefore, the conductive layers 61 and 62 can be made of the same material.

An insulating layer 70 is over the conductive layers 61 and 62 (FIGS. 1A and 1B).

In the case of an EL display device, at least part of the insulating layer 70 serves as, for example, a bank. The bank is located between adjacent pixel electrodes.

The bank preferably includes an organic substance.

The bank including the organic substance can be used as a planarization film.

In the case of the EL display device, the insulating layer 70 includes an area overlapping with an end of the conductive layer 62.

In the case of the EL display device, the insulating layer 70 includes an opening in an area overlapping with the conductive layer 62.

In the case where a liquid crystal display device is manufactured, at least part of the insulating layer 70 can be used as, for example, an alignment film.

In the case where at least part of the insulating layer 70 serves as an alignment film, it is preferable that the whole of the conductive layer 62 overlap with at least part of the insulating layer 70.

The alignment film preferably includes an organic substance.

In the case of the EL display device, a function layer 80 is over the conductive layer 62 and the insulating layer 70 (FIG. 1B).

In the case of the EL display device, the function layer 80 is, for example, an EL layer (a layer containing an organic compound).

In the case where a liquid crystal display device is manufactured, the function layer 80 is preferably provided over the alignment film.

In the case of the liquid crystal display device, the function layer 80 is, for example, a liquid crystal layer.

A conductive layer 90 is over the function layer 80 (FIG. 1B).

The conductive layer 90 serves as, for example, the other electrode of the element.

The structure illustrated in FIGS. 1A and 1B includes a first opening passing through only the insulating layer 50, and a second opening passing through the insulating layer 50 and the insulating layer 30. The structure illustrated in FIGS. 1A and 1B does not include a third opening passing through only the insulating layer 30.

The first opening and the second opening can be formed in the same process.

The first opening and the third opening cannot be formed in the same process.

The second opening and the third opening cannot be formed in the same process.

Hence, the structure illustrated in FIGS. 1A and 1B enables a reduction in the number of manufacturing steps.

In the case where the third opening is not provided, the conductive layer 42 cannot be directly connected to the conductive layer 22.

Thus, in FIGS. 1A and 1B, the conductive layer 42 is electrically connected to the conductive layer 22 through the conductive layer 61.

The conductive layer 61 can be formed in the same process as the conductive layer 62 (the one electrode of the element).

It is therefore said that the structure illustrated in FIGS. 1A and 1B enables an effective use of the conductive layer formed in the same process as the one electrode of the element.

At least part of the structure shown in this embodiment can be combined with at least part of the structures shown in the other embodiments, as appropriate.

(Embodiment 2)

Description will be made on another example of a semiconductor device having a structure which enables an effective use of a conductive layer formed in the same process as one electrode of an element.

Figure 2A:
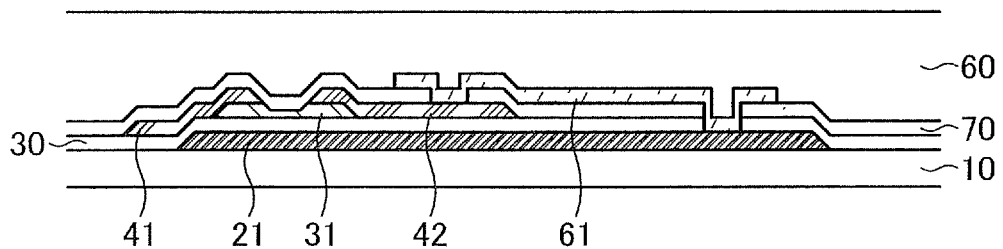
FIGS. 2A and 2B each illustrate an example of a semiconductor device.

FIG. 2A is an example of a drawing in which the conductive layer 22 is removed from the structure of FIG. 1A and the conductive layer 61 is electrically connected to the conductive layer 21.

In FIG. 2A, the other of the source and the drain of the transistor is electrically connected to the gate of the transistor.

Such a connection as illustrated in FIG. 2A is referred to as a diode connection.

The diode-connected transistor can be used as a diode.

Figure 2B:
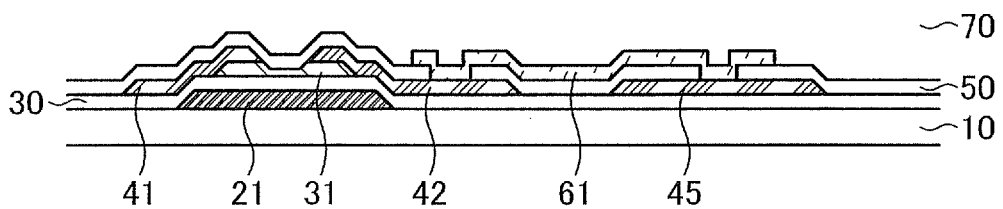

FIG. 2B is an example of a drawing in which the conductive layer 22 is removed from the structure of FIG. 1A and a conductive layer 45 is added.

The conductive layer 45 can be formed in the same process as the conductive layers 41 and 42.

Therefore, the conductive layer 45 can be made of the same material as the conductive layers 41 and 42.

The conductive layer 61 is electrically connected to the conductive layer 45.

It is said that the structures shown in this embodiment enable an effective use of the conductive layer formed in the same process as one electrode of the element.

At least part of the structure shown in this embodiment can be combined with at least part of the structures shown in the other embodiments, as appropriate.

(Embodiment 3)

Description will be made on an example of a semiconductor device having a structure capable of preventing the entry of a substance containing a hydrogen element into an oxide semiconductor layer.

In the case where an oxide semiconductor layer includes a substance containing a hydrogen element, the threshold voltage of a transistor shifts in the negative direction.

An inorganic substance has a function of blocking $H_2O$.

Thus, for example, the insulating layer 50 in FIGS. 1A and 1B preferably includes an inorganic substance.

The insulating layer 50 including the inorganic substance prevents the entry of a substance containing a hydrogen element into the oxide semiconductor layer.

Figure 3:
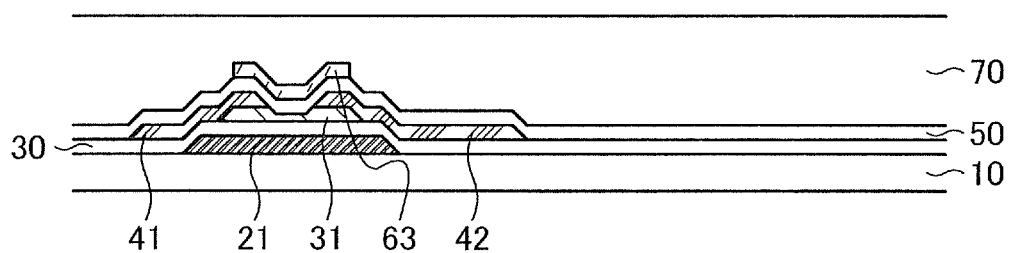
FIG. 3 illustrates an example of a semiconductor device.

Further, for example, a conductive layer 63 is preferably formed as illustrated in FIG. 3.

The conductive layer 63 has an area which overlaps with the channel formation region of the semiconductor layer 31.

The conductive layer 63 further prevents the entry of a substance containing a hydrogen element into the oxide semiconductor layer.

In the case where the conductive layer 63 includes an inorganic substance, the conductive layer 63 serves as, for example, a protective film.

The semiconductor layer 31 in FIG. 3 is preferably an oxide semiconductor layer.

The insulating layer 70 is not necessarily provided.

In the case where the insulating layer 70 includes an organic substance, the insulating layer 70 serves as, for example, a planarization film.

In the case where the insulating layer 70 includes an organic substance, a substance containing a hydrogen element ($H_2O$) is supplied by the insulating layer 70 in some cases. This is because more $H_2O$ is contained in the organic substance than in the inorganic substance.

Thus, in the case where the insulating layer 70 includes an organic substance, the conductive layer 63 is preferably provided between the insulating layer 50 and the insulating layer 70 as illustrated in FIG. 3.

The conductive layer 63 between the insulating layer 50 and the insulating layer 70 prevents the entry of a substance containing a hydrogen element into the oxide semiconductor layer.

The semiconductor layer 31 includes a first area overlapping with the conductive layer 41.

The semiconductor layer 31 includes a second area overlapping with the conductive layer 42.

The semiconductor layer 31 includes a third area.

The third area does not overlap with the conductive layers 41 and 42.

The conductive layer 63 at least overlaps with the third area.

Each of the conductive layers 41, 42, and 63 preferably includes an inorganic substance.

The conductive layer 41 has a function of blocking the entry of a substance containing hydrogen into the first area.

The conductive layer 42 has a function of blocking the entry of a substance containing hydrogen into the second area.

The conductive layer 63 has a function of blocking the entry of a substance containing hydrogen into the third area.

The conductive layer 63 preferably overlaps with the first area.

The conductive layer 63 preferably overlaps with the second area.

In the case where the conductive layer 63 is electrically connected to the conductive layer 21, at least part of the conductive layer 63 serves as, for example, a gate electrode.

In the case where the conductive layer 63 is electrically connected to the conductive layer 21, at least part of the insulating layer 50 serves as, for example, a gate insulating film.

In the case where the conductive layer 63 is electrically connected to the conductive layer 21, a transistor including the semiconductor layer 31 is a dual-gate transistor.

The dual-gate transistor has a structure in which a semiconductor layer is interposed between two gate electrodes.

A bottom-gate transistor has a structure in which a gate electrode is provided under a semiconductor layer.

A top-gate transistor has a structure in which a gate electrode is provided over a semiconductor layer.

Both the bottom-gate transistor and the top-gate transistor can be classified as a single-gate transistor.

The conductive layer 63 may be electrically isolated from the conductive layer 21.

For example, when the conductive layer 63 is brought into a floating state, the transistor including the semiconductor layer 31 serves as a bottom-gate transistor.

The floating state refers to, for example, a state where the conductive layer 63 is not in contact with the other conductive layers.

For example, when the potential of the conductive layer 63 is set to a predetermined value, it is possible to control the threshold voltage of the transistor including the semiconductor layer 31.

In the case where the transistor including the semiconductor layer 31 is an N-type transistor, the predetermined potential is preferably lower than a reference potential.

In the case where the transistor including the semiconductor layer 31 is a P-type transistor, the predetermined potential is preferably higher than the reference potential.

When the potential of the conductive layer 63 is set to the predetermined value, a normally-off transistor can be easily obtained.

Each circuit has a reference potential.

A potential higher than the reference potential is referred to as a high potential.

A potential lower than the reference potential is referred to as a low potential.

Although the reference potential is not necessarily 0 V, if the reference potential is 0 V, the high potential is a positive potential while the low potential is a negative potential.

The conductive layer 63 is preferably formed in the same process as one electrode of the element.

In the case where the conductive layer 63 is formed in the same process as the one electrode of the element, it is said that the structures illustrated in FIG. 3 enable an effective use of the conductive layer formed in the same process as the one electrode of the element.

At least part of the structure shown in this embodiment can be combined with at least part of the structures shown in the other embodiments, as appropriate.

(Embodiment 4)

Description will be made on another example of a semiconductor device having a structure capable of preventing the entry of a substance containing a hydrogen element into an oxide semiconductor layer.

Figure 4A:
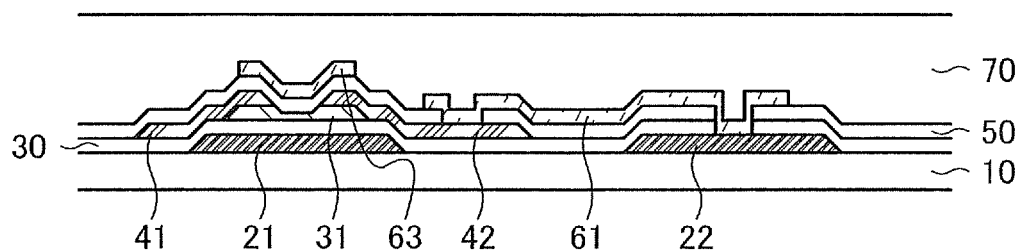
FIGS. 4A and 4B each illustrate an example of a semiconductor device.

FIG. 4A illustrates an example in which the conductive layer 63 is added to the structure of FIG. 1A.

Figure 4B:
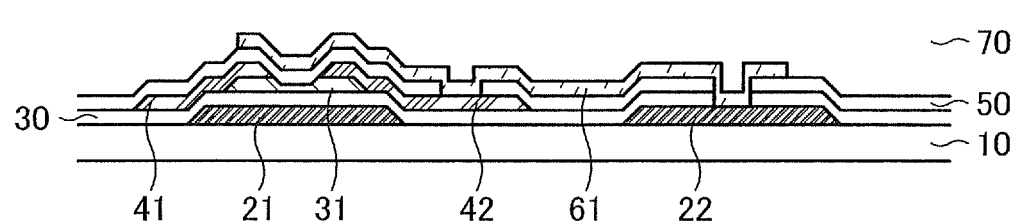

FIG. 4B illustrates an example in which the conductive layer 61 and the semiconductor layer 31 in FIG. 1A overlap with each other at least partly.

Figure 5A:
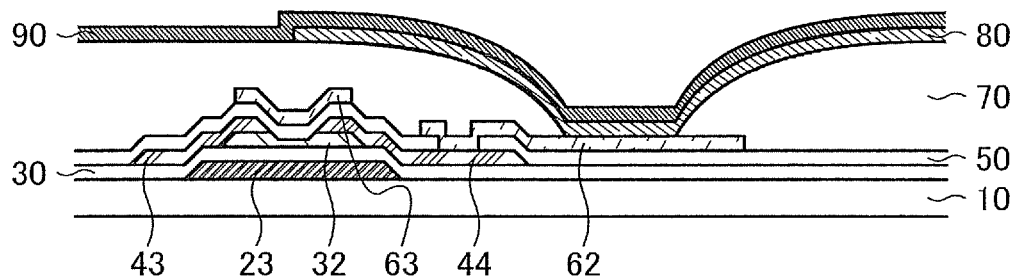
FIGS. 5A and 5B each illustrate an example of a semiconductor device.

FIG. 5A illustrates an example in which the conductive layer 63 is added to the structure of FIG. 1B.

Figure 5B:
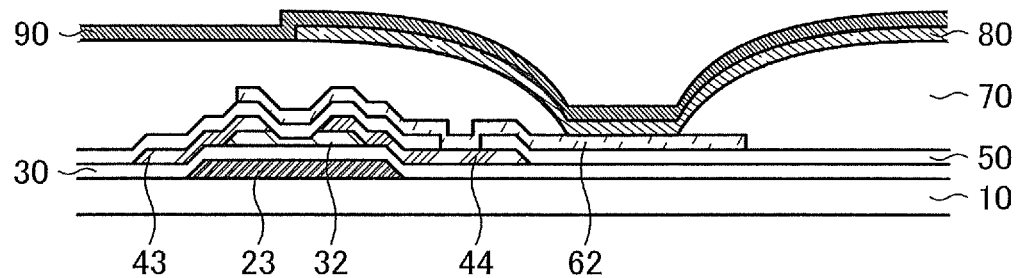

FIG. 5B illustrates an example in which the conductive layer 62 and the semiconductor layer 32 in FIG. 1B overlap with each other at least partly.

Figure 6A:
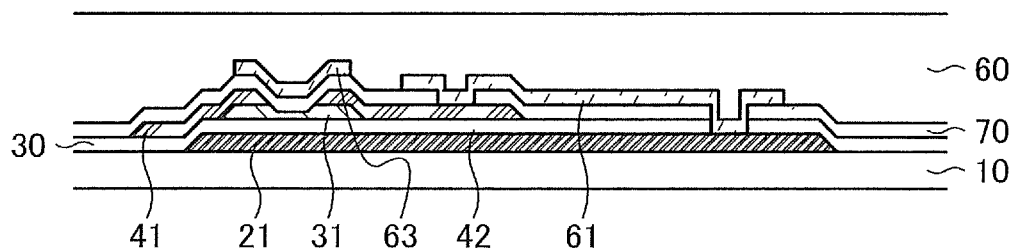
FIGS. 6A and 6B each illustrate an example of a semiconductor device.

FIG. 6A illustrates an example in which the conductive layer 63 is added to the structure of FIG. 2A.

Figure 6B:
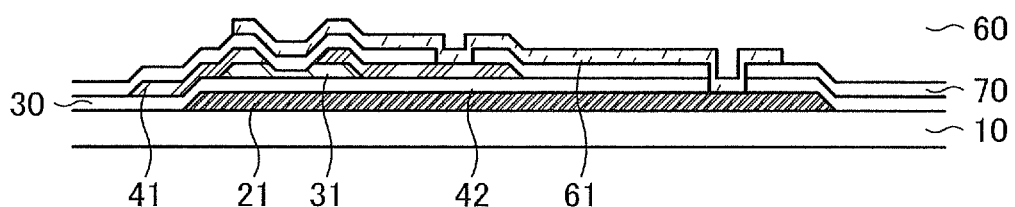

FIG. 6B illustrates an example in which the conductive layer 61 and the semiconductor layer 31 in FIG. 2A overlap with each other at least partly.

Figure 7A:
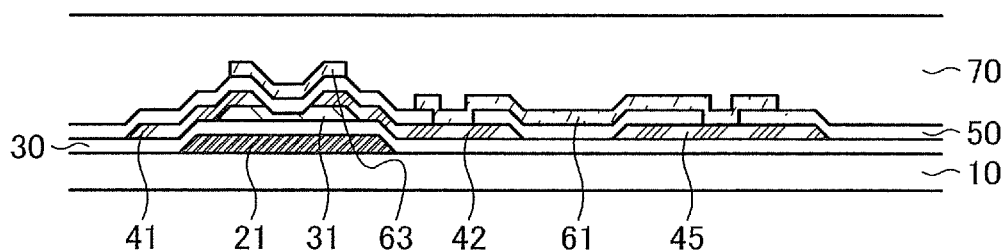
FIGS. 7A and 7B each illustrate an example of a semiconductor device.

FIG. 7A illustrates an example in which the conductive layer 63 is added to the structure of FIG. 2B.

Figure 7B:
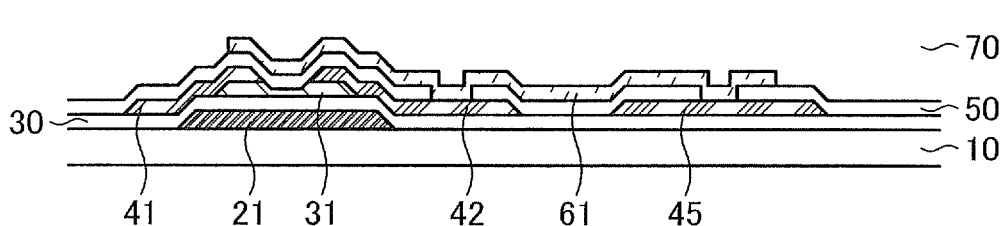

FIG. 7B illustrates an example in which the conductive layer 61 and the semiconductor layer 31 in FIG. 2B overlap with each other at least partly.

At least part of the structure shown in this embodiment can be combined with at least part of the structures shown in the other embodiments, as appropriate.

(Embodiment 5)

Figure 8:
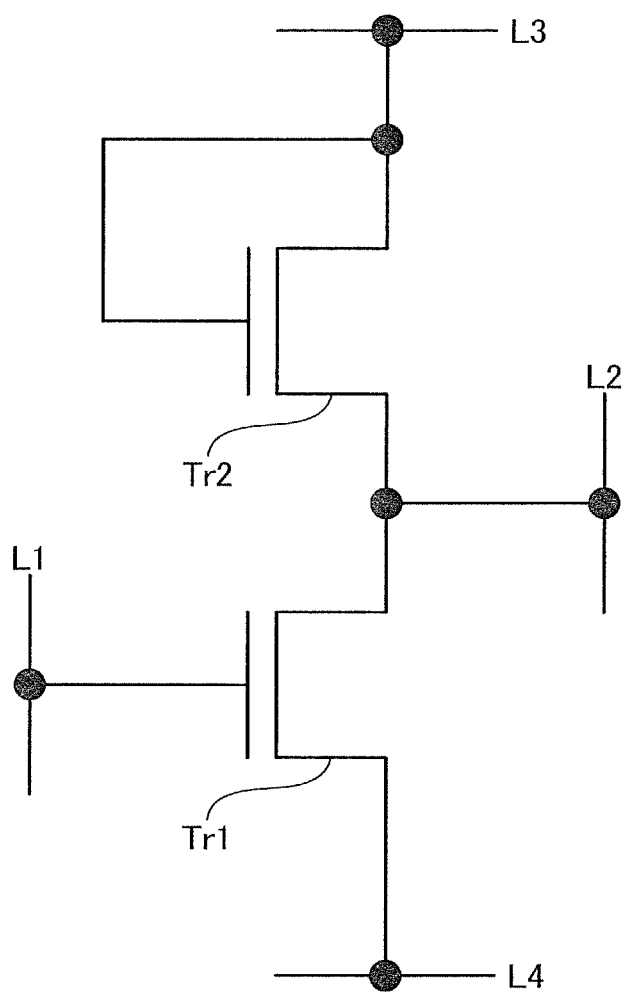
FIG. 8 illustrates an example of a semiconductor device.

FIG. 8 illustrates an example of a circuit.

A wiring L1 is electrically connected to a gate of a transistor Tr1.

A wiring L2 is electrically connected to one of a source and a drain of the transistor Tr1.

The wiring L2 is electrically connected to one of a source and a drain of a transistor Tr2.

A wiring L3 is electrically connected to the other of the source and the drain of the transistor Tr2.

The wiring L3 is electrically connected to a gate of the transistor Tr2.

A wiring L4 is electrically connected to the other of the source and the drain of the transistor Tr1.

At least part of the wiring L1 serves as an input terminal of an inverter circuit or a buffer circuit.

At least part of the wiring L1 has a function of transmitting a signal, a voltage, or a current.

At least part of the wiring L2 serves as an output terminal of an inverter circuit or a buffer circuit.

At least part of the wiring L2 has a function of transmitting a signal, a voltage, or a current.

At least part of the wiring L3 has a function of supplying a first potential.

At least part of the wiring L3 has a function of transmitting a signal, a voltage, or a current.

At least part of the wiring L4 has a function of supplying a second potential.

At least part of the wiring L4 has a function of transmitting a signal, a voltage, or a current.

The first potential is preferably different from the second potential.

The transistor Tr1 and the transistor Tr2 preferably have the same conductivity.

In the case where the transistors Tr1 and Tr2 are N-type transistors and the first potential is higher than the second potential, the circuit of FIG. 8 serves as an inverter circuit.

In the case where the transistors Tr1 and Tr2 are N-type transistors and the first potential is lower than the second potential, the circuit of FIG. 8 serves as a buffer circuit.

In the case where the transistors Tr1 and Tr2 are P-type transistors and the first potential is higher than the second potential, the circuit of FIG. 8 serves as a buffer circuit.

In the case where the transistors Tr1 and Tr2 are P-type transistors and the first potential is lower than the second potential, the circuit of FIG. 8 serves as an inverter circuit.

In the case where the circuit of FIG. 8 serves as an inverter circuit, the wiring L2 has a low potential when the wiring L1 has a high potential.

In the case where the circuit of FIG. 8 serves as an inverter circuit, the wiring L2 has a high potential when the wiring L1 has a low potential.

In the case where the circuit of FIG. 8 serves as a buffer circuit, the wiring L2 has a high potential when the wiring L1 has a high potential.

In the case where the circuit of FIG. 8 serves as a buffer circuit, the wiring L2 has a low potential when the wiring L1 has a low potential.

In the case where the first potential is lower than the second potential, it is preferable that the first potential be a low potential and the second potential be a high potential.

In the case where the first potential is higher than the second potential, it is preferable that the first potential be a high potential and the second potential be a low potential.

For stable circuit operation, both of the transistors Tr1 and Tr2 are preferably normally-off transistors.

Note that in the case where the transistors Tr1 and Tr2 are P-type transistors, it is preferable that the transistor Tr1 be a normally-off transistor and the transistor Tr2 be a normally-on transistor for stable circuit operation.

When the transistor Tr1 or Tr2 has a dual-gate structure, the on-current of the transistors in the circuit can be increased.

Also for stable circuit operation, the on-current of the transistor Tr1 is preferably higher than that of the transistor Tr2.

Hence, it is preferable that the transistor Tr1 be a dual-gate transistor and the transistor Tr2 be a single-gate transistor.

For stable circuit operation, the transistor Tr1 preferably has low off-current.

A transistor including an oxide semiconductor layer has lower off-current than a transistor including a silicon layer.

Therefore, the transistor Tr1 preferably includes an oxide semiconductor layer.

On the other hand, for example, in order to make the transistor Tr2 a normally-off transistor, the threshold voltage of the transistor Tr2 needs to be controlled.

The threshold voltage of a transistor including a silicon layer is easier to control than that of a transistor including an oxide semiconductor layer.

Specifically, the threshold voltage can be controlled by adding a donor element or an acceptor element to a silicon layer.

The threshold voltage can be controlled precisely by employing an ion doping method or an ion implantation method for the addition of a donor element or an acceptor element.

Hence, the transistor Tr2 preferably includes a silicon layer.

It is thus preferable that the transistor Tr1 include an oxide semiconductor layer and the transistor Tr2 include a silicon layer.

In order to reduce the number of manufacturing steps, the transistors Tr1 and Tr2 may be formed using the same semiconductor material.

At least part of the structure shown in this embodiment can be combined with at least part of the structures shown in the other embodiments, as appropriate.

(Embodiment 6)

Figure 9:
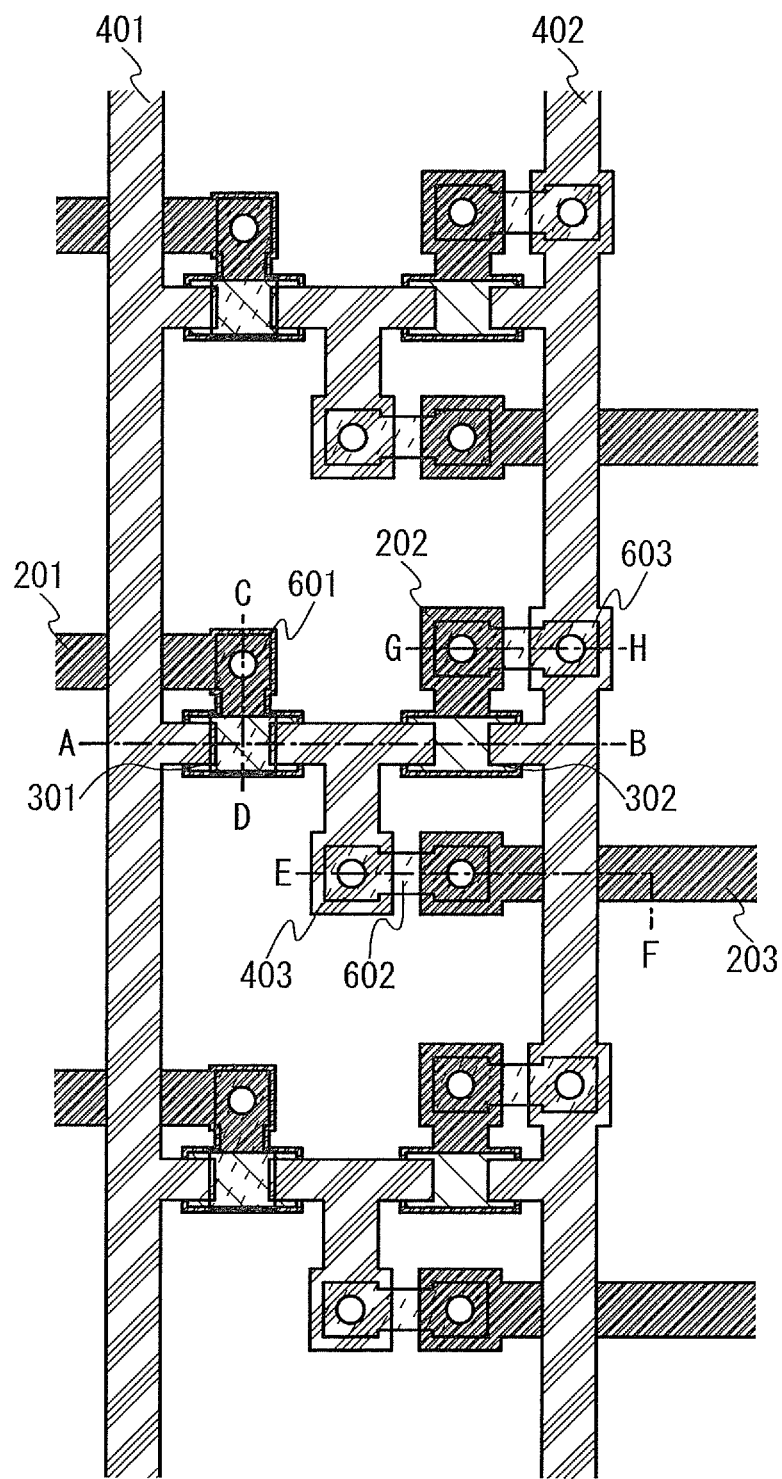
FIG. 9 illustrates an example of a semiconductor device.

FIG. 9 illustrates an example of a top view of a semiconductor device including the circuit illustrated in FIG. 8.

Figure 10A:
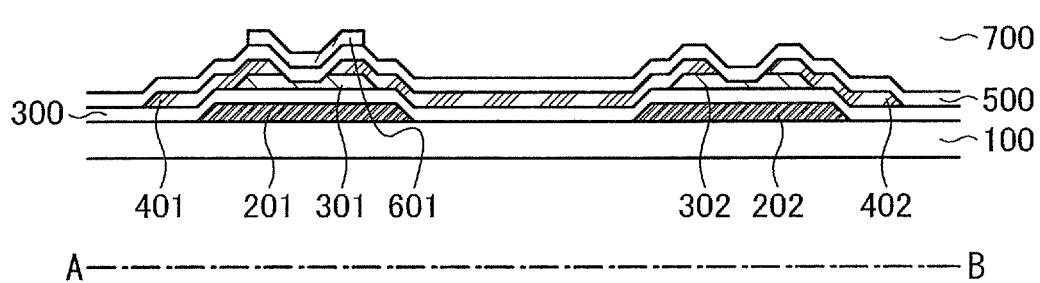
FIGS. 10A and 10B illustrate the example of the semiconductor device.

FIG. 10A is an example of a cross-sectional view of FIG. 9 along line A-B.

Figure 10B:
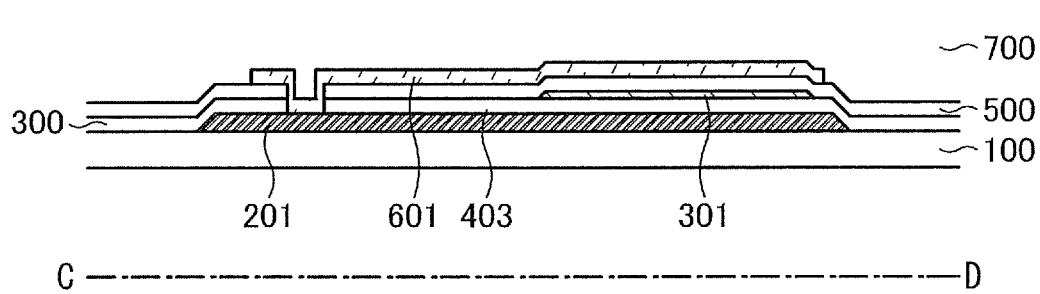

FIG. 10B is an example of a cross-sectional view of FIG. 9 along line C-D.

Figure 11A:
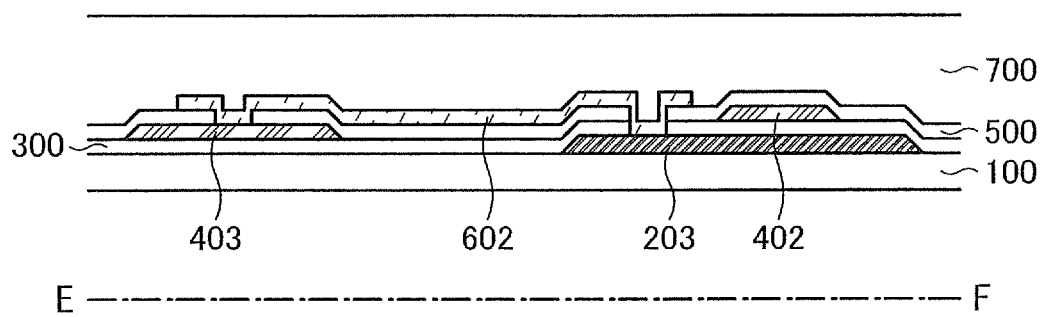
FIGS. 11A and 11B illustrate the example of the semiconductor device.

FIG. 11A is an example of a cross-sectional view of FIG. 9 along line E-F.

Figure 11B:
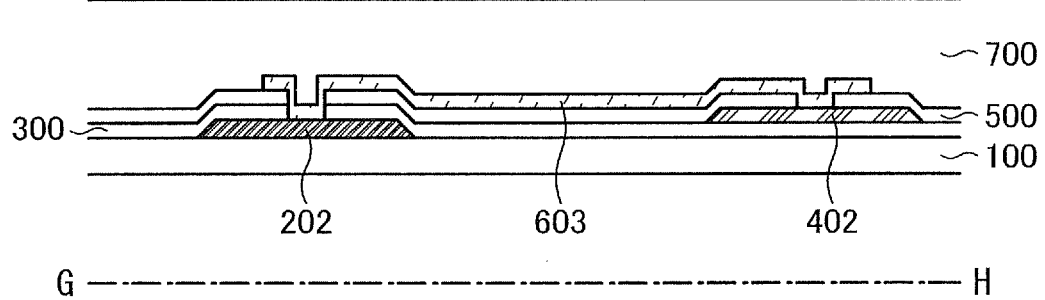

FIG. 11B is an example of a cross-sectional view of FIG. 9 along line G-H.

Figure 12:
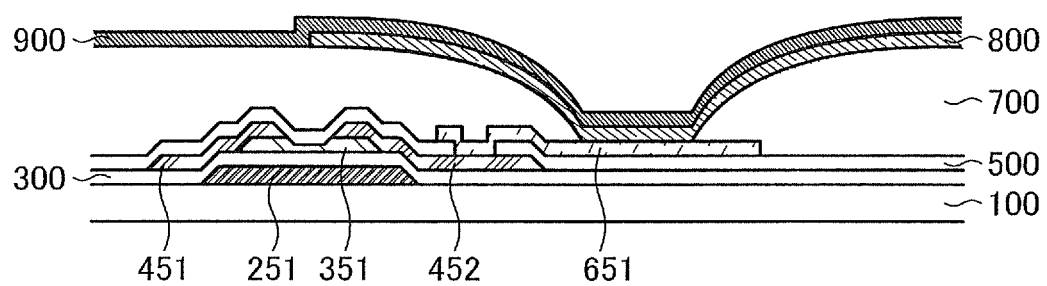
FIG. 12 illustrates an example of a semiconductor device.

FIG. 12 is an example of a cross-sectional view of a circuit in an element region which is formed in the same process as the circuits illustrated in FIGS. 9 to 11.

The element region is a region in which an element is formed.

In the case where the element is a display element, the element region can be referred to as a pixel region.

Explanation will be made on FIG. 9, FIGS. 10A and 10B, FIGS. 11A and 11B, and FIG. 12.

A substrate 100 has an insulating surface.

A conductive layer 201 is over the insulating surface.

A conductive layer 202 is over the insulating surface.

A conductive layer 203 is over the insulating surface.

A conductive layer 251 is over the insulating surface.

An insulating layer 300 is over the conductive layers 201, 202, 203, and 251.

A semiconductor layer 301 is over the insulating layer 300.

A semiconductor layer 302 is over the insulating layer 300.

A semiconductor layer 351 is over the insulating layer 300.

The semiconductor layer 301 includes an area overlapping with the conductive layer 201.

The semiconductor layer 302 includes an area overlapping with the conductive layer 202.

The semiconductor layer 351 includes an area overlapping with the conductive layer 251.

Although the semiconductor layers 301 and 302 are separated from each other, they may be joined together so as to be a single island-like semiconductor layer.

A conductive layer 401 is over the semiconductor layer 301.

A conductive layer 402 is over the semiconductor layer 302.

A conductive layer 403 is over the semiconductor layers 301 and 302.

A conductive layer 451 is over the semiconductor layer 351.

A conductive layer 452 is over the semiconductor layer 351.

An insulating layer 500 is over the conductive layers 401, 402, 403, 451, and 452.

A conductive layer 601 is over the insulating layer 500.

A conductive layer 602 is over the insulating layer 500.

A conductive layer 603 is over the insulating layer 500.

A conductive layer 651 is over the insulating layer 500.

FIG. 9 shows an example in which the conductive layers 601, 602, 603, and 651 have light-transmitting properties; however, the conductive layers 601, 602, 603, and 651 may have light-blocking properties or light-reflective properties.

The conductive layer 601 includes an area overlapping with the semiconductor layer 301.

The conductive layer 601 is electrically connected to the conductive layer 201.

The conductive layer 602 is electrically connected to the conductive layer 203.

The conductive layer 602 is electrically connected to the conductive layer 403.

The conductive layer 603 is electrically connected to the conductive layer 202.

The conductive layer 603 is electrically connected to the conductive layer 402.

The conductive layer 651 is electrically connected to the conductive layer 452.

An insulating layer 700 is over the conductive layers 601, 602, 603, and 651.

A function layer 800 is over the insulating layer 700 and the conductive layer 651.

A conductive layer 900 is over the function layer 800.

At least part of the conductive layer 201 serves as, for example, a gate electrode of the transistor Tr1 in FIG. 8.

At least part of the conductive layer 201 serves as, for example, the wiring L1 in FIG. 8.

At least part of the conductive layer 202 serves as, for example, a gate electrode of the transistor Tr2 in FIG. 8.

At least part of the conductive layer 203 serves as, for example, the wiring L2 in FIG. 8.

At least part of the conductive layer 251 serves as, for example, a gate electrode of a transistor in the element region.

At least part of the insulating layer 300 serves as, for example, a gate insulating film of the transistor Tr1 in FIG. 8.

At least part of the insulating layer 300 serves as, for example, a gate insulating film of the transistor Tr2 in FIG. 8.

At least part of the insulating layer 300 serves as, for example, a gate insulating film of the transistor in the element region.

At least part of the semiconductor layer 301 serves as, for example, a channel formation region of the transistor Tr1 in FIG. 8.

At least part of the semiconductor layer 302 serves as, for example, a channel formation region of the transistor Tr2 in FIG. 8.

At least part of the semiconductor layer 351 serves as, for example, a channel formation region of the transistor in the element region.

At least part of the conductive layer 401 serves as, for example, the other of the source electrode and the drain electrode of the transistor Tr1 in FIG. 8.

At least part of the conductive layer 401 serves as, for example, the wiring L4 in FIG. 8.

At least part of the conductive layer 402 serves as, for example, the other of the source electrode and the drain electrode of the transistor Tr2 in FIG. 8.

At least part of the conductive layer 402 serves as, for example, the wiring L3 in FIG. 8.

At least part of the conductive layer 403 serves as, for example, the one of the source electrode and the drain electrode of the transistor Tr1 in FIG. 8.

At least part of the conductive layer 403 serves as, for example, the one of the source electrode and the drain electrode of the transistor Tr2 in FIG. 8.

At least part of the conductive layer 403 serves as, for example, the wiring L2 in FIG. 8.

At least part of the conductive layer 451 serves as, for example, one of a source electrode and a drain electrode of the transistor in the element region.

At least part of the conductive layer 452 serves as, for example, the other of the source electrode and the drain electrode of the transistor in the element region.

At least part of the insulating layer 500 serves as, for example, an interlayer insulating film.

At least part of the insulating layer 500 serves as, for example, the gate insulating film of the transistor Tr1 in FIG. 8.

At least part of the conductive layer 601 serves as, for example, the gate electrode of the transistor Tr1 in FIG. 8.

At least part of the conductive layer 602 serves as, for example, the wiring L2 in FIG. 8.

At least part of the conductive layer 603 serves as a wiring for electrically connecting the gate of the transistor Tr2 in FIG. 8 to the other of the source and the drain of the transistor Tr2 in FIG. 8.

At least part of the conductive layer 651 serves as one electrode of the element in the element region.

In the case of an EL display device, at least part of the insulating layer 700 serves as, for example, a bank. The bank is located between adjacent pixel electrodes.

The bank preferably includes an organic substance.

The bank including the organic substance can be used as a planarization film.

In the case of the EL display device, the insulating layer 700 includes an area overlapping with an end of the conductive layer 651.

In the case of the EL display device, the insulating layer 700 includes an opening in an area overlapping with the conductive layer 651.

In the case where a liquid crystal display device is manufactured, at least part of the insulating layer 700 can be used as, for example, an alignment film.

In the case where at least part of the insulating layer 700 serves as an alignment film, it is preferable that the whole of the conductive layer 651 overlap with at least part of the insulating layer 700.

The alignment film preferably includes an organic substance.

In the case of the EL display device, the function layer 800 is, for example, an EL layer (a layer containing an organic compound).

In the case where a liquid crystal display device is manufactured, the function layer 800 is preferably provided over the insulating layer 700.

In the case of the liquid crystal display device, the function layer 800 is, for example, a liquid crystal layer.

The conductive layer 900 serves as, for example, the other electrode of the element.

By providing the conductive layer 601, the transistor Tr1 with a dual-gate structure can be obtained.

Since the transistor Tr2 is a single-gate transistor, the on-current of the transistor Tr1 is higher than that of the transistor Tr2.

It is preferable that the wiring L3 including the conductive layer 402 be electrically connected to a plurality of circuits.

The wiring L3 can be referred to as a common wiring.

It is preferable that the wiring L4 including the conductive layer 401 be electrically connected to a plurality of circuits.

The wiring L4 can be referred to as a common wiring.

For example, as illustrated in FIG. 9, a plurality of circuits are preferably arranged between the wiring L3 and the wiring L4.

The wiring L1 preferably intersects with the wiring L3 or the wiring L4.

The wiring L2 preferably intersects with the wiring L3 or the wiring L4.

In the case where the wiring L1 does not intersect with the wirings L3 and L4, the length of the wiring L1 increases.

An increase in the length of the wiring L1 leads to an increase in the resistance of the wiring L1.

In the case where the wiring L1 intersects with the wiring L3 or L4, the length of the wiring L1 can be reduced.

In the case where the wiring L2 does not intersect with the wirings L3 and L4, the length of the wiring L2 increases.

An increase in the length of the wiring L2 leads to an increase in the resistance of the wiring L2.

In the case where the wiring L2 intersects with the wiring L3 or L4, the length of the wiring L2 can be reduced.

For example, as illustrated in FIG. 9, the wiring L1 can be made to intersect with the wiring L4 by using the conductive layer 201 as the wiring L1.

For example, as illustrated in FIG. 9, the wiring L2 can be made to intersect with the wiring L3 by using the conductive layers 203, 403, and 602 as the wiring L2.

In the case where the conductive layer 402 is directly connected to the conductive layer 202, the step of forming an opening only in the insulating layer 300 is needed.

For example, when the conductive layer 402 is electrically connected to the conductive layer 202 through the conductive layer 602 as illustrated in FIG. 9, the step of forming an opening only in the insulating layer 300 is not needed.

By providing at least one of the conductive layers 601, 602, and 603, it is possible to make an effective use of the conductive layer formed in the same process as one electrode of the element.

In the case where the semiconductor layer 301 is an oxide semiconductor layer, the conductive layer 601 prevents the entry of a substance containing a hydrogen element into the oxide semiconductor layer.

The conductive layer 601 enables an increase in the on-current of a transistor in a circuit.

A conductive layer formed in the same process as one electrode of the element is not provided over the semiconductor layer 302.

The semiconductor layer 302 preferably includes silicon which is resistant to a substance containing a hydrogen element.

That is, it is preferable that the semiconductor layer 301 be an oxide semiconductor layer and the semiconductor layer 302 be a silicon layer.

At least part of the structure shown in this embodiment can be combined with at least part of the structures shown in the other embodiments, as appropriate.

(Embodiment 7)

Figure 13:
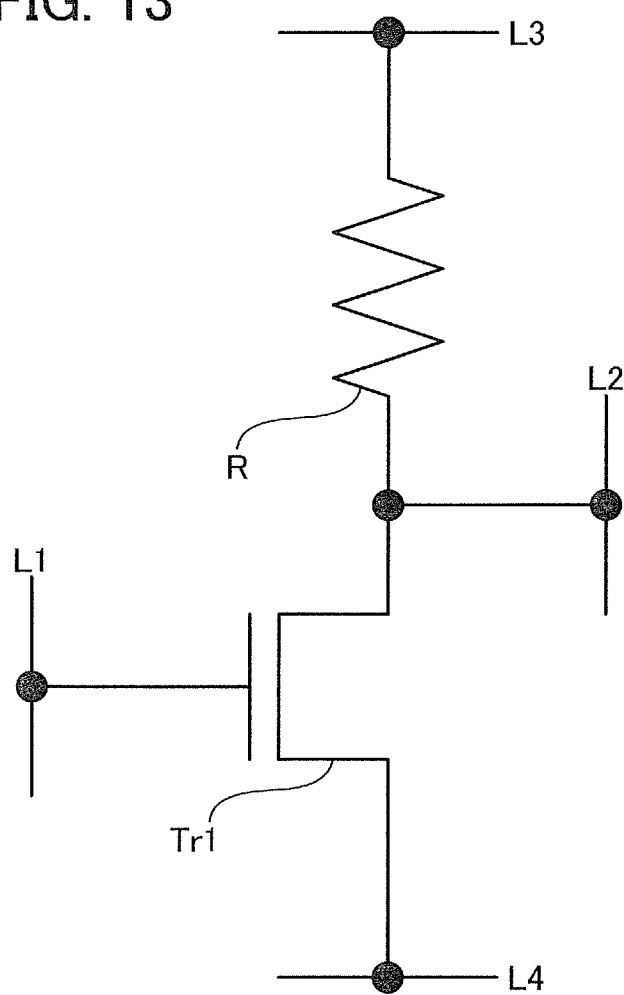
FIG. 13 illustrates an example of a semiconductor device.

FIG. 13 illustrates an example of a circuit.

A wiring L1 is electrically connected to a gate of a transistor Tr1.

A wiring L2 is electrically connected to one of a source and a drain of the transistor Tr1.

The wiring L2 is electrically connected to one terminal of a resistor R.

A wiring L3 is electrically connected to the other terminal of the resistor R.

A wiring L4 is electrically connected to the other of the source and the drain of the transistor Tr1.

At least part of the wiring L1 serves as an input terminal of an inverter circuit or a buffer circuit.

At least part of the wiring L1 has a function of transmitting a signal, a voltage, or a current.

At least part of the wiring L2 serves as an output terminal of an inverter circuit or a buffer circuit.

At least part of the wiring L2 has a function of transmitting a signal, a voltage, or a current.

At least part of the wiring L3 has a function of supplying a first potential.

At least part of the wiring L3 has a function of transmitting a signal, a voltage, or a current.

At least part of the wiring L4 has a function of supplying a second potential.

At least part of the wiring L4 has a function of transmitting a signal, a voltage, or a current.

The first potential is preferably different from the second potential.

There is no limitation on the conductivity of the transistor Tr1.

In the case where the transistor Tr1 is an N-type transistor and the first potential is higher than the second potential, the circuit of FIG. 13 serves as an inverter circuit.

In the case where the transistor Tr1 is an N-type transistor and the first potential is lower than the second potential, the circuit of FIG. 13 serves as a buffer circuit.

In the case where the transistor Tr1 is a P-type transistor and the first potential is higher than the second potential, the circuit of FIG. 13 serves as a buffer circuit.

In the case where the transistor Tr1 is a P-type transistor and the first potential is lower than the second potential, the circuit of FIG. 13 serves as an inverter circuit.

In the case where the circuit of FIG. 13 serves as an inverter circuit, the wiring L2 has a low potential when the wiring L1 has a high potential.

In the case where the circuit of FIG. 13 serves as an inverter circuit, the wiring L2 has a high potential when the wiring L1 has a low potential.

In the case where the circuit of FIG. 13 serves as a buffer circuit, the wiring L2 has a high potential when the wiring L1 has a high potential.

In the case where the circuit of FIG. 13 serves as a buffer circuit, the wiring L2 has a low potential when the wiring L1 has a low potential.

In the case where the first potential is lower than the second potential, it is preferable that the first potential be a low potential and the second potential be a high potential.

In the case where the first potential is higher than the second potential, it is preferable that the first potential be a high potential and the second potential be a low potential.

For stable circuit operation, the resistance of the transistor Tr1 being on is preferably lower than that of the resistor R.

It is thus preferable that the transistor Tr1 have high on-current and accordingly have a dual-gate structure.

For stable circuit operation, the transistor Tr1 preferably has low off-current.

A transistor including an oxide semiconductor layer has lower off-current than a transistor including a silicon layer.

Hence, the transistor Tr1 preferably includes an oxide semiconductor layer.

The resistivity of a layer including a silicon layer is easier to control than that of a layer including an oxide semiconductor layer.

Specifically, the resistivity can be controlled by adding a donor element or an acceptor element to a silicon layer.

The resistivity can be controlled precisely by employing an ion doping method or an ion implantation method for the addition of a donor element or an acceptor element.

Therefore, the resistor R preferably includes a silicon layer.

It is thus preferable that the transistor Tr1 include an oxide semiconductor layer and the resistor R include a silicon layer.

In order to reduce the number of manufacturing steps, the transistor Tr1 and the resistor R may be formed using the same semiconductor material.

At least part of the structure shown in this embodiment can be combined with at least part of the structures shown in the other embodiments, as appropriate.

(Embodiment 8)

Figure 14:
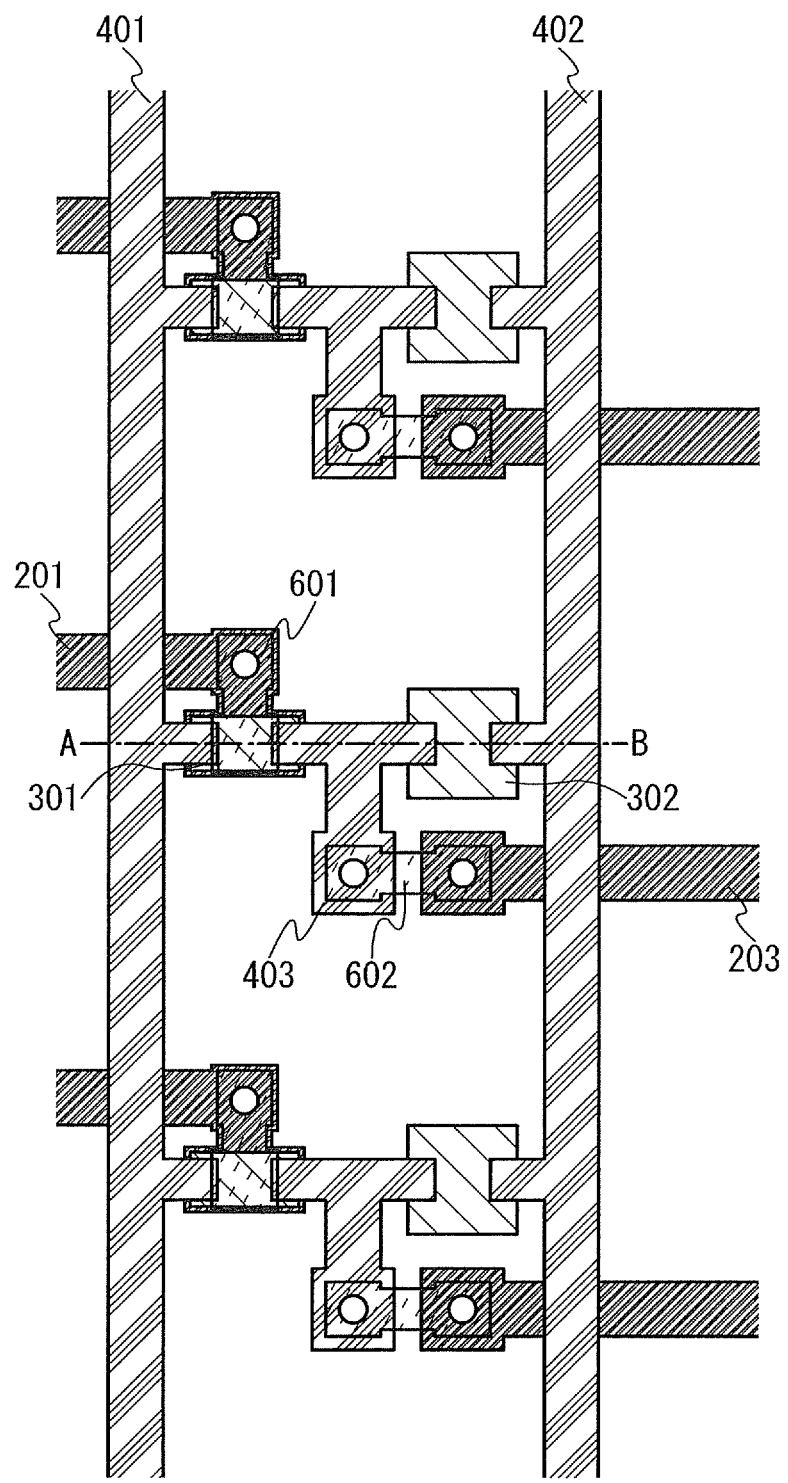
FIG. 14 illustrates an example of the semiconductor device.

FIG. 14 illustrates an example of a top view of a semiconductor device including the circuit illustrated in FIG. 13.

Figure 15:
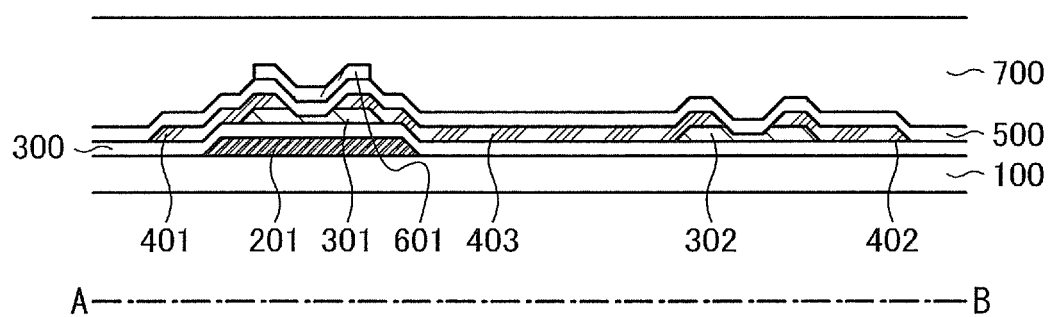
FIG. 15 illustrates the example of the semiconductor device.

FIG. 15 is an example of a cross-sectional view of FIG. 14 along line A-B.

FIG. 14 is a structure in which the conductive layer 202 and the conductive layer 603 are removed from FIG. 9; thus, the same description is not repeated.

At least part of the semiconductor layer 302 serves as a resistive element of the resistor R in FIG. 13.

Since the semiconductor layer 302 is a resistive element, there is no gate electrode that overlaps with the semiconductor layer 302.

Specifically, the insulating layer 300 includes a first area overlapping with the semiconductor layer 302.

The insulating layer 500 includes a second area overlapping with the semiconductor layer 302.

The first area is in contact with the insulating surface.

The second area is in contact with the insulating layer 700.

By using the conductive layer 601 or 602, it is possible to make an effective use of the conductive layer formed in the same process as one electrode of the element.

In the case where the semiconductor layer 301 is an oxide semiconductor layer, the conductive layer 601 prevents the entry of a substance containing a hydrogen element into the oxide semiconductor layer.

The conductive layer 601 enables an increase in the on-current of a transistor in a circuit.

The resistance of the transistor Tr1 being off is preferably higher than that of the resistor R.

It is thus preferable that, as illustrated in FIG. 14 for example, the width of the semiconductor layer of the resistor R in a direction perpendicular to the current flowing direction be larger than that (channel width) of the transistor Tr1 in a direction perpendicular to the current flowing direction.

At least part of the structure shown in this embodiment can be combined with at least part of the structures shown in the other embodiments, as appropriate.

(Embodiment 9)

Figure 16:
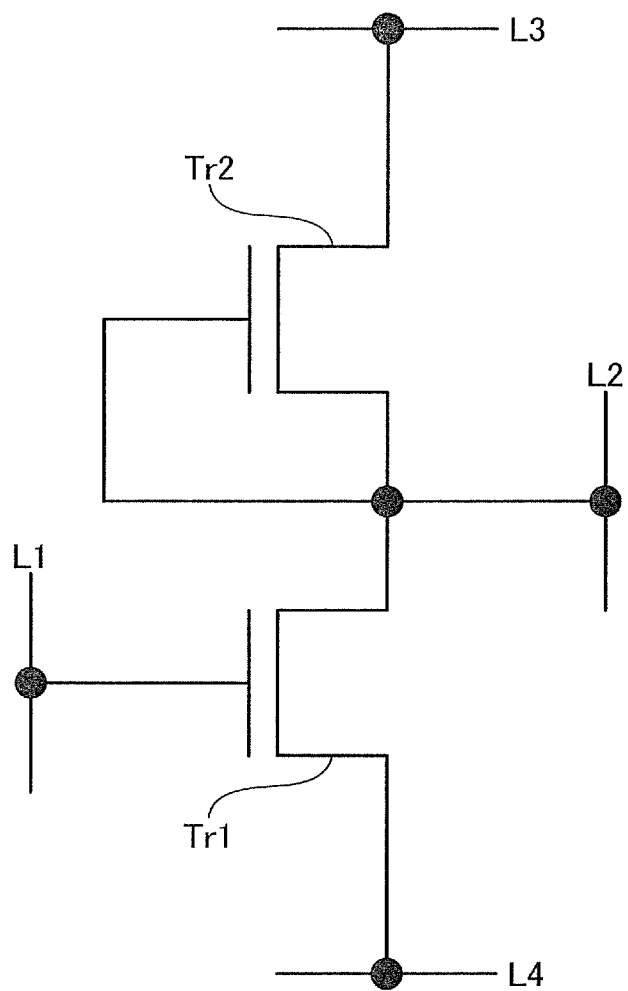
FIG. 16 illustrates an example of a semiconductor device.

FIG. 16 illustrates an example of a circuit.

A wiring L1 is electrically connected to a gate of a transistor Tr1.

A wiring L2 is electrically connected to one of a source and a drain of the transistor Tr1.

The wiring L2 is electrically connected to one of a source and a drain of a transistor Tr2.

The wiring L2 is electrically connected to a gate of the transistor Tr2.

A wiring L3 is electrically connected to the other of the source and the drain of the transistor Tr2.

A wiring L4 is electrically connected to the other of the source and the drain of the transistor Tr1.

At least part of the wiring L1 serves as an input terminal of an inverter circuit or a buffer circuit.

At least part of the wiring L1 has a function of transmitting a signal, a voltage, or a current.

At least part of the wiring L2 serves as an output terminal of an inverter circuit or a buffer circuit.

At least part of the wiring L2 has a function of transmitting a signal, a voltage, or a current.

At least part of the wiring L3 has a function of supplying a first potential.

At least part of the wiring L3 has a function of transmitting a signal, a voltage, or a current.

At least part of the wiring L4 has a function of supplying a second potential.

At least part of the wiring L4 has a function of transmitting a signal, a voltage, or a current.

The first potential is preferably different from the second potential.

The transistor Tr1 and the transistor Tr2 preferably have the same conductivity.

In the case where the transistors Tr1 and Tr2 are N-type transistors and the first potential is higher than the second potential, the circuit of FIG. 16 serves as an inverter circuit.

In the case where the transistors Tr1 and Tr2 are N-type transistors and the first potential is lower than the second potential, the circuit of FIG. 16 serves as a buffer circuit.

In the case where the transistors Tr1 and Tr2 are P-type transistors and the first potential is higher than the second potential, the circuit of FIG. 16 serves as a buffer circuit.

In the case where the transistors Tr1 and Tr2 are P-type transistors and the first potential is lower than the second potential, the circuit of FIG. 16 serves as an inverter circuit.

In the case where the circuit of FIG. 16 serves as an inverter circuit, the wiring L2 has a low potential when the wiring L1 has a high potential.

In the case where the circuit of FIG. 16 serves as an inverter circuit, the wiring L2 has a high potential when the wiring L1 has a low potential.

In the case where the circuit of FIG. 16 serves as a buffer circuit, the wiring L2 has a high potential when the wiring L1 has a high potential.

In the case where the circuit of FIG. 16 serves as a buffer circuit, the wiring L2 has a low potential when the wiring L1 has a low potential.

In the case where the first potential is lower than the second potential, it is preferable that the first potential be a low potential and the second potential be a high potential.

In the case where the first potential is higher than the second potential, it is preferable that the first potential be a high potential and the second potential be a low potential.

For stable circuit operation, both of the transistors Tr1 and Tr2 are preferably normally-off transistors.

Note that in the case where the transistors Tr1 and Tr2 are N-type transistors, it is preferable that the transistor Tr1 be a normally-off transistor and the transistor Tr2 be a normally-on transistor for stable circuit operation.

When the transistor Tr1 or Tr2 has a dual-gate structure, the on-current of the transistors in the circuit can be increased.

Also for stable circuit operation, the on-current of the transistor Tr1 is preferably higher than that of the transistor Tr2.

Hence, it is preferable that the transistor Tr1 be a dual-gate transistor and the transistor Tr2 be a single-gate transistor.

For stable circuit operation, the transistor Tr1 preferably has low off-current.

A transistor including an oxide semiconductor layer has lower off-current than a transistor including a silicon layer.

Therefore, the transistor Tr1 preferably includes an oxide semiconductor layer.

On the other hand, for example, in order to make the transistor Tr2 a normally-off transistor, the threshold voltage of the transistor Tr2 needs to be controlled.

The threshold voltage of a transistor including a silicon layer is easier to control than that of a transistor including an oxide semiconductor layer.

Specifically, the threshold voltage can be controlled by adding a donor element or an acceptor element to a silicon layer.

The threshold voltage can be controlled precisely by employing an ion doping method or an ion implantation method for the addition of a donor element or an acceptor element.

Hence, the transistor Tr2 preferably includes a silicon layer.

It is thus preferable that the transistor Tr1 include an oxide semiconductor layer and the transistor Tr2 include a silicon layer.

In order to reduce the number of manufacturing steps, the transistors Tr1 and Tr2 may be formed using the same semiconductor material.

At least part of the structure shown in this embodiment can be combined with at least part of the structures shown in the other embodiments, as appropriate.

(Embodiment 10)

Figure 17:
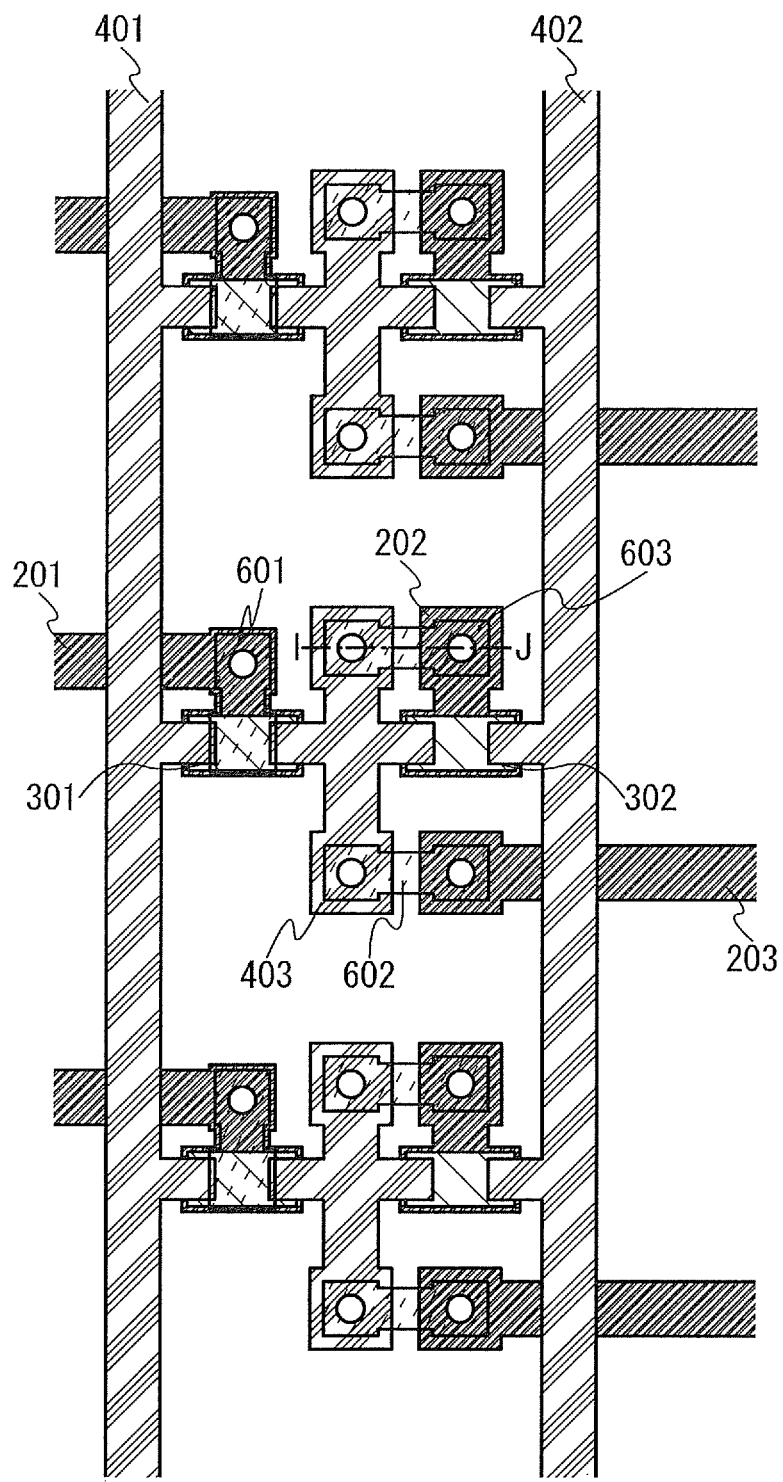
FIG. 17 illustrates an example of the semiconductor device.

FIG. 17 illustrates an example of a top view of a semiconductor device including the circuit illustrated in FIG. 16.

Figure 18:
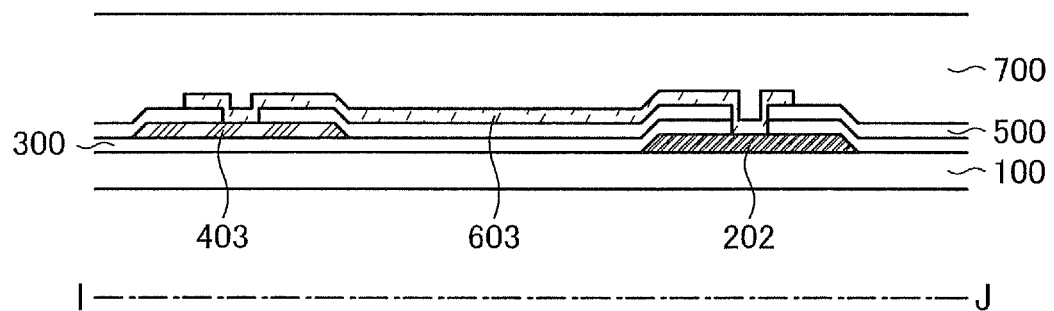
FIG. 18 illustrates the example of the semiconductor device.

FIG. 18 is an example of a cross-sectional view of FIG. 17 along line I-J.

FIG. 17 illustrates an example in which the conductive layer 603 is connected to a part different from that in FIG. 9; thus, the same description is not repeated.

The conductive layer 603, which is electrically connected to the conductive layer 402 in FIG. 9, is electrically connected to the conductive layer 403 in FIG. 17.

By providing at least one of the conductive layers 601, 602, and 603, it is possible to make an effective use of the conductive layer formed in the same process as one electrode of the element.

In the case where the semiconductor layer 301 is an oxide semiconductor layer, the conductive layer 601 prevents the entry of a substance containing a hydrogen element into the oxide semiconductor layer.

The conductive layer 601 enables an increase in the on-current of a transistor in a circuit.

At least part of the structure shown in this embodiment can be combined with at least part of the structures shown in the other embodiments, as appropriate.

(Embodiment 11)

Figure 19:
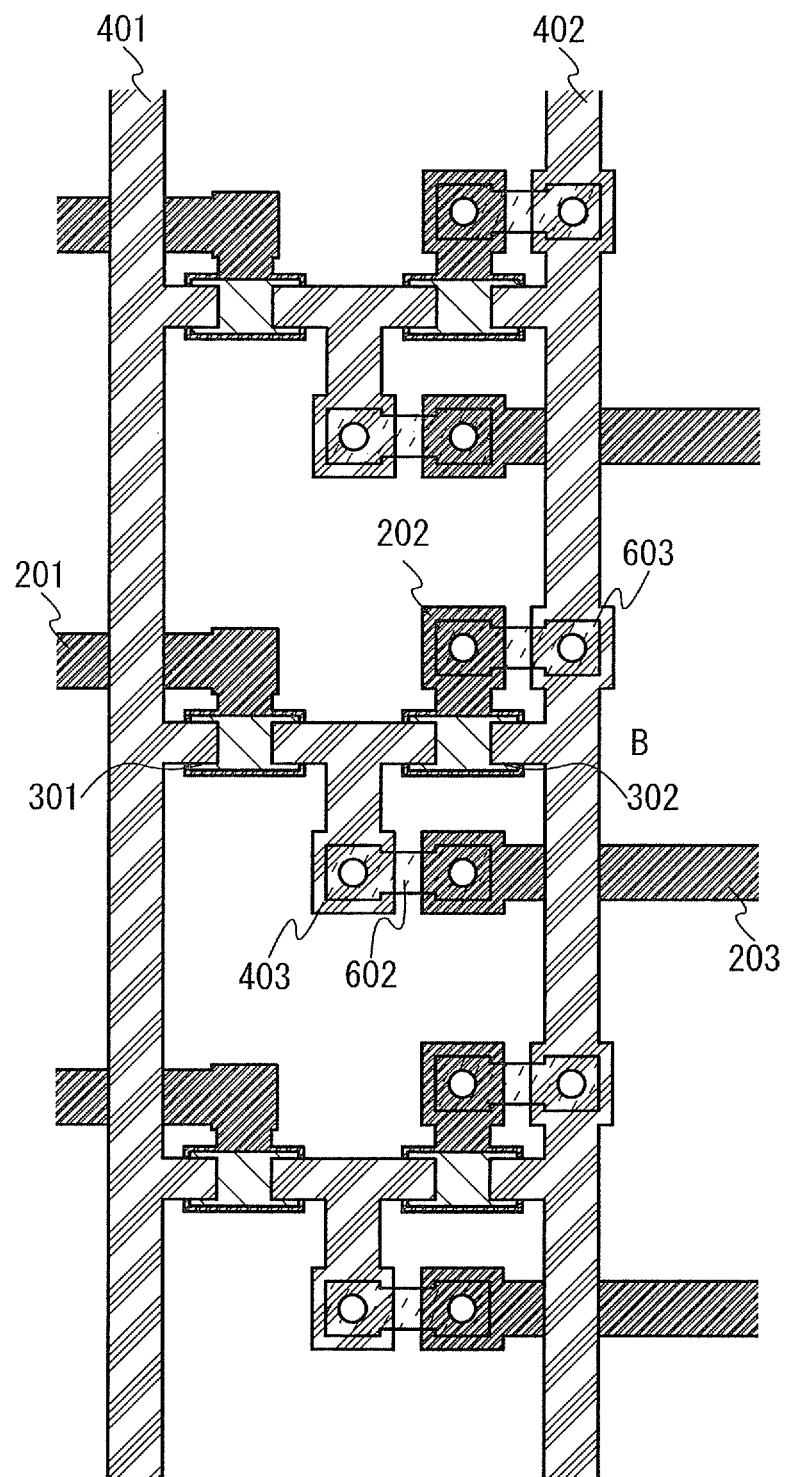
FIG. 19 illustrates an example of a semiconductor device.
Figure 20:
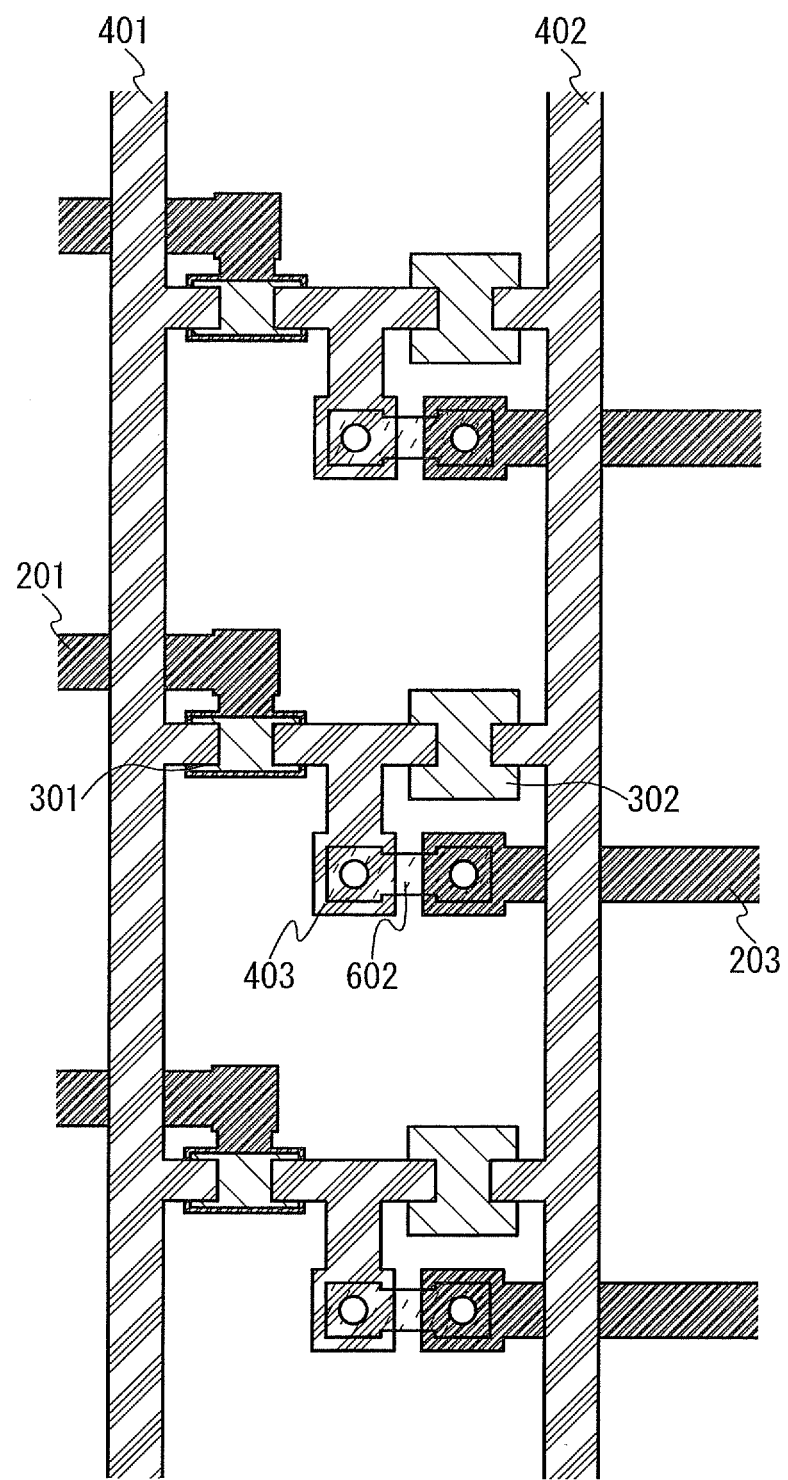
FIG. 20 illustrates an example of a semiconductor device.
Figure 21:
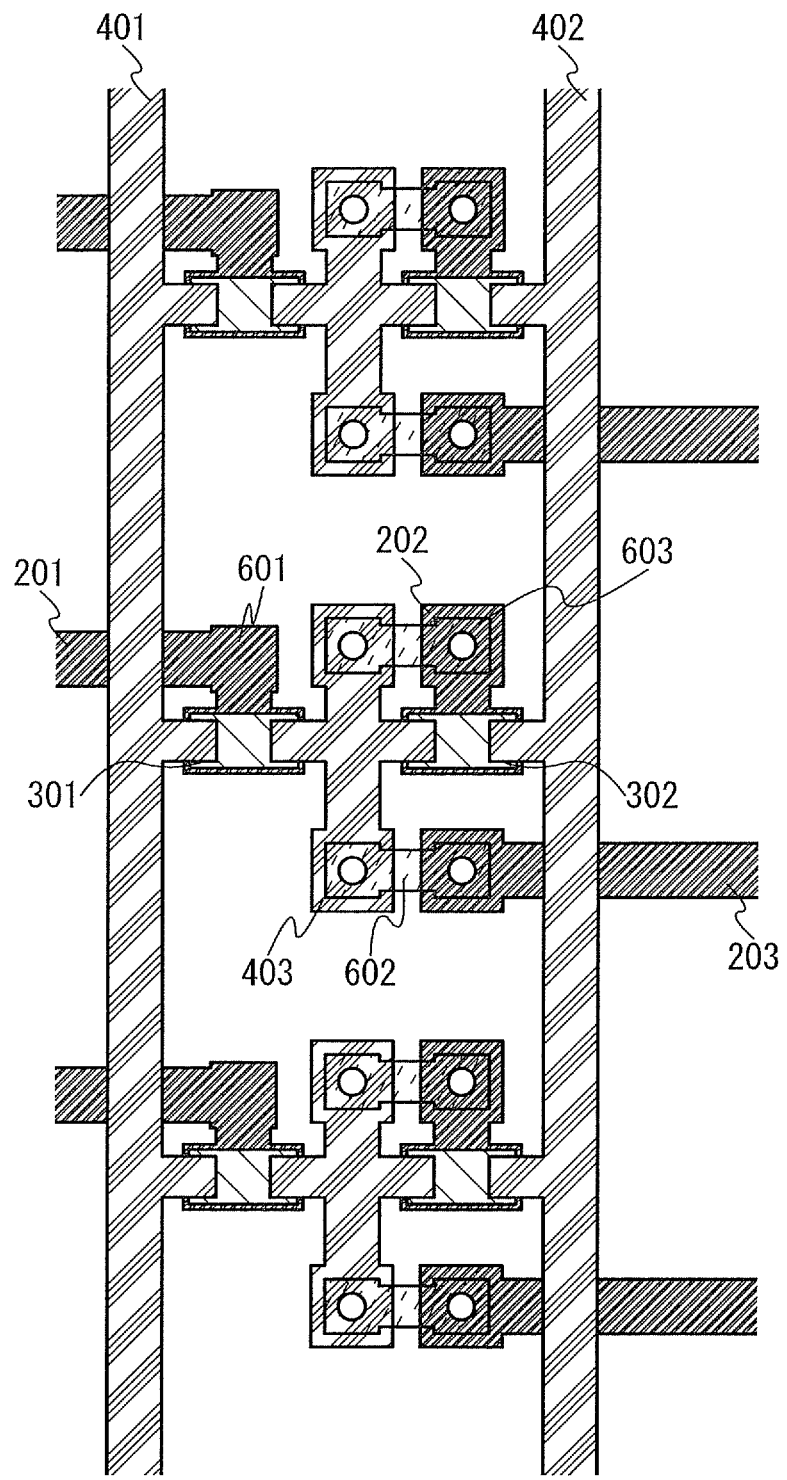
FIG. 21 illustrates an example of a semiconductor device.

The transistor Tr1 may be a single-gate transistor as illustrated in FIG. 19, FIG. 20, and FIG. 21.

FIG. 19 is an example in which the transistor Tr1 in FIG. 9 is changed to a single-gate transistor.

FIG. 20 is an example in which the transistor Tr1 in FIG. 14 is changed to a single-gate transistor.

FIG. 21 is an example in which the transistor Tr1 in FIG. 17 is changed to a single-gate transistor.

At least part of the structure shown in this embodiment can be combined with at least part of the structures shown in the other embodiments, as appropriate.

(Embodiment 12)

Figure 22:
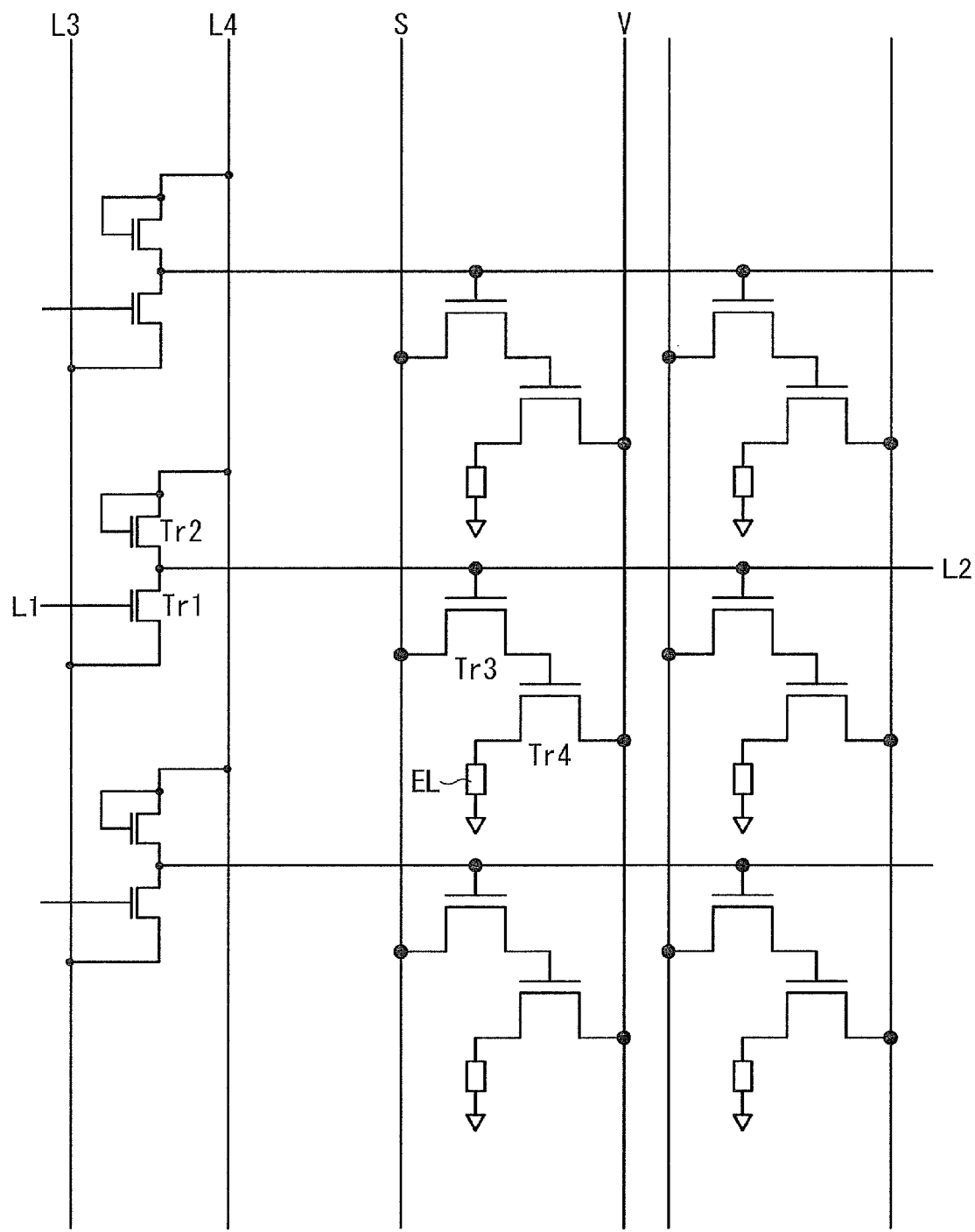
FIG. 22 illustrates an example of a semiconductor device.

FIG. 22 illustrates an example in which the circuit of FIG. 8 is used for part of a gate driver of an EL display device.

The connection relationship of the circuit of FIG. 8 is not repeated.

A wiring L2 is electrically connected to a gate of a transistor Tr3.

A wiring S is electrically connected to one of a source and a drain of the transistor Tr3.

A wiring V is electrically connected to one of a source and a drain of a transistor Tr4.

The other of the source and the drain of the transistor Tr3 is electrically connected to a gate of the transistor Tr4.

The other of the source and the drain of the transistor Tr4 is electrically connected to a light-emitting element EL.

The light-emitting element EL is, for example, an organic EL element, an inorganic EL element, or an LED element.

It is also possible to employ an element other than the light-emitting element EL (e.g., a liquid crystal element, an electrophoretic element, a memory element, or a capacitor element).

The wiring L1 preferably intersects with the wiring L3 in order to shorten the wiring L1.

The wiring L2 preferably intersects with the wiring L4 in order to shorten the wiring L2.

At least part of the structure shown in this embodiment can be combined with at least part of the structures shown in the other embodiments, as appropriate.

(Embodiment 13)

Figure 23:
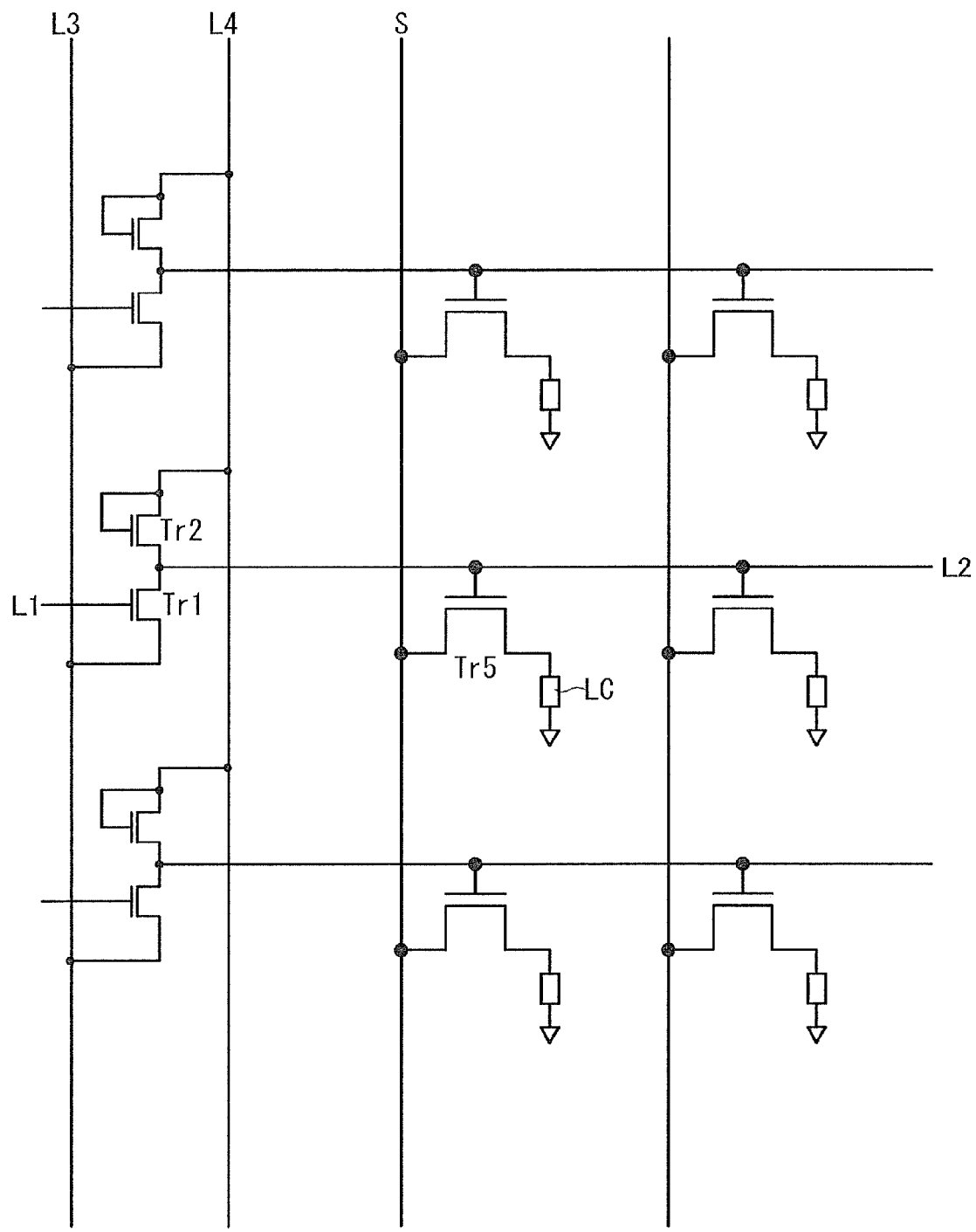
FIG. 23 illustrates an example of a semiconductor device.

FIG. 23 illustrates an example in which the circuit of FIG. 8 is used for part of a gate driver of a liquid crystal display device.

The connection relationship of the circuit of FIG. 8 is not repeated.

A wiring L2 is electrically connected to a gate of a transistor Tr5.

A wiring S is electrically connected to one of a source and a drain of the transistor Tr5.

A liquid crystal element LC is electrically connected to the other of the source and the drain of the transistor Tr5.

It is also possible to employ an element other than the liquid crystal element LC (e.g., a light-emitting element, an electrophoretic element, a memory element, or a capacitor element).

The wiring L1 preferably intersects with the wiring L3 in order to shorten the wiring L1.

The wiring L2 preferably intersects with the wiring L4 in order to shorten the wiring L2.

At least part of the structure shown in this embodiment can be combined with at least part of the structures shown in the other embodiments, as appropriate.

(Embodiment 14)

Figure 24:
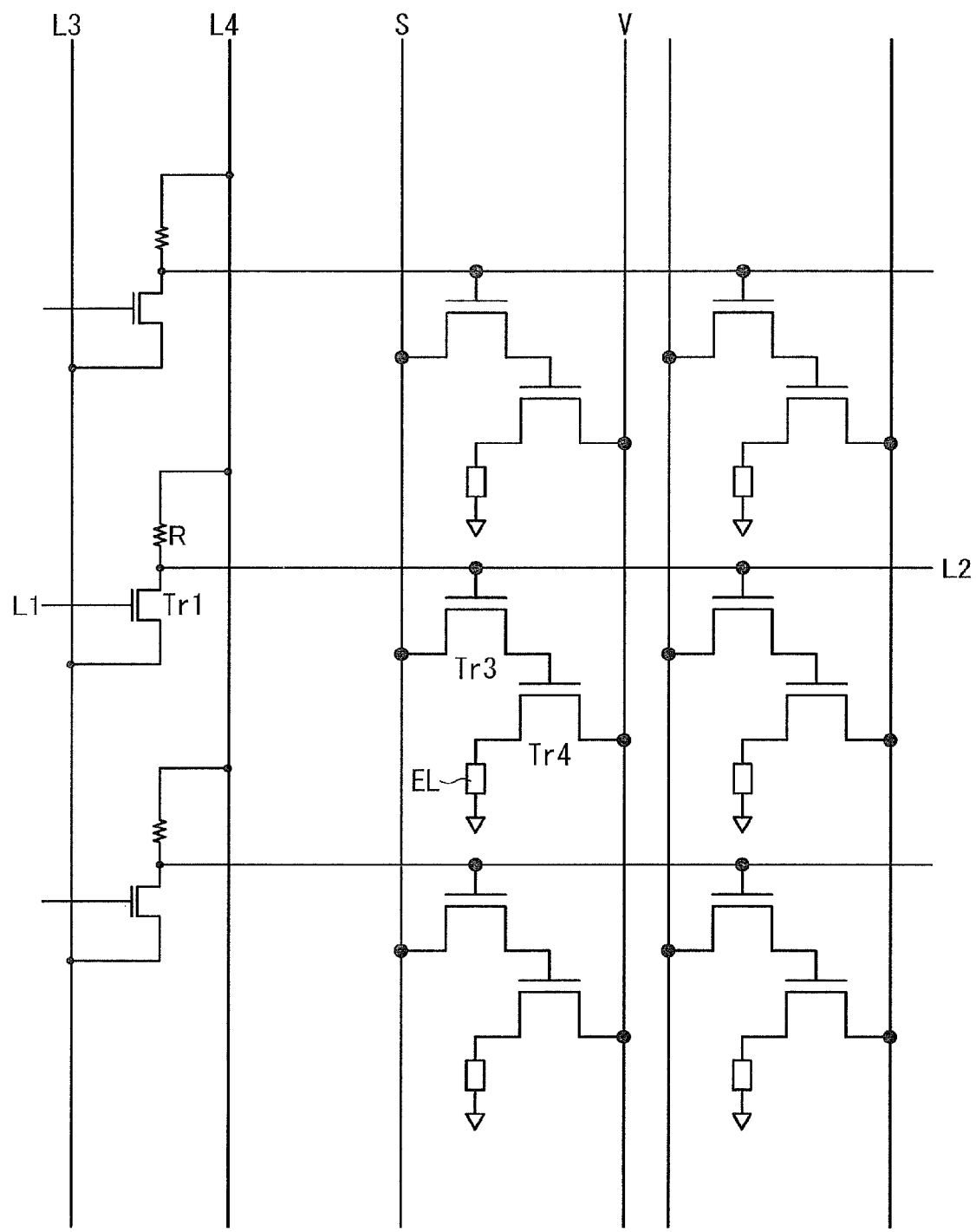
FIG. 24 illustrates an example of a semiconductor device.

FIG. 24 illustrates an example in which the circuit of FIG. 13 is used for part of a gate driver of an EL display device.

The connection relationship of the circuit of FIG. 13 is not repeated.

A wiring L2 is electrically connected to a gate of a transistor Tr3.

A wiring S is electrically connected to one of a source and a drain of the transistor Tr3.

A wiring V is electrically connected to one of a source and a drain of a transistor Tr4.

The other of the source and the drain of the transistor Tr3 is electrically connected to a gate of the transistor Tr4.

The other of the source and the drain of the transistor Tr4 is electrically connected to a light-emitting element EL.

The light-emitting element EL is, for example, an organic EL element, an inorganic EL element, or an LED element.

It is also possible to employ an element other than the light-emitting element EL (e.g., a liquid crystal element, an electrophoretic element, a memory element, or a capacitor element).

The wiring L1 preferably intersects with the wiring L3 in order to shorten the wiring L1.

The wiring L2 preferably intersects with the wiring L4 in order to shorten the wiring L2.

At least part of the structure shown in this embodiment can be combined with at least part of the structures shown in the other embodiments, as appropriate.

(Embodiment 15)

Figure 25:
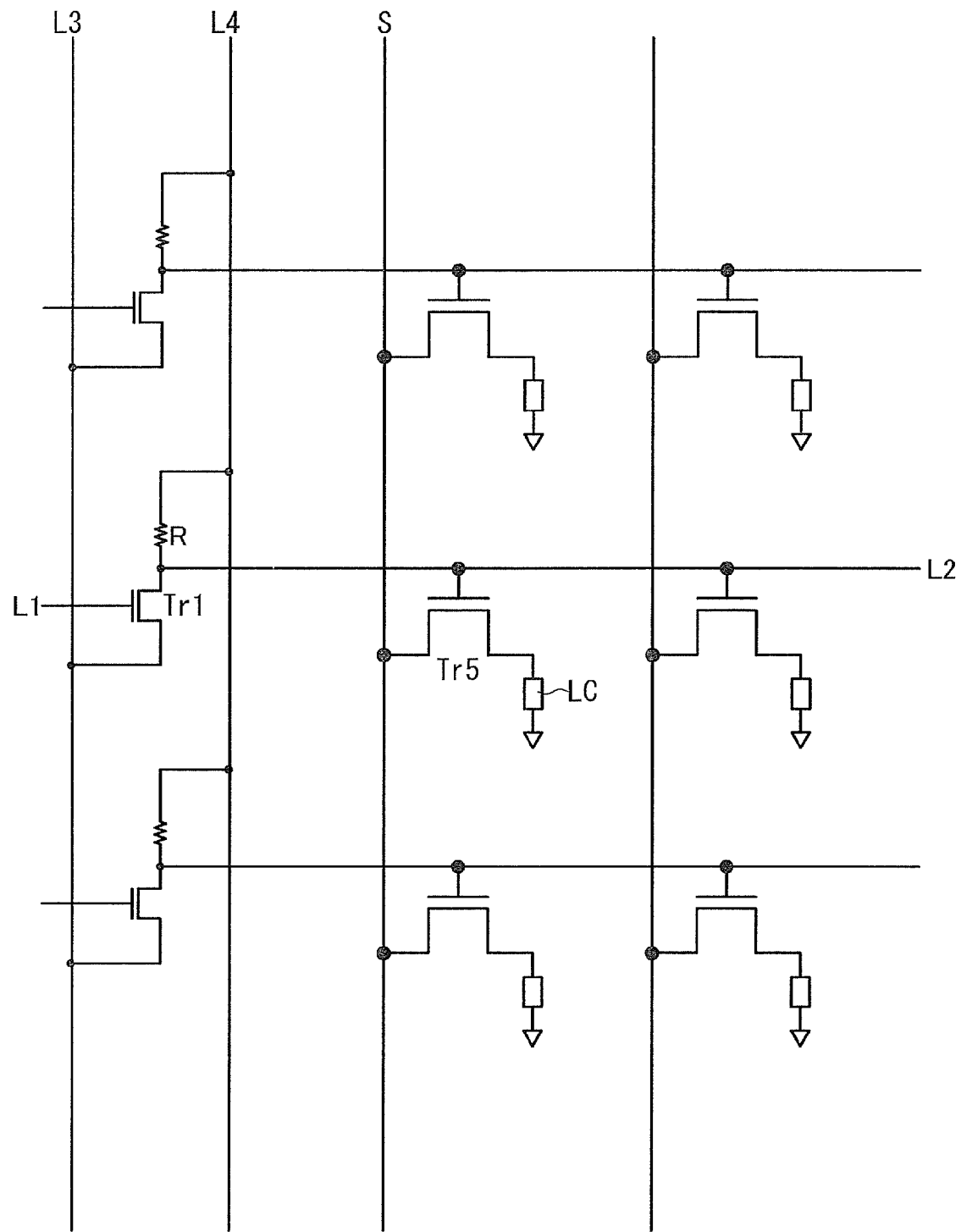
FIG. 25 illustrates an example of a semiconductor device.

FIG. 25 illustrates an example in which the circuit of FIG. 13 is used for part of a gate driver of a liquid crystal display device.

The connection relationship of the circuit of FIG. 13 is not repeated.

A wiring L2 is electrically connected to a gate of a transistor Tr5.

A wiring S is electrically connected to one of a source and a drain of the transistor Tr5.

A liquid crystal element LC is electrically connected to the other of the source and the drain of the transistor Tr5.

It is also possible to employ an element other than the liquid crystal element LC (e.g., a light-emitting element, an electrophoretic element, a memory element, or a capacitor element).

The wiring L1 preferably intersects with the wiring L3 in order to shorten the wiring L1.

The wiring L2 preferably intersects with the wiring L4 in order to shorten the wiring L2.

At least part of the structure shown in this embodiment can be combined with at least part of the structures shown in the other embodiments, as appropriate.

(Embodiment 16)

Figure 26:
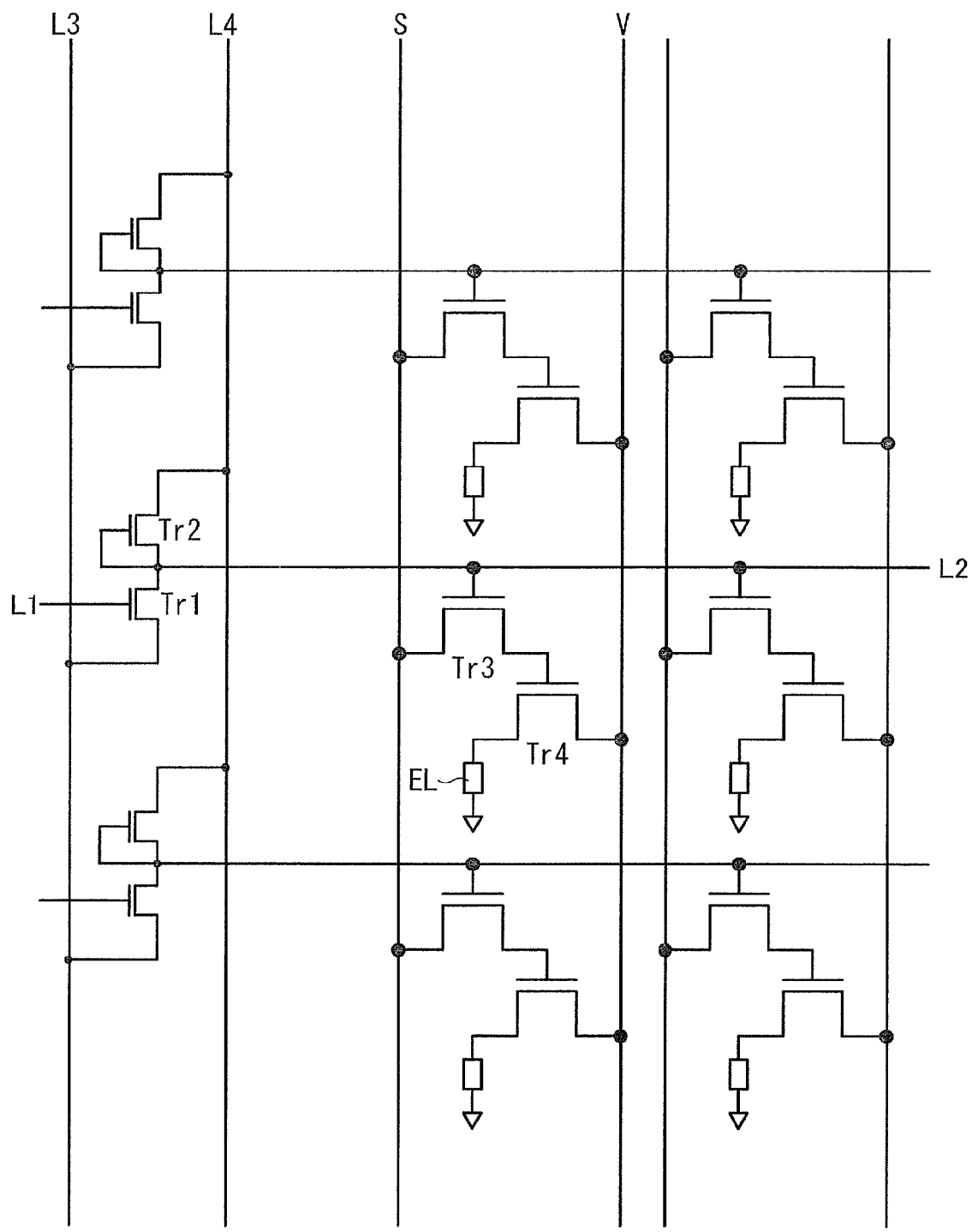
FIG. 26 illustrates an example of a semiconductor device.

FIG. 26 illustrates an example in which the circuit of FIG. 16 is used for part of a gate driver of an EL display device.

The connection relationship of the circuit of FIG. 16 is not repeated.

A wiring L2 is electrically connected to a gate of a transistor Tr3.

A wiring S is electrically connected to one of a source and a drain of the transistor Tr3.

A wiring V is electrically connected to one of a source and a drain of a transistor Tr4.

The other of the source and the drain of the transistor Tr3 is electrically connected to a gate of the transistor Tr4.

The other of the source and the drain of the transistor Tr4 is electrically connected to a light-emitting element EL.

The light-emitting element EL is, for example, an organic EL element, an inorganic EL element, or an LED element.

It is also possible to employ an element other than the light-emitting element EL (e.g., a liquid crystal element, an electrophoretic element, a memory element, or a capacitor element).

The wiring L1 preferably intersects with the wiring L3 in order to shorten the wiring L1.

The wiring L2 preferably intersects with the wiring L4 in order to shorten the wiring L2.

At least part of the structure shown in this embodiment can be combined with at least part of the structures shown in the other embodiments, as appropriate.

(Embodiment 17)

Figure 27:
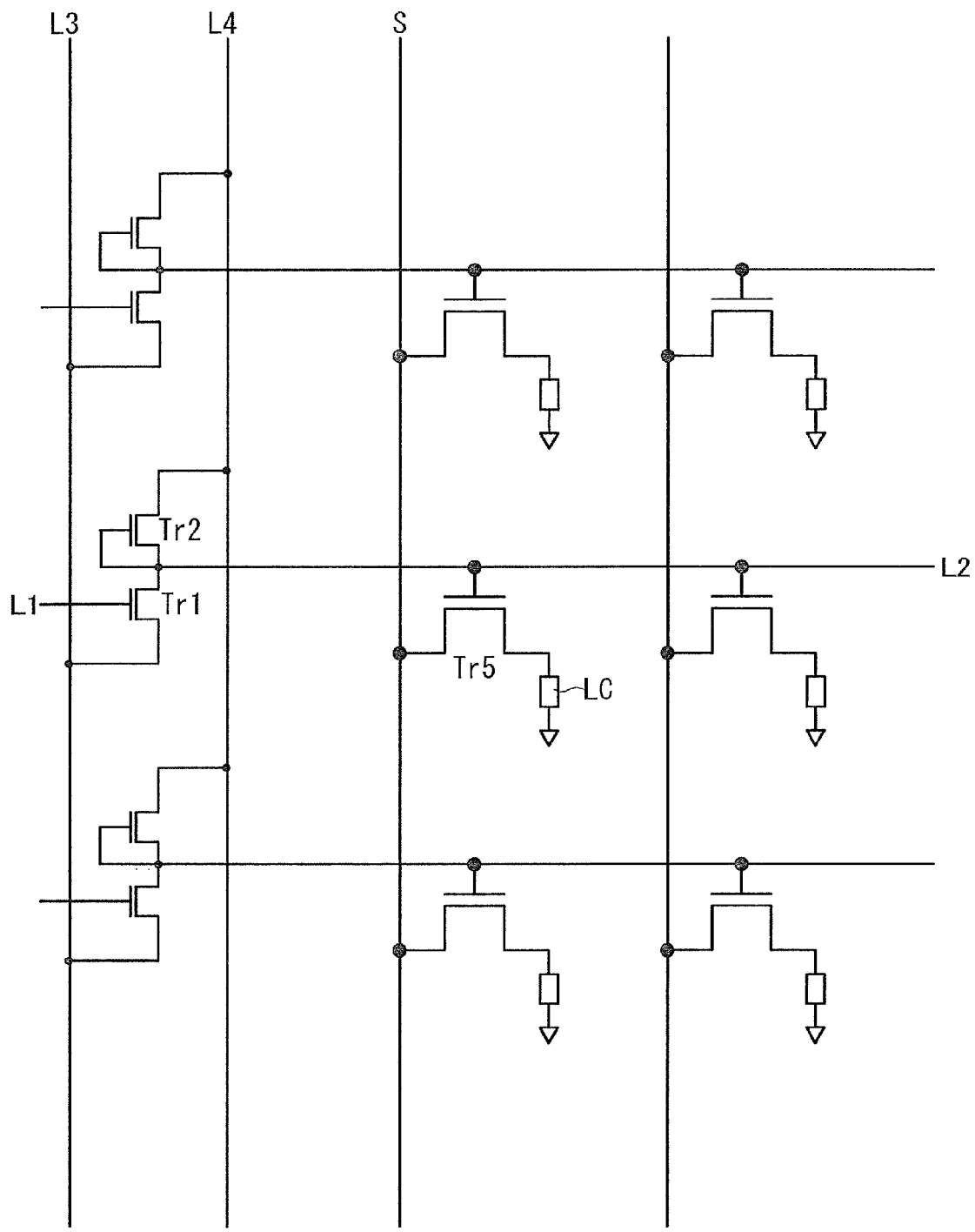
FIG. 27 illustrates an example of a semiconductor device.

FIG. 27 illustrates an example in which the circuit of FIG. 16 is used for part of a gate driver of a liquid crystal display device.

The connection relationship of the circuit of FIG. 16 is not repeated.

A wiring L2 is electrically connected to a gate of a transistor Tr5.

A wiring S is electrically connected to one of a source and a drain of the transistor Tr5.

A liquid crystal element LC is electrically connected to the other of the source and the drain of the transistor Tr5.

It is also possible to employ an element other than the liquid crystal element LC (e.g., a light-emitting element, an electrophoretic element, a memory element, or a capacitor element).

The wiring L1 preferably intersects with the wiring L3 in order to shorten the wiring L1.

The wiring L2 preferably intersects with the wiring L4 in order to shorten the wiring L2.

At least part of the structure shown in this embodiment can be combined with at least part of the structures shown in the other embodiments, as appropriate.

(Embodiment 18)

Figure 28:
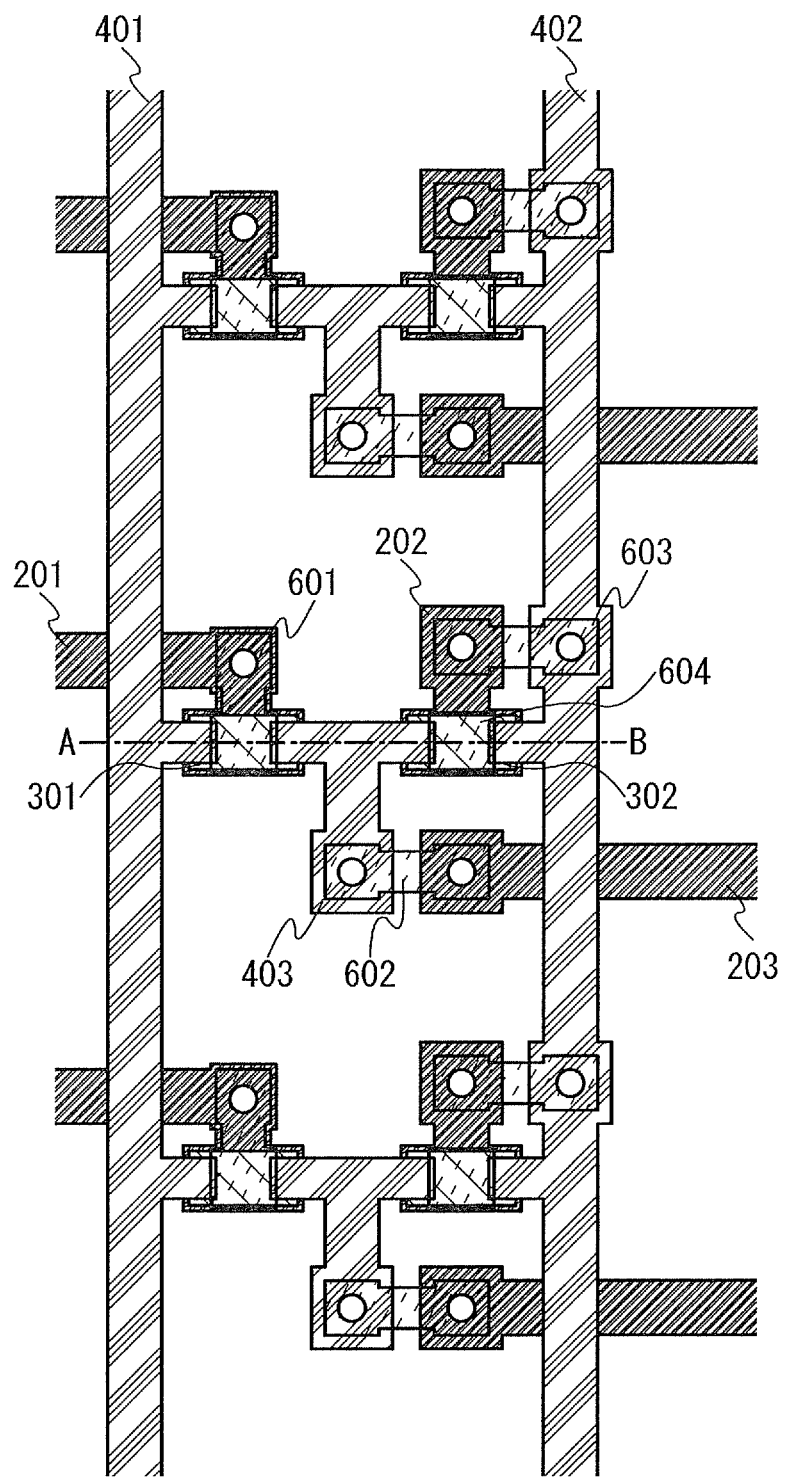
FIG. 28 illustrates an example of a semiconductor device.

FIG. 28 illustrates an example in which a conductive layer 604 is added to the structure of FIG. 9.

Figure 29:
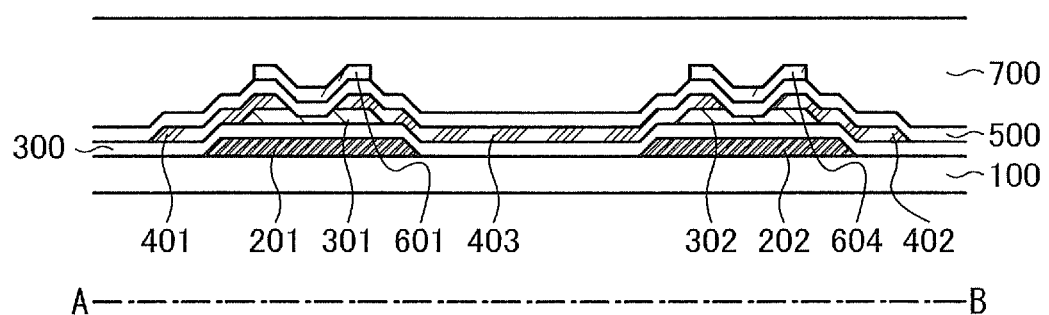
FIG. 29 illustrates the example of the semiconductor device.

FIG. 29 is an example of a cross-sectional view of FIG. 28 along line A-B.

Figure 30:
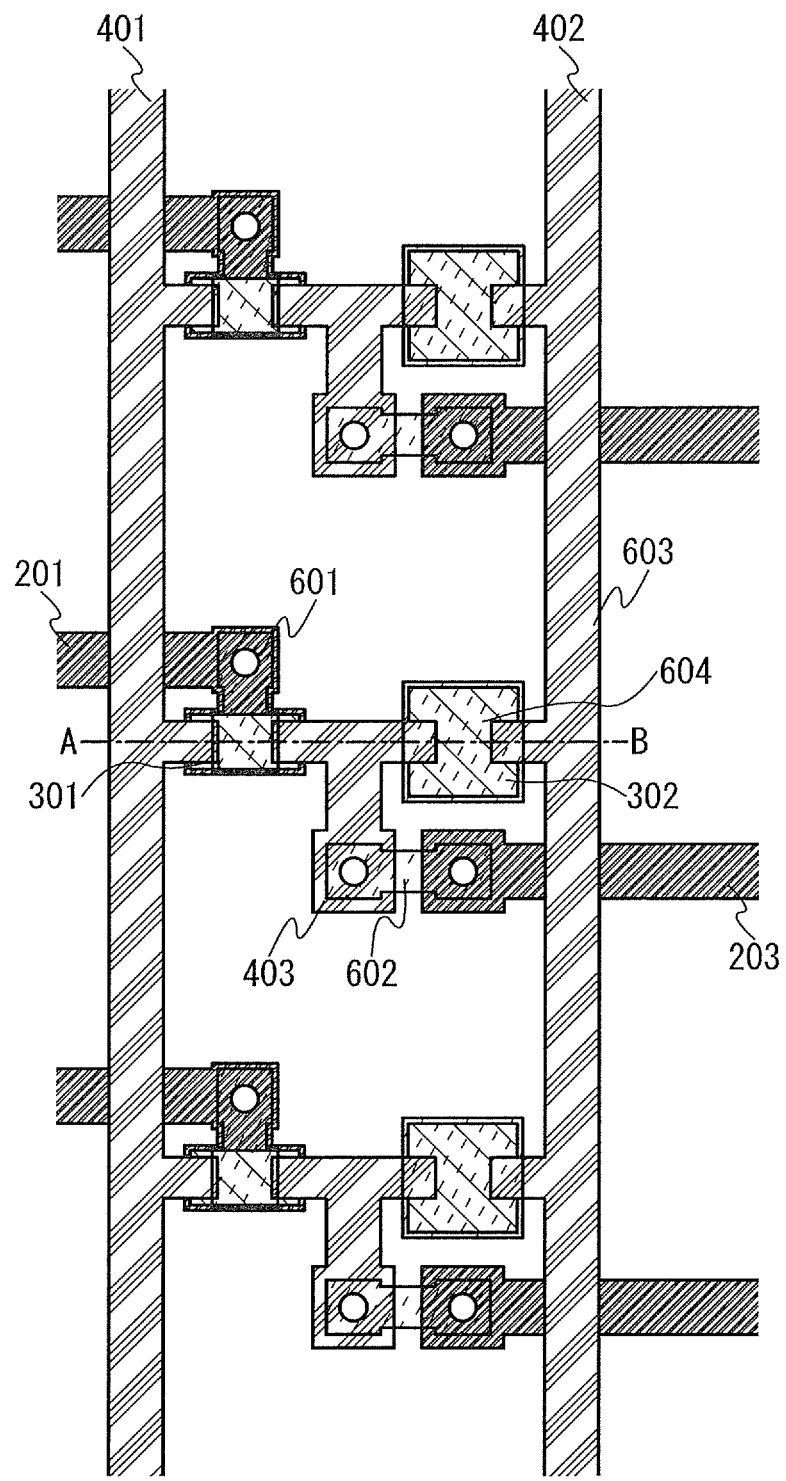
FIG. 30 illustrates an example of a semiconductor device.

FIG. 30 illustrates an example in which the conductive layer 604 is added to the structure of FIG. 14.

Figure 31:
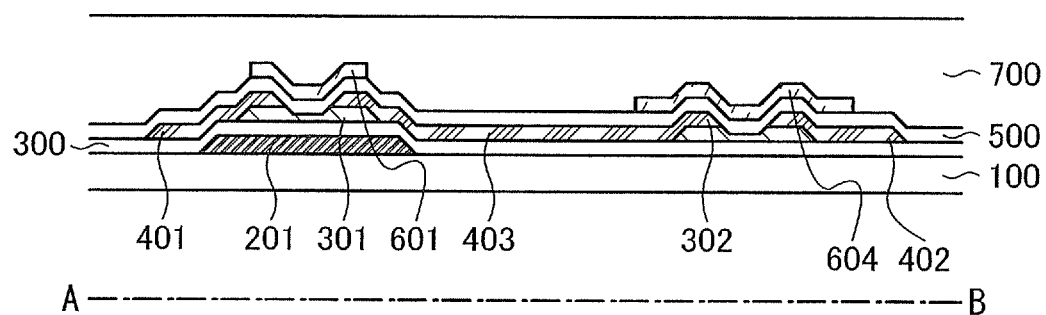
FIG. 31 illustrates the example of the semiconductor device.

FIG. 31 is an example of a cross-sectional view of FIG. 30 along line A-B.

Figure 32:
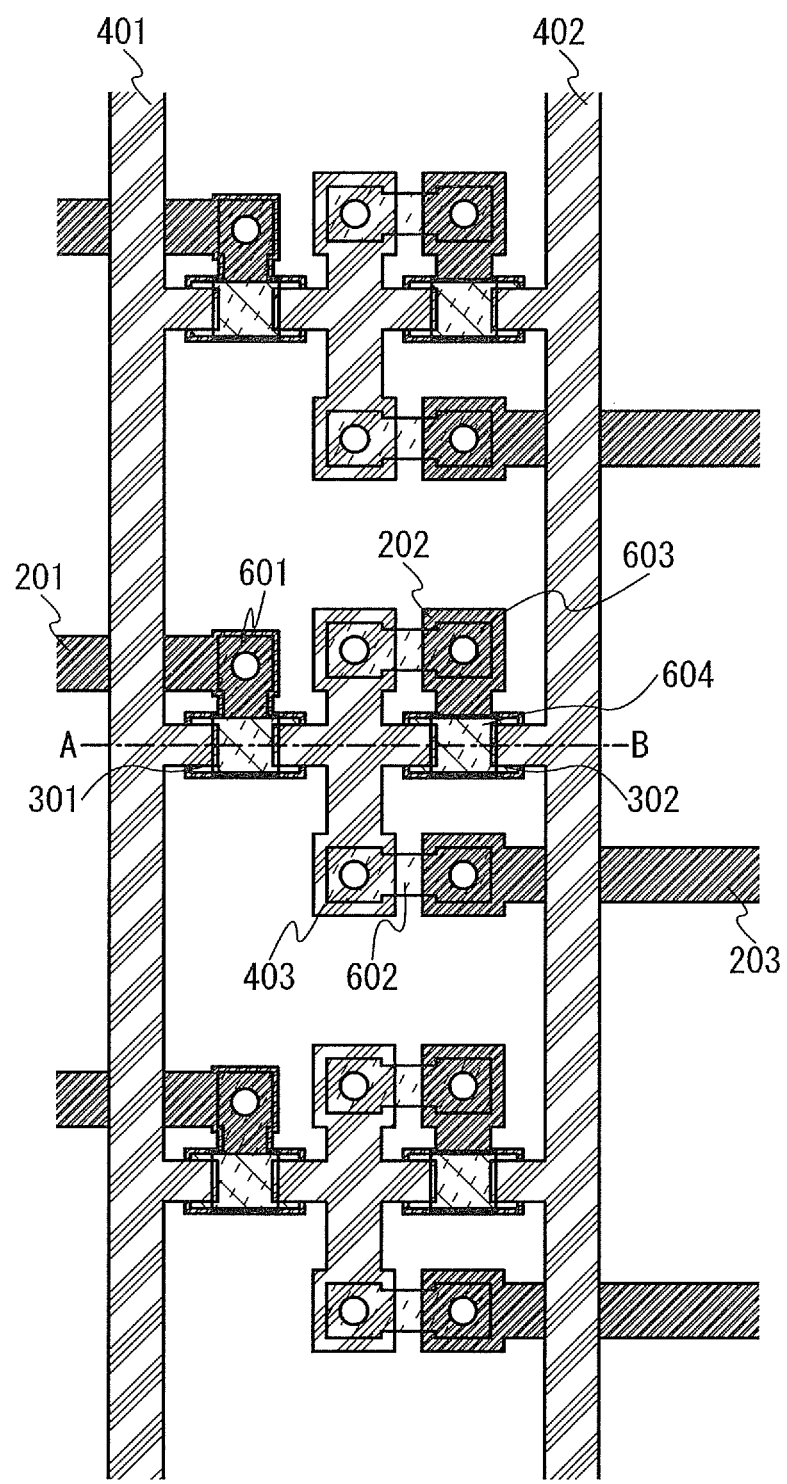
FIG. 32 illustrates an example of a semiconductor device.

FIG. 32 illustrates an example in which the conductive layer 604 is added to the structure of FIG. 17.

Figure 33:
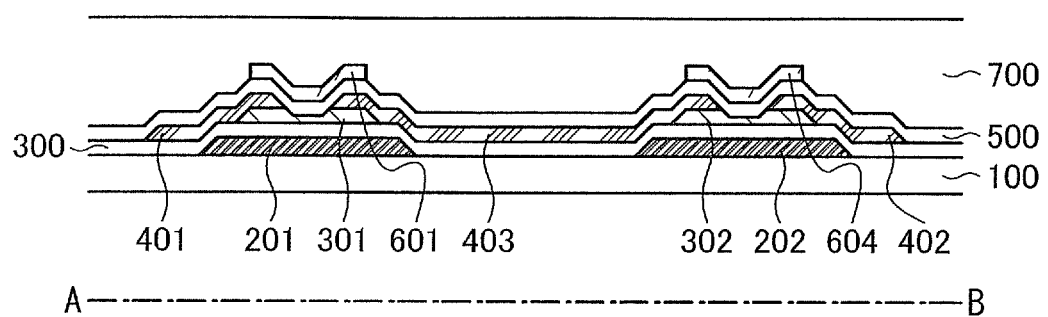
FIG. 33 illustrates the example of a semiconductor device.

FIG. 33 is an example of a cross-sectional view of FIG. 30 along line A-B.

In the case where the semiconductor layer 302 is an oxide semiconductor layer, the properties of the oxide semiconductor layer are changed by $H_2O$ entering it.

The conductive layer 604 prevents the entry of $H_2O$ into the semiconductor layer 302.

In the case where the semiconductor layer 302 includes a channel formation region, a shift of the threshold voltage of the transistor can be prevented.

In the case where the semiconductor layer 302 is a resistive element, a change in the resistivity of the resistive element can be prevented.

The conductive layer 604 is in a floating state in this embodiment.

The floating state refers to, for example, a state where the conductive layer 604 is not in contact with the other conductive layers.

The conductive layer 604 is not in contact with the conductive layer 201.

The conductive layer 604 is electrically isolated from the conductive layer 201.

The conductive layer 604 is not in contact with the conductive layer 202.

The conductive layer 604 is electrically isolated from the conductive layer 202.

The conductive layer 604 is not in contact with the conductive layer 401.

The conductive layer 604 is electrically isolated from the conductive layer 401.

The conductive layer 604 is not in contact with the conductive layer 402.

The conductive layer 604 is electrically isolated from the conductive layer 402.

The conductive layer 604 is not in contact with the conductive layer 403.

The conductive layer 604 is electrically isolated from the conductive layer 403.

In the case where the conductive layer 604 is not in a floating state, the conductive layer 604 may be electrically connected to another conductive layer.

In that case, when the conductive layer 604 is formed into an island shape, it is possible to reduce the parasitic capacitance between the conductive layer 604 and the other conductive layer.

On the other hand, in order to block the entry of $H_2O$ more effectively, a large area of the conductive layer 604 preferably overlaps with the semiconductor layer 302.

For example, the area where the conductive layer 604 overlaps with the semiconductor layer 302 is preferably larger than the area where the conductive layer 604 overlaps with the conductive layer 401.

For example, the area where the conductive layer 604 overlaps with the semiconductor layer 302 is preferably larger than the area where the conductive layer 604 overlaps with the conductive layer 402.

For example, the area where the conductive layer 604 overlaps with the semiconductor layer 302 is preferably larger than the area where the conductive layer 604 overlaps with the conductive layer 403.

In this embodiment, the area where the conductive layer 604 overlaps with the conductive layer 401 is 0.

The conductive layer 604 can be formed in the same process as the conductive layer 601.

At least part of the structure shown in this embodiment can be combined with at least part of the structures shown in the other embodiments, as appropriate.

(Embodiment 19)

Figure 34:
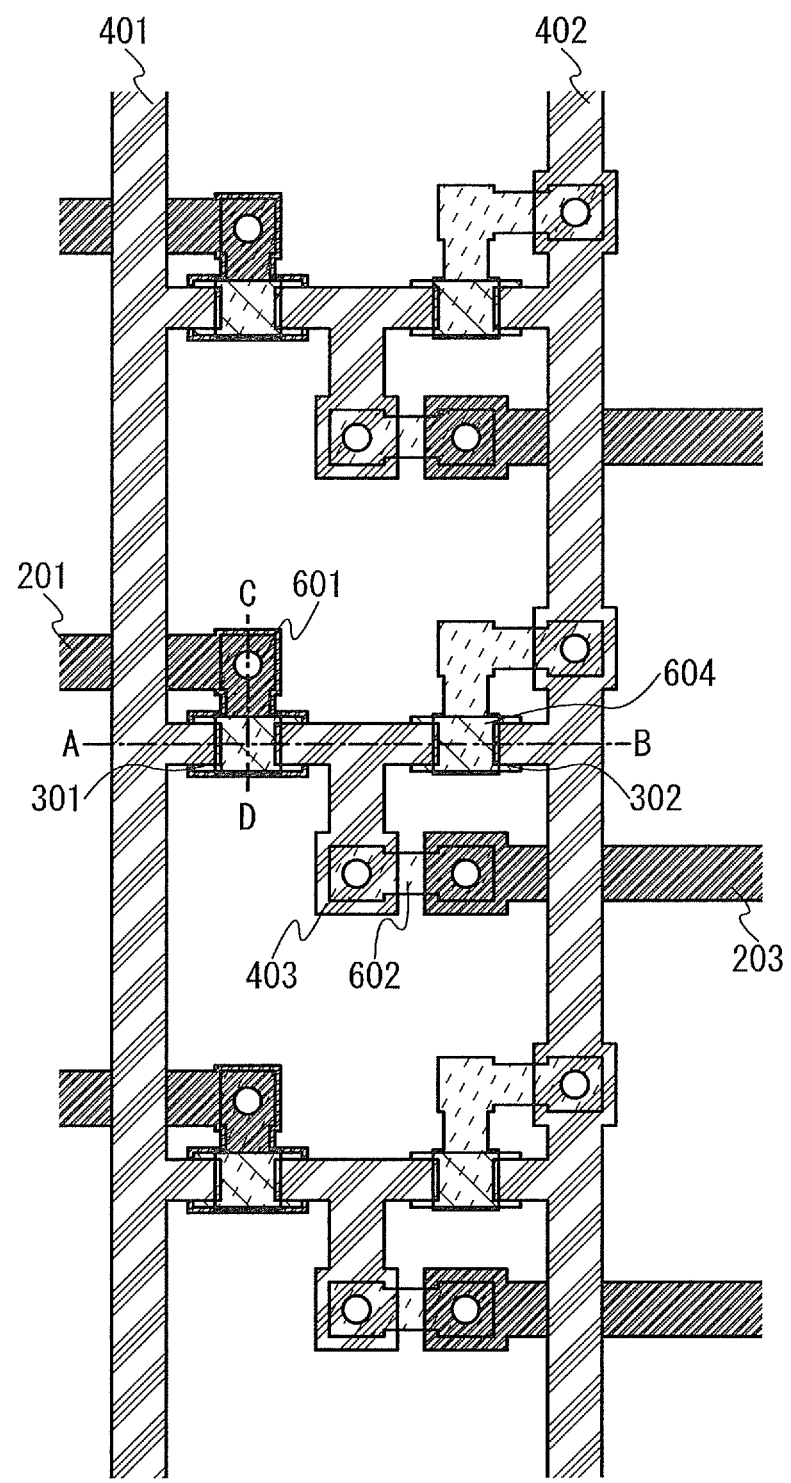
FIG. 34 illustrates an example of a semiconductor device.

FIG. 34 illustrates an example in which the transistor Tr2 is a top-gate transistor.

Figure 35:
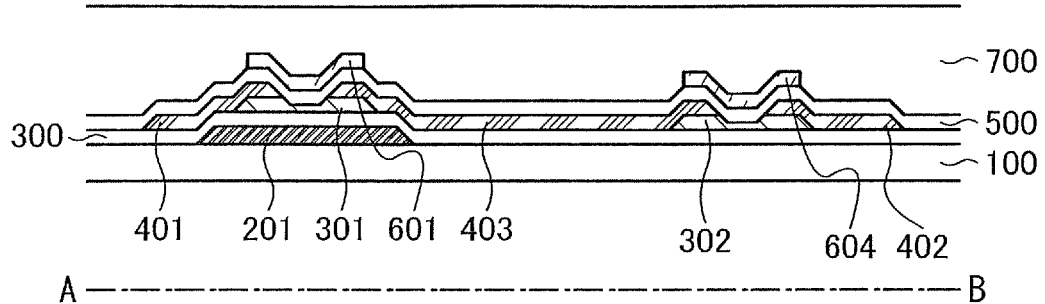
FIG. 35 illustrates the example of the semiconductor device.

FIG. 35 is an example of a cross-sectional view of FIG. 34 along line A-B.

The conductive layer 601 includes an area overlapping with the semiconductor layer 301.

The conductive layer 604 includes an area overlapping with the semiconductor layer 302.

Hence, in the case where the semiconductor layer is an oxide semiconductor layer, it is possible to prevent the entry of a substance containing a hydrogen element into the oxide semiconductor layer.

When the transistor Tr1 is a dual-gate transistor and the transistor Tr2 is a top-gate transistor, the on-current of the transistor Tr1 is higher than that of the transistor Tr2.

When the conductive layer 604 is formed into an island shape, it is possible to reduce the parasitic capacitance between the conductive layer 604 and another conductive layer.

On the other hand, in order to block the entry of $H_2O$ more effectively, a large area of the conductive layer 604 preferably overlaps with the semiconductor layer 302.

For example, the area where the conductive layer 604 overlaps with the semiconductor layer 302 is preferably larger than the area where the conductive layer 604 overlaps with the conductive layer 401.

For example, the area where the conductive layer 604 overlaps with the semiconductor layer 302 is preferably larger than the area where the conductive layer 604 overlaps with the conductive layer 402.

For example, the area where the conductive layer 604 overlaps with the semiconductor layer 302 is preferably larger than the area where the conductive layer 604 overlaps with the conductive layer 403.

In this embodiment, the area where the conductive layer 604 overlaps with the conductive layer 401 is 0.

The conductive layer 604 can be formed in the same process as the conductive layer 601.

This embodiment shows an example of the circuit of FIG. 8; it may also be applied to the other circuits.

For example, when the conductive layer 604 is electrically isolated from the conductive layer 402 and the conductive layer 604 is electrically connected to the conductive layer 403, the circuit of FIG. 16 can be obtained.

At least part of the structure shown in this embodiment can be combined with at least part of the structures shown in the other embodiments, as appropriate.

(Embodiment 20)

In the case where the conductive layer 604 has heat dissipation properties, heat generated in the circuit can be released.

In the case where the conductive layer 604 has heat dissipation properties, the material of the semiconductor layer is not limited.

Examples of the layer having heat dissipation properties include, but are not limited to, gold, silver, copper, platinum, iron, aluminum, molybdenum, titanium, and tungsten.

For example, gold has a thermal conductivity of about 320 W/m·K.

For example, silver has a thermal conductivity of about 420 W/m·K.

For example, copper has a thermal conductivity of about 398 W/m·K.

For example, platinum has a thermal conductivity of about 70 W/m·K.

For example, iron has a thermal conductivity of about 84 W/m·K.

For example, aluminum has a thermal conductivity of about 236 W/m·K.

For example, molybdenum has a thermal conductivity of about 139 W/m·K.

For example, titanium has a thermal conductivity of about 21.9 W/m·K.

For example, tungsten has a thermal conductivity of about 177 W/m·K.

Materials having particularly high thermal conductivity are gold, silver, copper, and aluminum.

An increase in thermal conductivity results in excellent heat dissipation properties; therefore, it is particularly preferable to use a substance with a thermal conductivity of 150 W/m·K or more.

A metal alloy film, a silver alloy film, a copper alloy film, and an aluminum alloy film also have a thermal conductivity of 150 W/m·K or more.

The conductive layer 604 may have a single-layer structure or a multi-layer structure.

In the case where the conductive layer 604 has a multi-layer structure, at least one of the layers needs to have heat dissipation properties.

In the case where the conductive layer 604 is used as a layer having heat dissipation properties, the conductive layer 604 preferably has a large area.

Also in the case where the conductive layer 604 is used as a layer having heat dissipation properties, the insulating layer 500 is preferably formed using a material having high thermal conductivity so that the heat dissipation effect increases.

The insulating layer 500 may be, but is not limited to, a film including silicon nitride, a film including aluminum oxide, a film including diamond like carbon, a film including aluminum nitride, or the like.

For example, silicon nitride has a thermal conductivity of about 20 W/m·K.

For example, aluminum oxide has a thermal conductivity of about 23 W/m·K.

Aluminum oxide blocks $H_2O$ effectively.

For example, diamond like carbon has a thermal conductivity of about 400 W/m·K to about 1800 W/m·K.

For example, aluminum nitride has a thermal conductivity of about 170 W/m·K to about 200 W/m·K.

An increase in thermal conductivity results in excellent heat dissipation properties; therefore, it is particularly preferable to use a substance with a thermal conductivity of 150 W/m·K or more.

The insulating layer 500 may have a single-layer structure or a multi-layer structure.

In the case where the insulating layer 500 has a multi-layer structure, at least one of the layers needs to have heat dissipation properties.

As reference, acrylic has a thermal conductivity of about 0.2 W/m·K.

As reference, epoxy has a thermal conductivity of about 0.21 W/m·K.

As reference, silicon oxide has a thermal conductivity of about 8 W/m·K.

Figure 36:
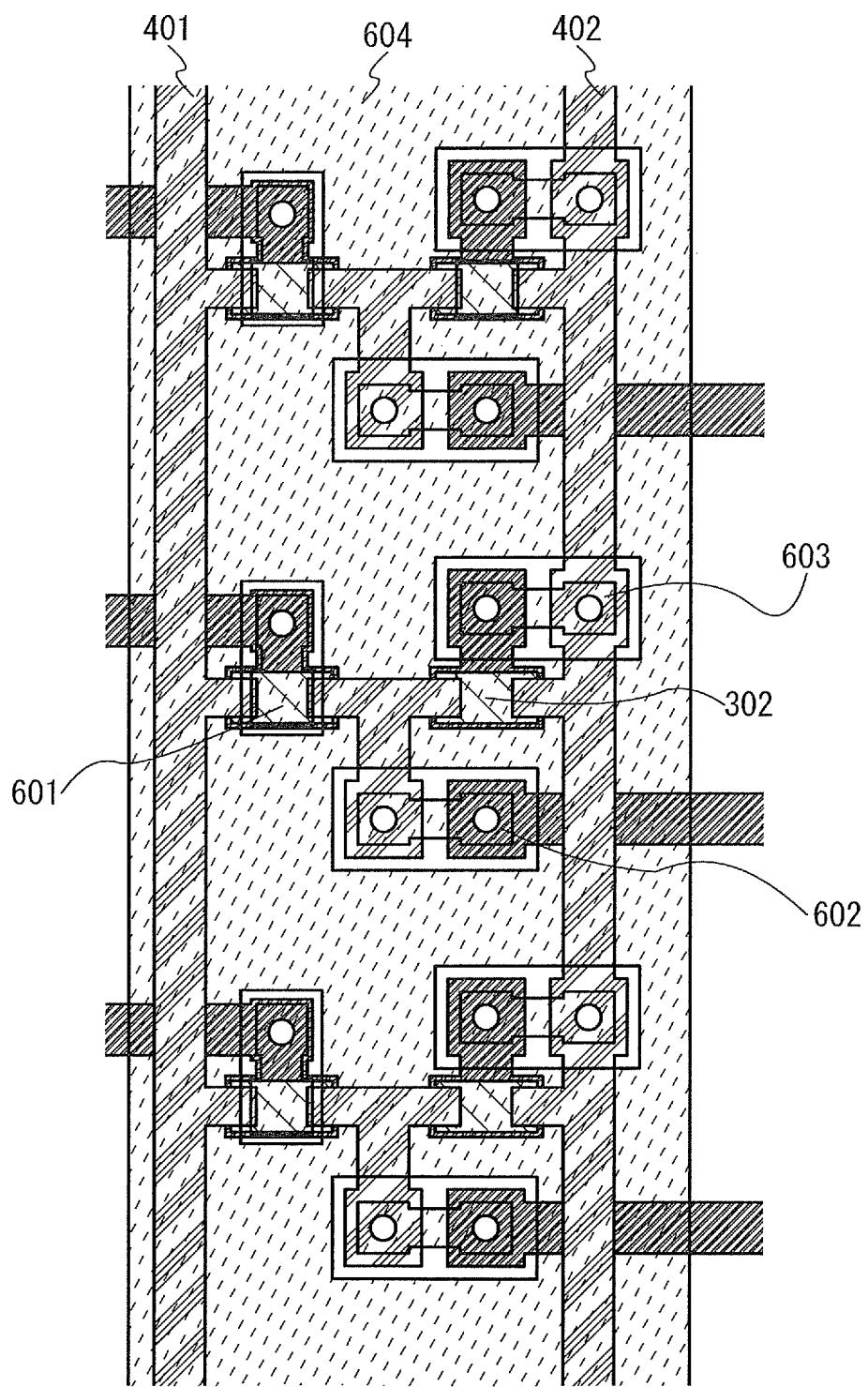
FIG. 36 illustrates an example of a semiconductor device.

FIG. 36 illustrates an example in which the conductive layer 604 overlaps with the entire circuit.

A semiconductor layer is more likely to generate heat than a conductive layer.

Accordingly, the conductive layer 604 is preferably arranged to overlap with at least the semiconductor layer.

The conductive layer 604 with a larger area has superior heat dissipation effect.

On the other hand, when the conductive layer 604 overlaps with another conductive layer, parasitic capacitance becomes a problem.

It is thus preferable that the conductive layer 604 be provided so as not to overlap with other conductive layers.

In FIG. 36, the conductive layer 604 includes a plurality of openings.

The conductive layer 601 is provided inside the openings of the conductive layer 604, so that a short circuit between the conductive layer 601 and the conductive layer 604 is prevented.

The conductive layer 602 is provided inside the opening of the conductive layer 604, so that a short circuit between the conductive layer 602 and the conductive layer 604 is prevented.

The conductive layer 603 is provided inside the opening of the conductive layer 604, so that a short circuit between the conductive layer 603 and the conductive layer 604 is prevented.

At least part of the structure shown in this embodiment can be combined with at least part of the structures shown in the other embodiments, as appropriate.

(Embodiment 21)

In FIG. 36, the conductive layer 604 includes an area overlapping with the conductive layer 401.

Thus, in FIG. 36, the parasitic capacitance between the conductive layer 604 and the conductive layer 401 becomes a problem in some cases.

In FIG. 36, the conductive layer 604 includes an area overlapping with the conductive layer 402.

Thus, in FIG. 36, the parasitic capacitance between the conductive layer 604 and the conductive layer 402 becomes a problem in some cases.

On the other hand, in order to block the entry of $H_2O$ more effectively, a large area of the conductive layer 604 preferably overlaps with the semiconductor layer 302.

Figure 37:
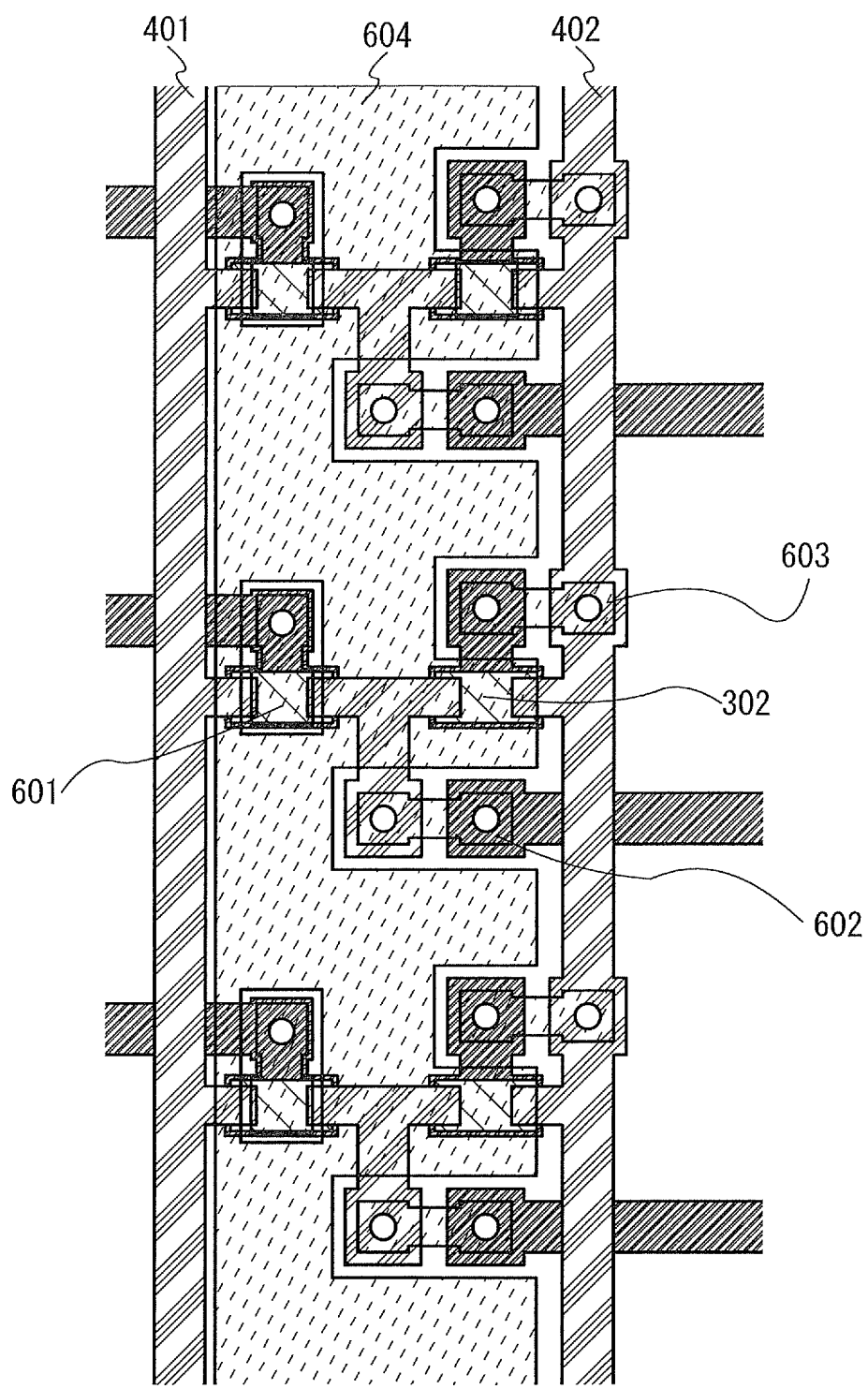
FIG. 37 illustrates an example of a semiconductor device.

Therefore, the area where the conductive layer 604 overlaps with the semiconductor layer 302 is preferably larger than the area where the conductive layer 604 overlaps with the conductive layer 401 as illustrated in FIG. 37.

Further, the area where the conductive layer 604 overlaps with the semiconductor layer 302 is preferably larger than the area where the conductive layer 604 overlaps with the conductive layer 402 as illustrated in FIG. 37.

It is said that the conductive layers 401 and 402 each include a first area (a wiring portion) having a longitudinal direction and a plurality of second areas (projection portions) adjacent to the first area.

It is also said that in FIG. 37, the conductive layer 604 is located between the first area of the conductive layer 401 and the first area (the wiring portion) of the conductive layer 402.

At least part of the plurality of second regions (the projection portions) serves as a source electrode or a drain electrode of a transistor.

The first area is larger than the second area.

At least part of the structure shown in this embodiment can be combined with at least part of the structures shown in the other embodiments, as appropriate.

(Embodiment 22)

When the conductive layer 604 is electrically connected to one of the conductive layers 401 and 402, the conductive layer 604 can be used as an auxiliary wiring.

Figure 38:
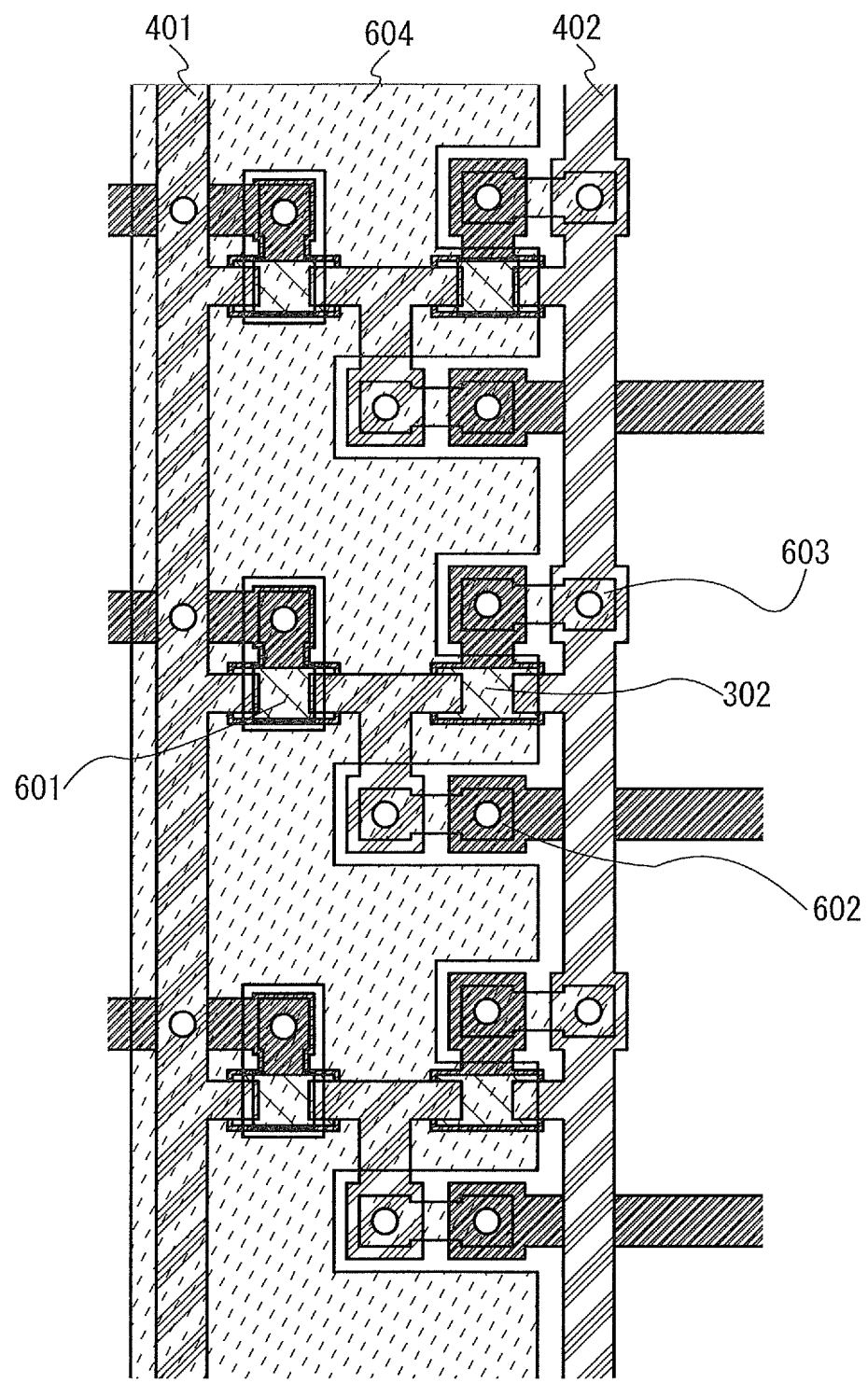
FIG. 38 illustrates an example of a semiconductor device.

FIG. 38 illustrates an example in which the conductive layer 604 is electrically connected to the conductive layer 401 through a plurality of openings included in the insulating layer 500.

Figure 39:
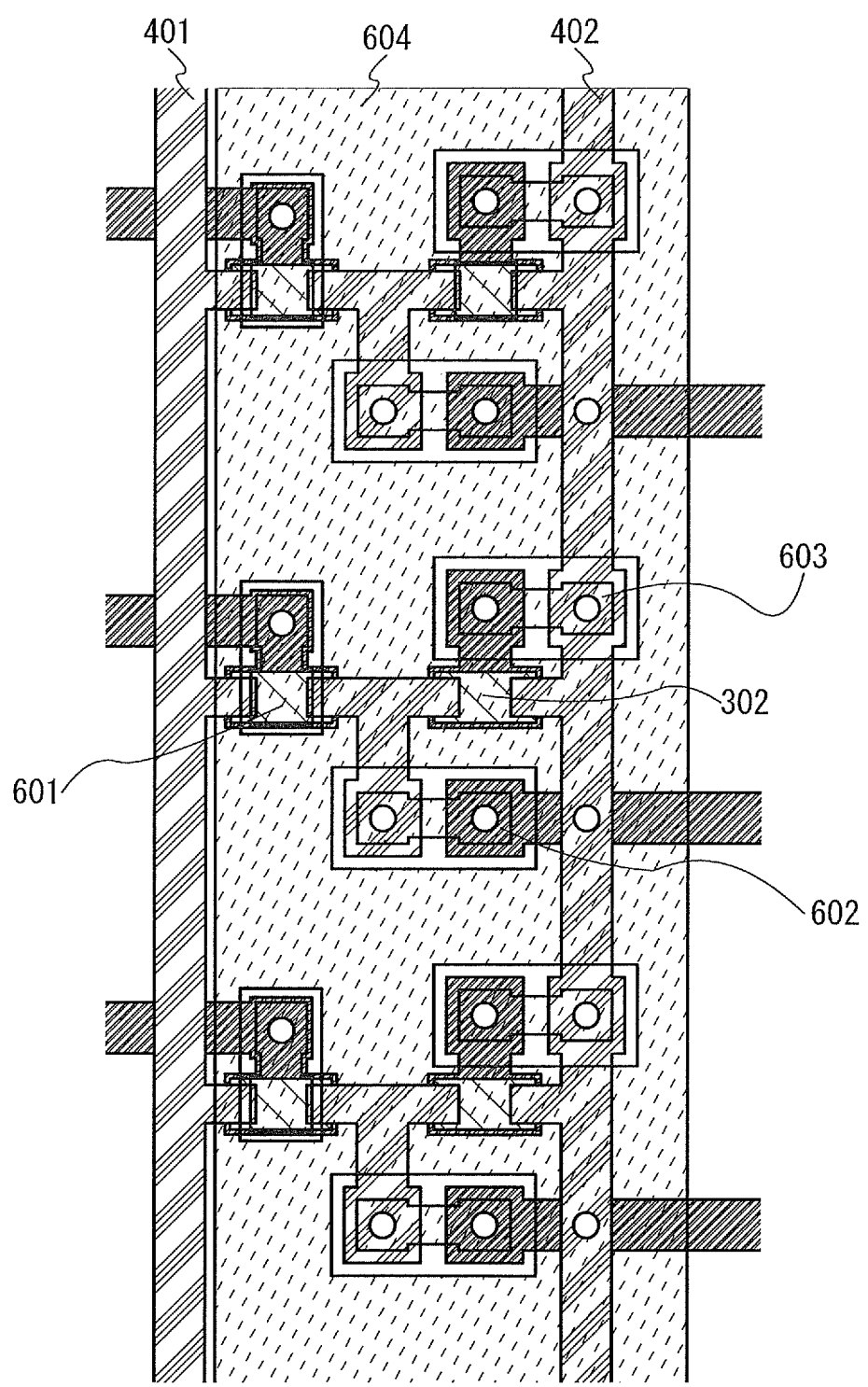
FIG. 39 illustrates an example of a semiconductor device.

FIG. 39 illustrates an example in which the conductive layer 604 is electrically connected to the conductive layer 402 through a plurality of openings included in the insulating layer 500.

In FIG. 38 or FIG. 39, the plurality of openings are provided at the intersections of the wirings.

In the case where the conductive layer 604 includes an area overlapping with the semiconductor layer 302, in order to prevent the transistor Tr2 from being normally on, it is preferable that the conductive layer 604 be electrically connected to a conductive layer with a low potential when the transistor Tr2 is an N-type transistor.

In the case where the conductive layer 604 includes an area overlapping with the semiconductor layer 302, in order to prevent the transistor Tr2 from being normally on, it is preferable that the conductive layer 604 be electrically connected to a conductive layer with a high potential when the transistor Tr2 is a P-type transistor.

At least part of the structure shown in this embodiment can be combined with at least part of the structures shown in the other embodiments, as appropriate.

(Embodiment 23)

Figure 40:
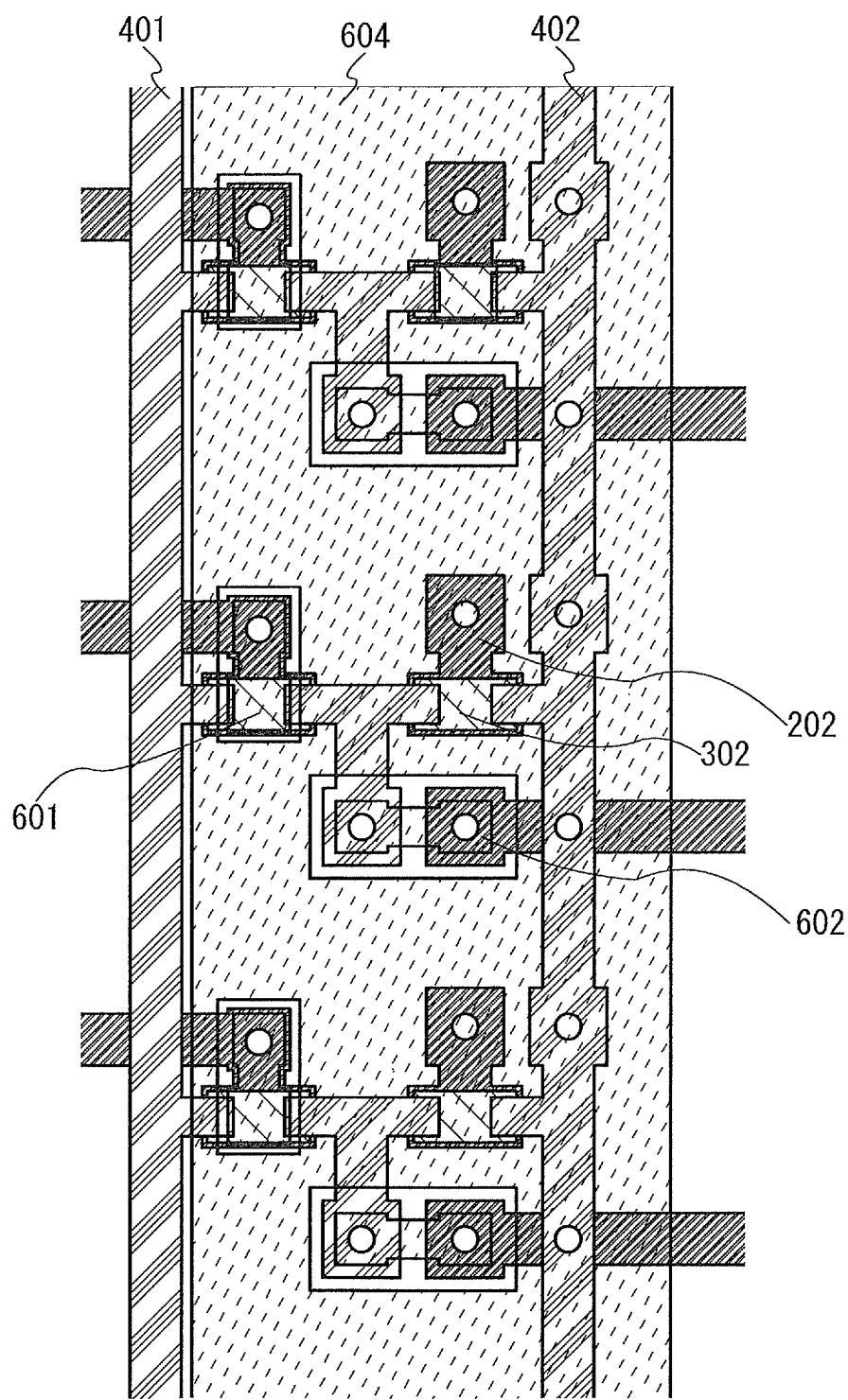
FIG. 40 illustrates an example of a semiconductor device.

FIG. 40 illustrates an example in which the conductive layers 603 and 604 in FIG. 39 are joined together so as to be a single conductive layer.

The circuit operates normally even when the conductive layers 603 and 604 are joined together so as to be a single conductive layer.

In the case where the conductive layer 604 is used as a layer having heat dissipation properties, the above structure is preferable because the heat dissipation effect of the conductive layer 604 increases with an increase in the area of the conductive layer 604.

In the case where the conductive layer 604 is used as an auxiliary wiring, the resistance of the conductive layer 604 can be reduced with an increase in the area of the conductive layer 604.

At least part of the structure shown in this embodiment can be combined with at least part of the structures shown in the other embodiments, as appropriate.

(Embodiment 24)

In the case where the transistor Tr1 is a single-gate transistor, the conductive layer 601 is not necessary.

Figure 41:
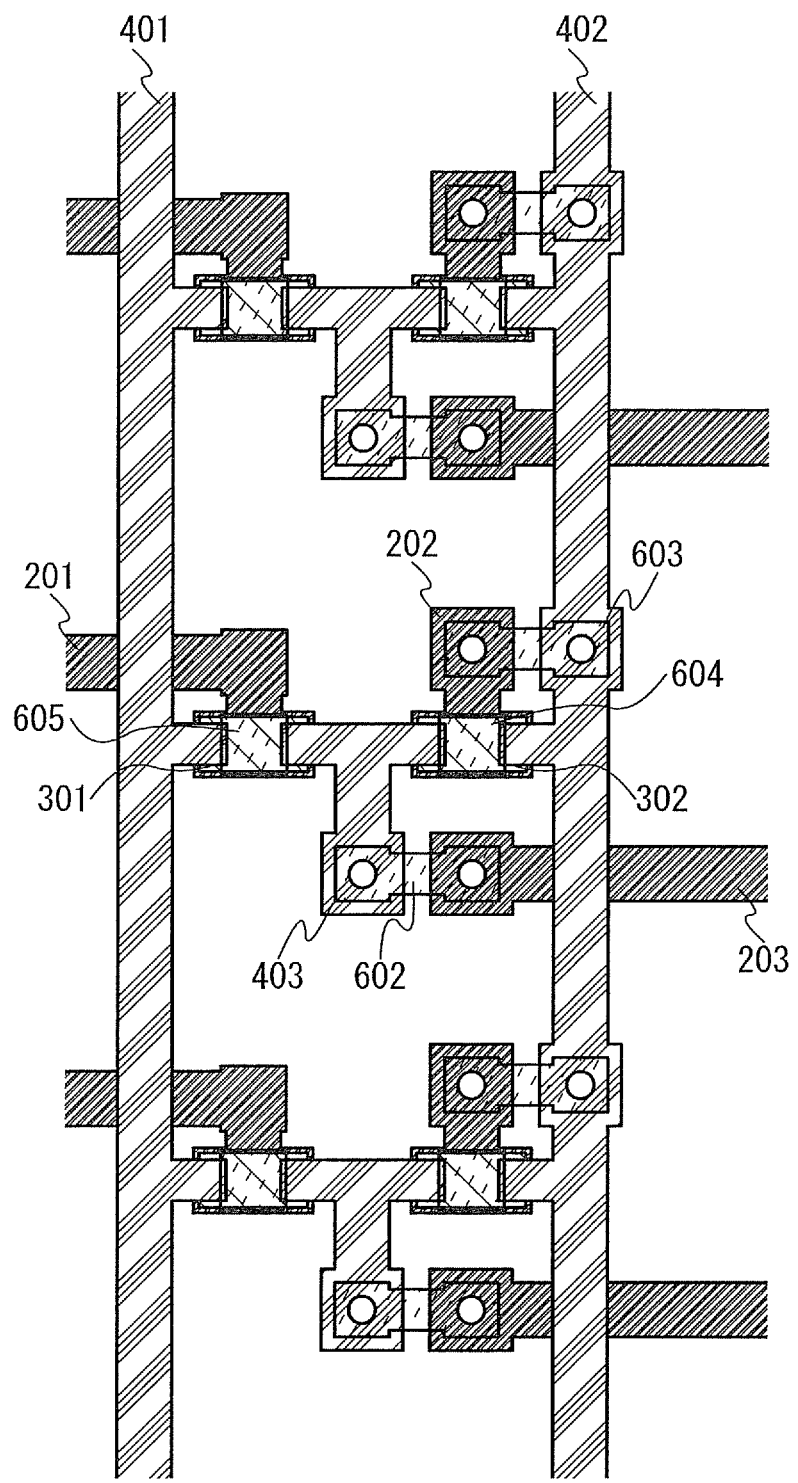
FIG. 41 illustrates an example of a semiconductor device.

Thus, as illustrated in FIG. 41, a conductive layer 605 is preferably provided instead of the conductive layer 601.

In the case where the semiconductor layer 301 is an oxide semiconductor layer, the conductive layer 605 prevents the entry of $H_2O$ into the semiconductor layer 301.

The conductive layer 605 is in a floating state in this embodiment.

The floating state refers to, for example, a state where the conductive layer 605 is not in contact with other conductive layers.

The conductive layer 605 is not in contact with the conductive layer 201.

The conductive layer 605 is electrically isolated from the conductive layer 201.

The conductive layer 605 is not in contact with the conductive layer 202.

The conductive layer 605 is electrically isolated from the conductive layer 202.

The conductive layer 605 is not in contact with the conductive layer 401.

The conductive layer 605 is electrically isolated from the conductive layer 401.

The conductive layer 605 is not in contact with the conductive layer 402.

The conductive layer 605 is electrically isolated from the conductive layer 402.

The conductive layer 605 is not in contact with the conductive layer 403.

The conductive layer 605 is electrically isolated from the conductive layer 403.

In the case where the conductive layer 605 is not in a floating state, the conductive layer 605 may be electrically connected to another conductive layer.

In that case, when the conductive layer 605 is formed into an island shape, it is possible to reduce the parasitic capacitance between the conductive layer 605 and the other conductive layer.

On the other hand, in order to block the entry of $H_2O$ more effectively, a large area of the conductive layer 605 preferably overlaps with the semiconductor layer 301.

For example, the area where the conductive layer 605 overlaps with the semiconductor layer 301 is preferably larger than the area where the conductive layer 605 overlaps with the conductive layer 401.

For example, the area where the conductive layer 605 overlaps with the semiconductor layer 301 is preferably larger than the area where the conductive layer 605 overlaps with the conductive layer 402.

For example, the area where the conductive layer 605 overlaps with the semiconductor layer 301 is preferably larger than the area where the conductive layer 605 overlaps with the conductive layer 403.

In this embodiment, the area where the conductive layer 605 overlaps with the conductive layer 402 is 0.

The conductive layer 605 can be formed in the same process as the conductive layer 604.

At least part of the structure shown in this embodiment can be combined with at least part of the structures shown in the other embodiments, as appropriate.

Embodiment 25)

The conductive layers 604 and 605 in FIG. 41 may be joined together so as to be a single conductive layer.

Figure 42:
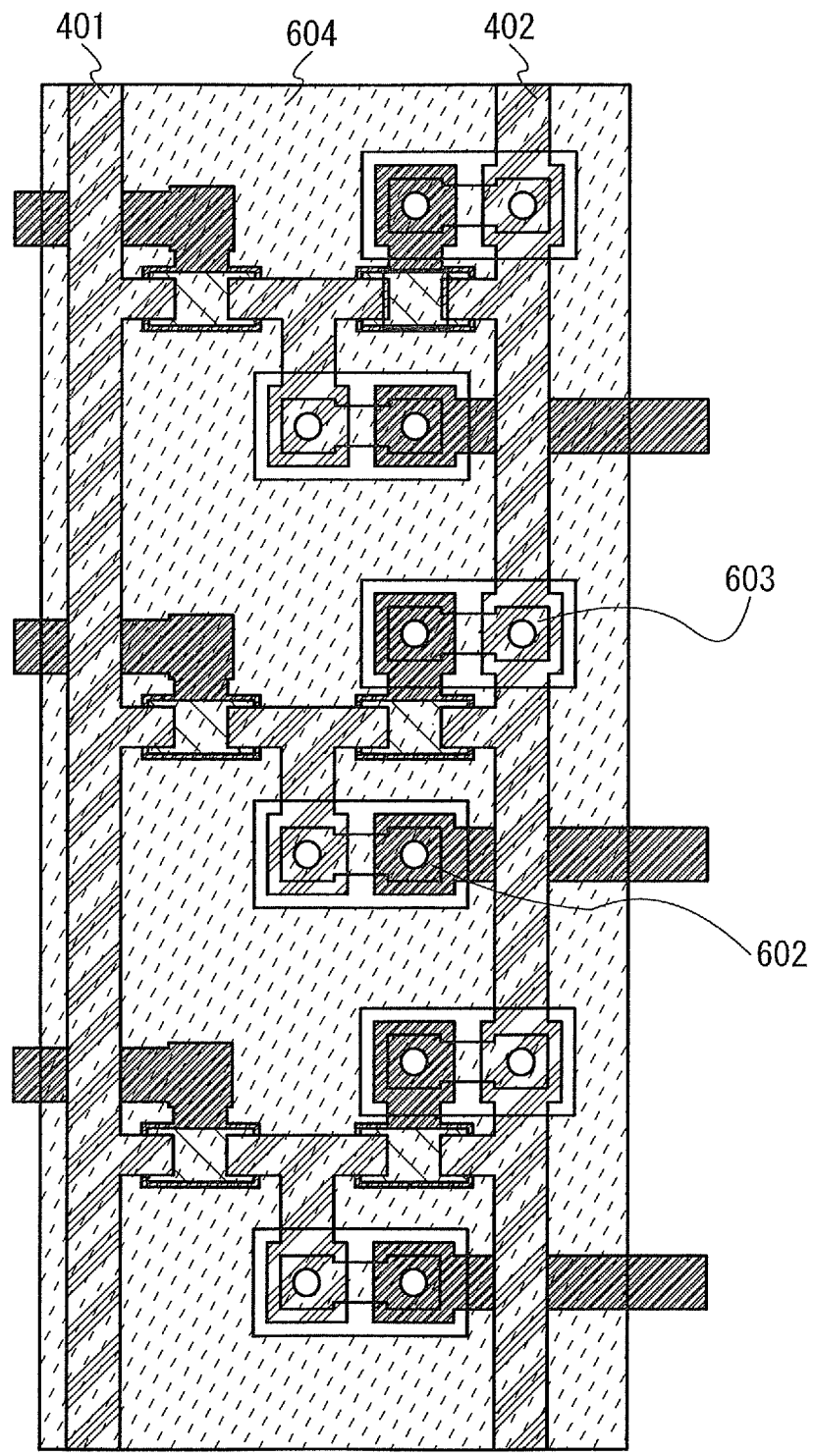
FIG. 42 illustrates an example of a semiconductor device.

For example, the conductive layer 604 may overlap with the entire circuit as illustrated in FIG. 42.

The conductive layer 604 includes a plurality of openings so as to prevent a short circuit between the conductive layer 604 and the conductive layer 602 or 603.

At least part of the structure shown in this embodiment can be combined with at least part of the structures shown in the other embodiments, as appropriate.

(Embodiment 26)

The resistor R in FIG. 13 may be either a fixed resistor or a variable resistor.

Examples of the viable resistor include a transistor.

Figure 43:
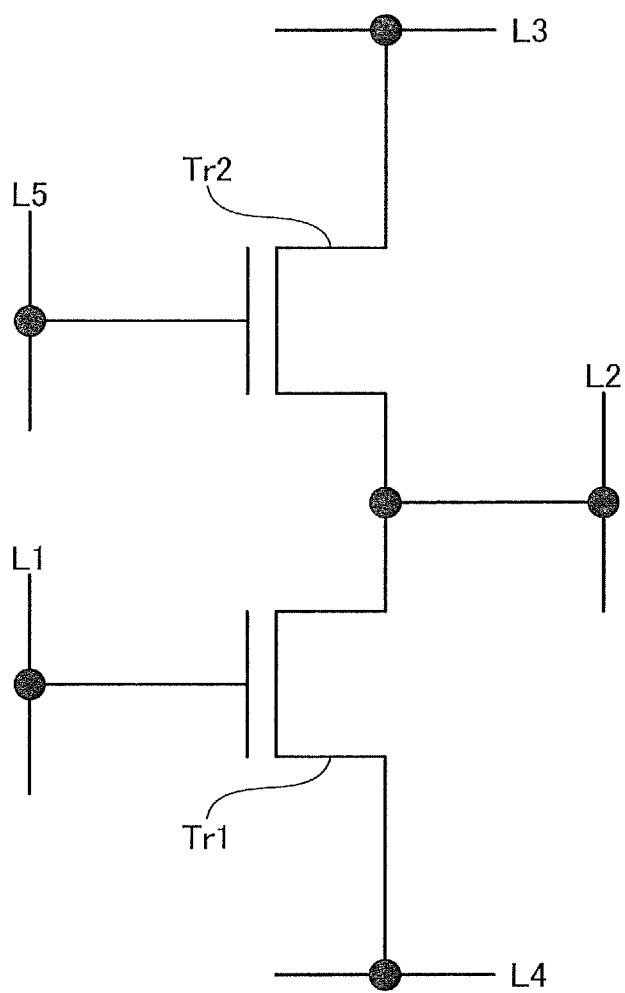
FIG. 43 illustrates an example of a semiconductor device.

For example, a transistor Tr2 is used as the resistor R as illustrated in FIG. 43 and a third potential of a wiring L5 is adjusted, so that the resistance is controlled.

The wiring L5 is electrically connected to a gate of the transistor Tr2.

At least part of the wiring L5 has a function of transmitting a signal, a voltage, or a current.

The transistor Tr2 may be either a normally-off transistor or a normally-on transistor.

For stable circuit operation, the transistor Tr1 preferably has low off-current.

A transistor including an oxide semiconductor layer has lower off-current than a transistor including a silicon layer.

Therefore, the transistor Tr1 preferably includes an oxide semiconductor layer.

On the other hand, for example, in order to make the transistor Tr2 a normally-off transistor, the threshold voltage of the transistor Tr2 needs to be controlled.

The threshold voltage of a transistor including a silicon layer is easier to control than that of a transistor including an oxide semiconductor layer.

Specifically, the threshold voltage can be controlled by adding a donor element or an acceptor element to a silicon layer.

The threshold voltage can be controlled precisely by employing an ion doping method or an ion implantation method for the addition of a donor element or an acceptor element.

Hence, the transistor Tr2 preferably includes a silicon layer.

It is thus preferable that the transistor Tr1 include an oxide semiconductor layer and the transistor Tr2 include a silicon layer.

Note that the number of manufacturing steps can be reduced by using the same material for the semiconductor layers of the transistors Tr1 and Tr2; hence, the semiconductor material of the transistors Tr1 and Tr2 may be selected as appropriate.

At least part of the structure shown in this embodiment can be combined with at least part of the structures shown in the other embodiments, as appropriate.

(Embodiment 27)

The novel cross-sectional structures shown in the other embodiments will be summarized.

Figure 44A:
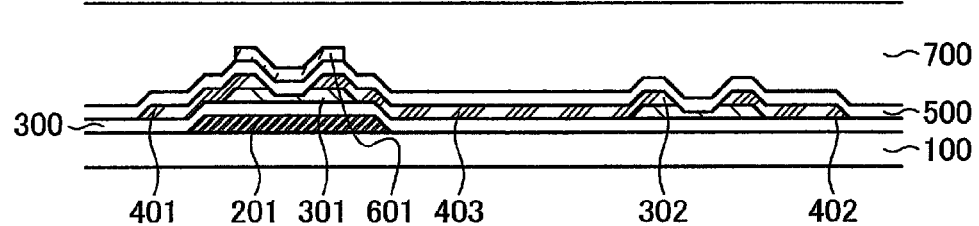
FIGS. 44A to 44D each illustrate an example of a semiconductor device.

First, description is made on FIG. 44A.

The substrate 100 has an insulating surface.

The conductive layer 201 is over the insulating surface.

The insulating layer 300 is over the conductive layer 201.

The semiconductor layer 301 is over the insulating layer 300.

The semiconductor layer 302 is over the insulating layer 300.

The semiconductor layer 301 includes an area overlapping with the conductive layer 201.

The conductive layer 201 includes an area overlapping with a channel formation region of the transistor Tr1.

The conductive layer 401 is over the semiconductor layer 301.

The conductive layer 402 is over the semiconductor layer 302.

The conductive layer 403 is over the semiconductor layers 301 and 302.

The insulating layer 500 is over the conductive layers 401, 402, and 403.

The conductive layer 601 is over the insulating layer 500.

The conductive layer 601 includes an area overlapping with the semiconductor layer 301.

The conductive layer 601 includes an area overlapping with the channel formation region of the transistor Tr1.

The insulating layer 700 is over the conductive layer 601.

The insulating layer 700 is not necessarily provided.

Figure 44B:
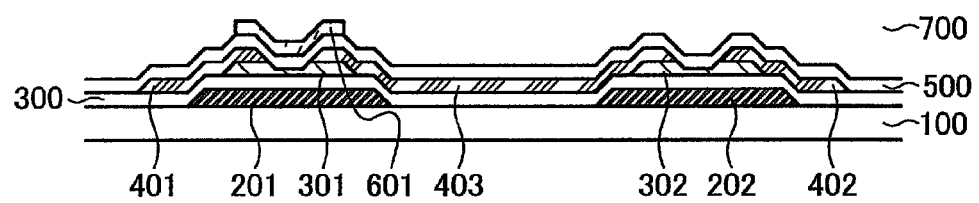

FIG. 44B illustrates an example in which the conductive layer 202 is added to the structure of FIG. 44A.

The conductive layer 202 can be formed in the same process as the conductive layer 201.

The conductive layer 202 includes the same material as the conductive layer 201.

The semiconductor layer 302 includes an area overlapping with the conductive layer 202.

The conductive layer 202 includes an area overlapping with a channel formation region of the transistor Tr2.

Figure 44C:
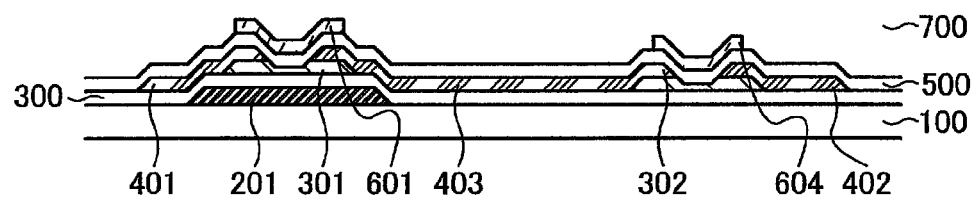

FIG. 44C illustrates an example in which the conductive layer 604 is added to the structure of FIG. 44A.

Figure 44D:
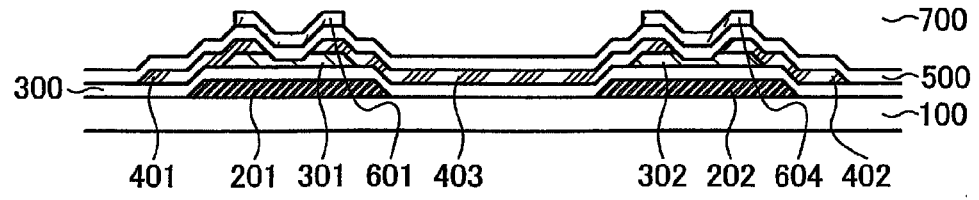

FIG. 44D illustrates an example in which the conductive layer 604 is added to the structure of FIG. 44B.

The conductive layer 604 can be formed in the same process as the conductive layer 601.

The conductive layer 604 includes the same material as the conductive layer 601.

The semiconductor layer 302 includes an area overlapping with the conductive layer 604.

The conductive layer 604 includes an area overlapping with the channel formation region of the transistor Tr2.

This embodiment can be applied to circuits other than the inverter circuit and the buffer circuit.

At least part of the structure shown in this embodiment can be combined with at least part of the structures shown in the other embodiments, as appropriate.

(Embodiment 28)

The semiconductor layers 301 and 302 may be joined together so as to be a single semiconductor layer.

Figure 45A:
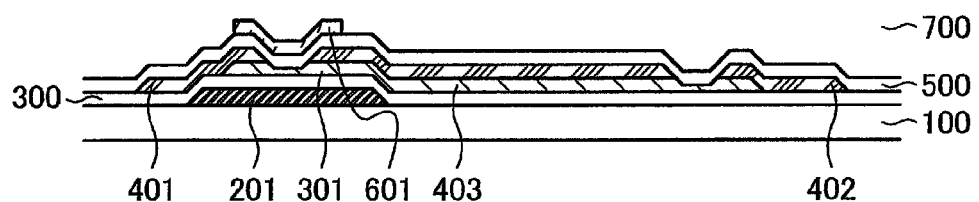
FIGS. 45A to 45D each illustrate an example of a semiconductor device.

FIG. 45A illustrates an example in which the semiconductor layers 301 and 302 in FIG. 44A are joined together.

Figure 45B:
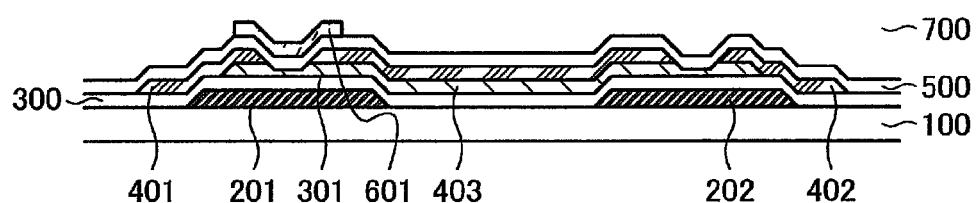

FIG. 45B illustrates an example in which the semiconductor layers 301 and 302 in FIG. 44B are joined together.

Figure 45C:
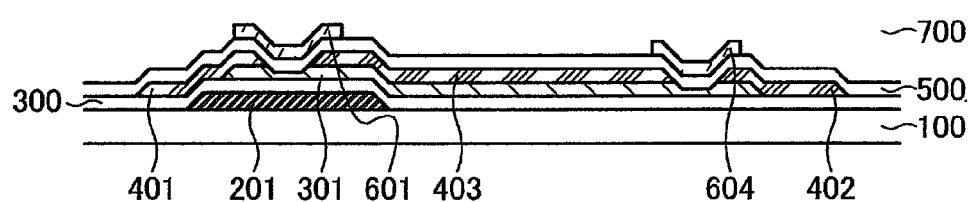

FIG. 45C illustrates an example in which the semiconductor layers 301 and 302 in FIG. 44C are joined together.

Figure 45D:
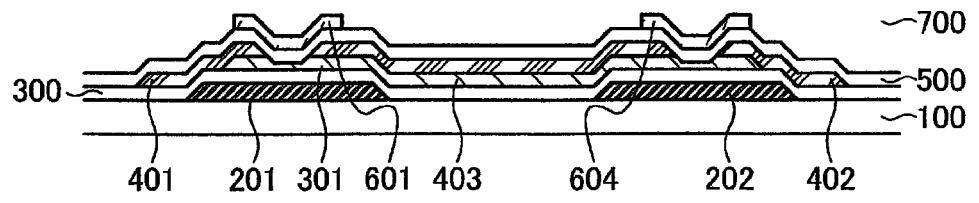

FIG. 45D illustrates an example in which the semiconductor layers 301 and 302 in FIG. 44D are joined together.

First, description is made on FIG. 45A.

The substrate 100 has an insulating surface.

The conductive layer 201 is over the insulating surface.

The insulating layer 300 is over the conductive layer 201.

The semiconductor layer 301 is over the insulating layer 300.

The semiconductor layer 301 includes an area overlapping with the conductive layer 201.

The conductive layer 201 includes an area overlapping with a channel formation region of the transistor Tr1.

The conductive layer 401 is over the semiconductor layer 301.

The conductive layer 402 is over the semiconductor layer 301.

The conductive layer 403 is over the semiconductor layer 301.

The insulating layer 500 is over the conductive layers 401, 402, and 403.

The conductive layer 601 is over the insulating layer 500.

The conductive layer 601 includes an area overlapping with the semiconductor layer 301.

The conductive layer 601 includes an area overlapping with the channel formation region of the transistor Tr1.

The insulating layer 700 is over the conductive layer 601.

The insulating layer 700 is not necessarily provided.

FIG. 45B illustrates an example in which the conductive layer 202 is added to the structure of FIG. 45A.

The conductive layer 202 can be formed in the same process as the conductive layer 201.

The conductive layer 202 includes the same material as the conductive layer 201.

The semiconductor layer 301 includes an area overlapping with the conductive layer 202.

The conductive layer 201 includes an area overlapping with a channel formation region of the transistor Tr2.

FIG. 45C illustrates an example in which the conductive layer 604 is added to the structure of FIG. 45A.

FIG. 45D illustrates an example in which the conductive layer 604 is added to the structure of FIG. 45B.

The conductive layer 604 can be formed in the same process as the conductive layer 601.

The conductive layer 604 includes the same material as the conductive layer 601.

The semiconductor layer 301 includes an area overlapping with the conductive layer 604.

The conductive layer 604 includes an area overlapping with the channel formation region of the transistor Tr2.

The conductive layer 403 is located between the conductive layer 401 and the conductive layer 402.

The semiconductor layer 301 includes a first area overlapping with the conductive layer 401.

The semiconductor layer 301 includes a second area overlapping with the conductive layer 402.

The semiconductor layer 301 includes a third area overlapping with the conductive layer 403.

The semiconductor layer 301 includes a fourth area between the first area and the third area.

The semiconductor layer 301 includes a fifth area between the second area and the third area.

The channel formation region of the transistor Tr1 includes at least the fourth area.

The channel formation region of the transistor Tr2 includes at least the fifth area.

A resistive element of the resistor R includes at least the fifth area.

This embodiment can be applied to circuits other than the inverter circuit and the buffer circuit.

At least part of the structure shown in this embodiment can be combined with at least part of the structures shown in the other embodiments, as appropriate.

(Embodiment 29)

In FIGS. 22 to 27, the wiring S is electrically connected to one of a source and a drain of a transistor in an element region.

The wiring S may be electrically connected to the output terminal of the inverter circuit or the buffer circuit (the wiring L2).

That is, the inverter circuit or the buffer circuit may be used for part of a source driver.

Figure 46A:
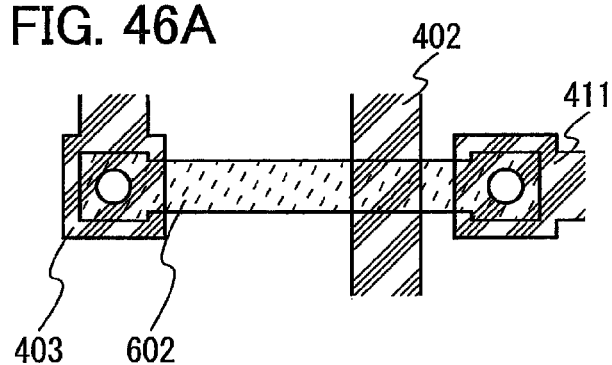
FIGS. 46A to 46C each illustrate an example of a semiconductor device.
Figure 46B:
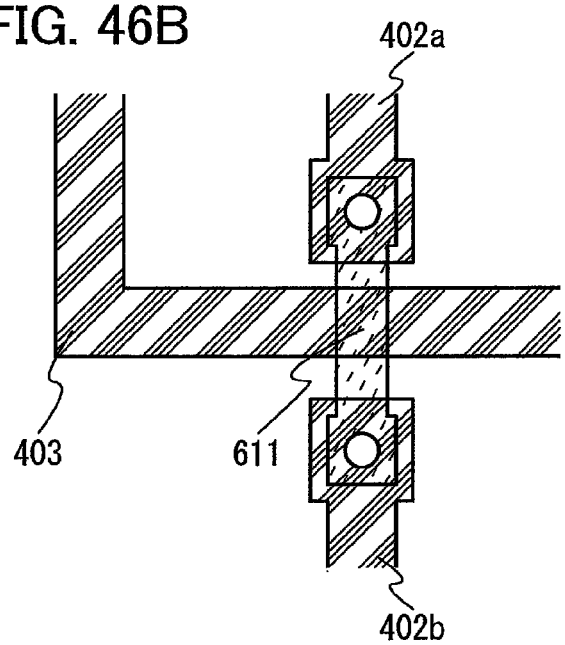
Figure 46C:
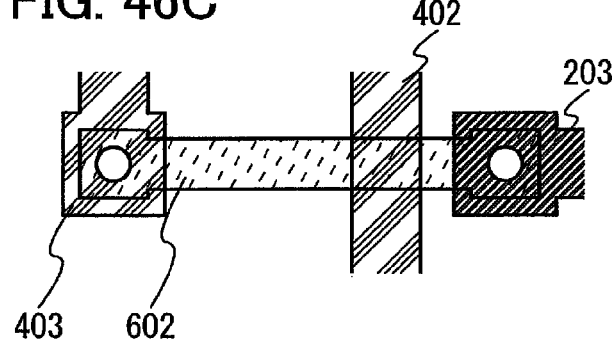

FIGS. 46A to 46C illustrate examples of the wiring structure in which the wiring S is electrically connected to the output terminal of the inverter circuit or the buffer circuit (the wiring L2).

In that case, the wiring L2 corresponds to the wiring S.

For example, FIG. 46A includes a conductive layer 411.

The conductive layer 411 can be formed in the same process as the conductive layers 402 and 403.

At least part of the conductive layer 411 serves as, for example, the wiring L2.

The conductive layer 602 is electrically connected to the conductive layer 403.

The conductive layer 602 is electrically connected to the conductive layer 411.

The conductive layer 602 intersects with the conductive layer 402.

The conductive layer 602 can be formed in the same process as one electrode of an element.

For example, FIG. 46B illustrates an example in which the conductive layer 402 is divided into a plurality of island-like conductive layers.

The plurality of island-like conductive layers include, for example, a conductive layer 402a and a conductive layer 402b.

FIG. 46B includes a conductive layer 611 formed in the same process as one electrode of an element.

The conductive layer 611 is electrically connected to the conductive layer 402a.

The conductive layer 611 is electrically connected to the conductive layer 402b.

The conductive layer 611 intersects with the conductive layer 403.

At least part of the conductive layer 402a serves as, for example, the wiring L4.

At least part of the conductive layer 402a serves as, for example, the other of the source electrode and the drain electrode of the transistor Tr2.

At least part of the conductive layer 402b serves as, for example, the wiring L4.

At least part of the conductive layer 403 serves as, for example, the wiring L2.

At least part of the conductive layer 611 serves as, for example, the wiring L4.

FIG. 46C illustrates an example of the wiring structure in which an inverter circuit or a buffer circuit is used for part of a gate driver.

FIG. 46C illustrates an example in which the conductive layer 402 does not intersect with the conductive layer 203, but intersects with the conductive layer 602.

As described above, it is possible to make an effective use of the conductive layer formed in the same process as one electrode of the element.

At least part of the structure shown in this embodiment can be combined with at least part of the structures shown in the other embodiments, as appropriate.

(Embodiment 30)

Examples of the substrate include, but are not limited to, a glass substrate, a quartz substrate, a metal substrate, a semiconductor substrate, and a resin substrate (a plastic substrate).

A base insulating film may be formed over the substrate.

The substrate preferably includes an insulating surface.

A glass substrate, a quartz substrate, a resin substrate, and the like include an insulating surface.

A metal substrate, a semiconductor substrate, and the like do not include an insulating surface, and accordingly may be provided with a base insulating film so as to have an insulating surface.

The substrate may have flexibility.

A glass substrate reduced in thickness has flexibility.

A resin substrate has flexibility.

An insulating layer may be formed of any material having insulating properties.

The insulating layer may have either a single-layer structure or a multi-layer structure.

Examples of the insulating layer include, but are not limited to, an insulating layer containing an inorganic substance, and an insulating layer containing an organic substance.

Examples of the insulating layer containing an inorganic substance include, but are not limited to, a film containing silicon oxide, a film containing silicon nitride, a film containing aluminum nitride, a film containing aluminum oxide, and a film containing hafnium oxide.

Examples of the insulating layer containing an organic substance include, but are not limited to, a film containing polyimide, a film containing acrylic, a film containing siloxane, and a film containing epoxy.

The insulating layer serving as a gate insulating film preferably contains an inorganic substance.

A conductive layer may be formed of any material having conductive properties.

The conductive layer may have either a single-layer structure or a multi-layer structure.

Examples of the conductive layer include, but are not limited to, a film containing a metal, and a film containing a transparent conductor.

Examples of the metal include, but are not limited to, aluminum, titanium, molybdenum, tungsten, chromium, gold, silver, copper, alkali metal, and alkaline earth metal.

Examples of the transparent conductor include, but are not limited to, indium tin oxide and indium zinc oxide.

The metal has light-blocking properties or light-reflective properties.

The transparent conductor has light-transmitting properties.

In the case where one electrode of an element has light-transmitting properties, light can be extracted from the one electrode of the element.

In the case where the other electrode of the element has light-transmitting properties, light can be extracted from the other electrode of the element.

A semiconductor layer may be formed of any material having semiconductor properties.

The semiconductor layer may have either a single-layer structure or a multi-layer structure.

Examples of the semiconductor layer include, but are not limited to, an oxide semiconductor layer and a semiconductor layer other than the oxide semiconductor layer.

Examples of the semiconductor layer other than the oxide semiconductor layer include, but are not limited to, a layer containing silicon and an organic semiconductor layer.

Examples of the layer containing silicon include, but are not limited to, a silicon film, a silicon germanium film, and a silicon carbide film.

A silicon film including an impurity may be provided between the layer containing silicon and a source electrode.

A silicon film including an impurity may be provided between the layer containing silicon and a drain electrode.

Examples of the impurity include a donor element and an acceptor element.

Examples of the donor element in a silicon film include, but are not limited to, phosphorus.

Examples of the acceptor element in a silicon film include, but are not limited to, boron.

An N-type transistor can be fabricated with use of a silicon film including a donor element.

A P-type transistor can be fabricated with use of a silicon film including an acceptor element.

The oxide semiconductor layer is a film containing an oxide semiconductor material.

The oxide semiconductor layer may be any film containing a metal and oxygen.

For example, a film containing indium and oxygen, a film containing zinc and oxygen, or a film containing tin and oxygen can be used as the oxide semiconductor layer.

Examples of the oxide semiconductor layer include, but are not limited to, an indium oxide film, a tin oxide film, and a zinc oxide film.

Examples of the oxide semiconductor layer include, but are not limited to, an In—Zn-based oxide film, a Sn—Zn-based oxide film, an Al—Zn-based oxide film, a Zn—Mg-based oxide film, a Sn—Mg-based oxide film, an In—Mg-based oxide film, and an In—Ga-based oxide film.

The term "A-B-based oxide film" (A and B are elements) refers to a film containing A, B, and oxygen.

Examples of the oxide semiconductor layer include, but are not limited to, an In—Ga—Zn-based oxide film, an In—Sn—Zn-based oxide film, a Sn—Ga—Zn-based oxide film, an In—Al—Zn-based oxide film, an In—Hf—Zn-based oxide film, an In—La—Zn-based oxide film, an In—Ce—Zn-based oxide film, an In—Pr—Zn-based oxide film, an In—Nd—Zn-based oxide film, an In—Sm—Zn-based oxide film, an In—Eu—Zn-based oxide film, an In—Gd—Zn-based oxide film, an In—Tb—Zn-based oxide film, an In—Dy—Zn-based oxide film, an In-Ho-Zn-based oxide film, an In—Er—Zn-based oxide film, an In—Tm—Zn-based oxide film, an In—Yb—Zn-based oxide film, an In—Lu—Zn-based oxide film, an Al—Ga—Zn-based oxide film, and a Sn—Al—Zn-based oxide film.

The term "A-B—C-based oxide film" (A, B, and C are elements) refers to a film containing A, B, C, and oxygen.

Examples of the oxide semiconductor layer include, but are not limited to, an In—Sn—Ga—Zn-based oxide film, an In—Hf—Ga—Zn-based oxide film, an In—Al—Ga—Zn-based oxide film, an In—Sn—Al—Zn-based oxide film, an In—Sn—Hf—Zn-based oxide film, and an In—Hf—Al—Zn-based oxide film.

The term "A-B-C-D-based oxide film" (A, B, C, and D are elements) refers to a film containing A, B, C, D, and oxygen.

As the oxide semiconductor layer, a film containing indium, gallium, zinc, and oxygen is particularly preferable.

An N-type transistor can be fabricated with use of an oxide semiconductor layer.

The oxide semiconductor layer preferably includes a crystal.

The crystal is preferably aligned so that the direction of its c-axis is perpendicular to a surface of the oxide semiconductor layer or the substrate.

The crystal whose c-axis is aligned perpendicular to the surface of the oxide semiconductor layer or the substrate is referred to as a c-axis aligned crystal (CAAC).

The angle between the c-axis of the crystal and the surface of the oxide semiconductor layer or the substrate is preferably 90°, but it may be greater than or equal to 80° and less than or equal to 100°.

The CAAC can be formed by the following first method, for example: the oxide semiconductor layer is formed by a sputtering method with a substrate temperature of 200° C. to 450° C.

In the first method, the CAAC is formed in the lower portion and the upper portion of the oxide semiconductor layer.

The CAAC can be formed by the following second method, for example: after the oxide semiconductor layer is formed, the oxide semiconductor layer is subjected to heat treatment at 650° C. or higher for 3 minutes or longer.

In the second method, the CAAC is formed at least in the upper portion of the oxide semiconductor layer (pattern A of the second method).

In the second method, by reducing the thickness of the oxide semiconductor layer, the CAAC can be formed in the lower portion and the upper portion of the oxide semiconductor layer (pattern B of the second method).

The CAAC can be formed by the following third method, for example: a second oxide semiconductor layer is formed over a first oxide semiconductor layer that is formed using the pattern B of the second method.

The method for forming the oxide semiconductor layer in the second method and the third method is not limited to a sputtering method.

By the first to the third methods, it is possible to form a crystal in which the angle between the c-axis and the surface of the oxide semiconductor layer or the substrate is greater than or equal to 80° and less than or equal to 100°.

By the first to the third methods, it is possible to form the CAAC at least in the upper portion (the surface) of the oxide semiconductor layer.

The layer containing an organic compound preferably includes at least a light-emitting layer.

Examples of the element include, but are not limited to, a display element (e.g., a liquid crystal element, a light-emitting element, or an electrophoretic element), a memory element, and a capacitor element.

The phrase "B is over A" means that at least part of B is positioned above A.

At least part of the structure shown in this embodiment can be combined with at least part of the structures shown in the other embodiments, as appropriate.

(Embodiment 31)

The semiconductor device is a device including an element having a semiconductor.

Examples of the element having a semiconductor include a transistor, a resistor, a capacitor, and a diode.

The transistor is preferably, but not limited to, a field-effect transistor.

The transistor is preferably, but not limited to, a thin film transistor.

The transistor may be formed using a silicon wafer, an SOI substrate, or the like.

Examples of the semiconductor device include, but are not limited to, a display device including a display element, a memory device including a memory element, an RFID, and a processor.

At least part of the structure shown in this embodiment can be combined with at least part of the structures shown in the other embodiments, as appropriate.

This application is based on Japanese Patent Application serial No. 2012-171818 filed with Japan Patent Office on Aug. 2, 2012, the entire contents of which are hereby incorporated by reference.

What is claimed is:

1. A semiconductor device comprising:
    a first conductive layer over an insulating surface;
    a first insulating layer over the first conductive layer;
    a semiconductor layer over the first insulating layer;
    a second conductive layer over the semiconductor layer;
    a third conductive layer over the semiconductor layer;
    a fourth conductive layer over the semiconductor layer;
    a second insulating layer over the second conductive layer, the third conductive layer, and the fourth conductive layer;
    a fifth conductive layer over the second insulating layer; and
    a sixth conductive layer over the second insulating layer,
    wherein the fourth conductive layer is between the second conductive layer and the third conductive layer,
    wherein the semiconductor layer includes a first area overlapping with the second conductive layer,
    wherein the semiconductor layer includes a second area overlapping with the third conductive layer,
    wherein the semiconductor layer includes a third area overlapping with the fourth conductive layer,
    wherein the semiconductor layer includes a fourth area between the first area and the third area,
    wherein the semiconductor layer includes a fifth area between the second area and the third area,
    wherein the first conductive layer includes an area overlapping with the fourth area,
    wherein the fifth conductive layer includes an area overlapping with the fourth area, and
    wherein the sixth conductive layer includes an area overlapping with the fifth area.

2. The semiconductor device according to claim 1, wherein the sixth conductive layer is in a floating state.

3. The semiconductor device according to claim 1,
    wherein the semiconductor device further comprises an element including a bottom electrode and a top electrode, and
    wherein the fifth conductive layer and the sixth conductive layer are formed of the same as the bottom electrode.

4. The semiconductor device according to claim 3, wherein the element is a liquid crystal element, a light-emitting element, an electrophoretic element, a memory element, or a capacitor element.

5. The semiconductor device according to claim 1,
    wherein the second conductive layer, the third conductive layer, and the fourth conductive layer are formed of the same material, and
    wherein the fifth conductive layer and the sixth conductive layer are formed of the same material.

6. The semiconductor device according to claim 1, wherein the fifth conductive layer is electrically connected to the first conductive layer.

7. The semiconductor device according to claim 1, wherein the first area includes a portion having smaller thickness than the second area.

8. A semiconductor device comprising:
    a first conductive layer over an insulating surface;
    a first insulating layer over the first conductive layer;
    a semiconductor layer over the first insulating layer, the semiconductor layer including a first area overlapping with the first conductive layer and a second area not overlapping with the first conductive layer;
    a second conductive layer partly overlapping with the first area;
    a third conductive layer partly overlapping with the second area;
    a fourth conductive layer over the semiconductor layer and between the second conductive layer and the third conductive layer;
    a second insulating layer over the second conductive layer, the third conductive layer, and the fourth conductive layer;
    a fifth conductive layer over the second insulating layer; and an element including a bottom electrode and a top electrode, the bottom electrode formed of the same as the fifth conductive layer.

9. The semiconductor device according to claim 8, wherein the semiconductor device further comprises a sixth conductive layer over the second insulating layer, the sixth conductive layer being in a floating state.

10. The semiconductor device according to claim 8, wherein the second conductive layer, the third conductive layer, and the fourth conductive layer are formed of the same material.

11. The semiconductor device according to claim 8, wherein the fifth conductive layer is electrically connected to the first conductive layer.

12. The semiconductor device according to claim 8, wherein the first area includes a portion having smaller thickness than the second area.

13. The semiconductor device according to claim 8, wherein the element is a liquid crystal element, a light-emitting element, an electrophoretic element, a memory element, or a capacitor element.

14. A semiconductor device comprising:
a first conductive layer over an insulating surface;
a first insulating layer over the first conductive layer;
a semiconductor layer over the first insulating layer;
a second conductive layer partly overlapping with the first conductive layer and the semiconductor layer;
a third conductive layer partly overlapping with the semiconductor layer;
a fourth conductive layer including a first area and a second area, the first area overlapping with the first conductive layer and the semiconductor layer and the second area overlapping with the semiconductor layer;
a second insulating layer over the second conductive layer, the third conductive layer, and the fourth conductive layer;
a fifth conductive layer over the second insulating layer, the fifth conductive layer overlapping with the first conductive layer, the semiconductor layer, the second conductive layer, and the fourth conductive layer; and
an element including a bottom electrode and a top electrode, the bottom electrode formed of the same as the fifth conductive layer.

15. The semiconductor device according to claim 14, wherein the semiconductor device further comprises a sixth conductive layer over the second insulating layer, the sixth conductive layer being in a floating state.

16. The semiconductor device according to claim 14, wherein the second conductive layer, the third conductive layer, and the fourth conductive layer are formed of the same material.

17. The semiconductor device according to claim 14, wherein the fifth conductive layer is electrically connected to the first conductive layer.

18. The semiconductor device according to claim 14, the semiconductor layer includes a first portion not overlapping with the second conductive layer, the third conductive layer, or the fourth conductive layer, the first portion having smaller thickness than a second portion overlapping with the second conductive layer, the third conductive layer, or the fourth conductive layer.

19. The semiconductor device according to claim 14, wherein the element is a liquid crystal element, a light-emitting element, an electrophoretic element, a memory element, or a capacitor element.

20. A semiconductor device comprising:
a first conductive layer over an insulating surface;
a first insulating layer over the first conductive layer;
a semiconductor layer over the first insulating layer, the semiconductor layer including a first area overlapping with the first conductive layer and a second area not overlapping with the first conductive layer;
a second conductive layer partly overlapping with the first area;
a third conductive layer partly overlapping with the second area;
a second insulating layer over the second conductive layer and the third conductive layer;
a fourth conductive layer over the second insulating layer; and
an element including a bottom electrode and a top electrode, the bottom electrode formed of the same as the fourth conductive layer.

21. The semiconductor device according to claim 20, wherein the semiconductor device further comprises a fifth conductive layer over the second insulating layer, the fifth conductive layer being in a floating state.

22. The semiconductor device according to claim 20, wherein the second conductive layer and the third conductive layer are formed of the same material.

23. The semiconductor device according to claim 20, wherein the fourth conductive layer is electrically connected to the first conductive layer.

24. The semiconductor device according to claim 20, wherein the element is a liquid crystal element, a light-emitting element, an electrophoretic element, a memory element, or a capacitor element.

* * * * *